US006716476B2

(12) United States Patent
Ouellet et al.

(10) Patent No.: US 6,716,476 B2
(45) Date of Patent: Apr. 6, 2004

(54) METHOD OF DEPOSITING AN OPTICAL QUALITY SILICA FILM BY PECVD

(75) Inventors: Luc Ouellet, Granby (CA); Jonathan Lachance, Granby (CA)

(73) Assignee: Dalsa Semiconductor Inc., Waterloo (CA)

( * ) Notice: Subject to any disclaimer, the term of this patent is extended or adjusted under 35 U.S.C. 154(b) by 159 days.

(21) Appl. No.: 09/956,916

(22) Filed: Sep. 21, 2001

(65) Prior Publication Data

US 2003/0059556 A1 Mar. 27, 2003

(51) Int. Cl.⁷ ............................................. C23C 16/40

(52) U.S. Cl. .................... 427/8; 427/579; 427/163.2; 427/167; 427/255.38; 427/376.2; 427/397.7

(58) Field of Search ...................... 427/579, 163.2, 427/167, 255.38, 376.2, 397.7

(56) References Cited

U.S. PATENT DOCUMENTS 5,885,881 A * 3/1999 Ojha .......................... 438/381

FOREIGN PATENT DOCUMENTS

JP 62279303 A * 12/1987 ............ G02B/6/12

OTHER PUBLICATIONS

"New Integrated optical multiplexer–demultiplexer realized on silicon substrate", S. Valette et al., pp. 145–147.
"Low–loss PECVD silica channel waveguides for optical communications", Ekectronics Letters, Dec. 1990, vol. 26, No. 25, pp. 2135–2137.
"Plasma–enhanced chemical vapor deposition of low–loss SiON optical waveguides at 1.5–um wavelength", Franco Bruno et al., Applied Optics, vol. 30, No. 31, Nov. 1991, pp. 4560–4564.
Rapid deposition of high–quality silicon–oxinitride waveguides, K. Kapser et al.,IEEE Transactions Photonics Technology Letters, vol. 3, No. 12, Dec. 1991, pp. 1096–1098.
"Simple technologies for fabrication of low–loss silica waveguides", Q. Lai et al.
"Formation of optical slab waveguides using thermal oxidation of SiOx", Q. Lai et al., Electronics Letters, Apr. 1993, Vol 29, No. 8, pp. 714–716.
"Hybrid optoelectronic digitally tunable receiver", Karen Liu et al., SPIE, Vol 2402, pp. 104–114.
"Single–Mode SiON/SiO2/Si optical waveguides prepared by plasma–enhanced chemical vapor deposition", Yuan–Kuang Tu et al., Fiber and Integrated Optics, vol. 14, pp. 113–139.
"Low temperature, nitrogen doped waveguides on silicon with small core dimensions fabricated by PECVD/RIE", M. Hoffmann et al., pp. 299–301.

"Pure and fluorine–doped silica films deposited in a hollow cathode reactor for integrated optic applications", M.V. Bazylenko et al., J. Vac. Sci. Technol. A 14(2), Mar./Apr. 1996, pp. 336–345.
"Optical properties of thin–film silicon–compatible materials", Daniel P. Poenar et al., Applied Optics, vol. 36, No. 21, Jul. 1997, pp. 5122–5128.
"Low–loss fiber–matched low–temperature PECVD waveguides with small–core dimensions for optical communications systems", Martin Hoffmann et al., IEEE Photonics Technology Letters, vol. 9, No. 9, 1997, pp. 1238–1240.
"High–quality low temperature DPECVD silicon dioxide", I. Pereyra et al., Journal of Non–Crystalline Solids, 1997, pp. 225–231.
A luminescence study of silicon–rich silica and rare–earth doped silicon–rich silica, A.J. Kenyon et al., Electrochemical Society Proceedings, vol. 97–11, pp. 304–318.
"Thick SiOxNy and SiO2 films obtained by PECVD technique at low temperatures", M.I. Alayo et al., Thin Solid Films 332, 1998, pp. 40–45.
"Depositions of thick TEOS PECVD silicon oxide layers for integrated optical waveguide applications", D.A.P. Bulla et al., Thin Solid Films 334, 1998, pp. 60–64.
"State of the art of integrated optics technology at LETI for achieving passive optical components", S. Valete, Journal of Modern Optics, 1998, vol. 35, No. 6, pp. 993–1005.
"Simple method of fabricating polarisation–insensitive and very low crosstalk AWG grating devices", S.M. Ojha et al., Electronics Letters, Jan. 1998, vol. 34, No. 1, pp. 78–79.
"Thermal annealing of waveguides formed by ion implantation of silica–on–Si", C.M. Johnson et al., Nuclear Instruments and Methods in Physics Research B, 141, 1998, pp. 670–674.
Silicon oxynitride planar waveguiding structures for application in optical communication, Rene M. de Ridder et al., IEEE Journal of Selected Topics in Quantum Electronics, vol. 4, No. 6, 1988, pp. 930–936.
"Silicon–oxynitride layers for optical waveguide applications", R. Germann et al., Abstract No. 137.
"Plasma enhanced chemical vapor deposition silicon oxynitride optimized for application in integrated optics", K. Worhoff et al., Sensors and Actuators, 74, 1999, pp. 9–12.

(List continued on next page.)

Primary Examiner—Timothy Meeks
(74) Attorney, Agent, or Firm—Marks & Clerk

(57) ABSTRACT

A method is disclosed for depositing an optical quality silica film on a wafer by PECVD. The flows rates for a raw material gas, an oxidation gas, a carrier gas, and a dopant gas are first set at predetermined levels. The total deposition pressure is set at a predetermined level. The deposited film is then subjected to a post deposition heat treatment at a temperature selected to optimize the mechanical properties without affecting the optical properties. Finally, the observed FTIR characteristics of the deposited film are monitored to produce a film having the desired optical and mechanical properties. This technique permits the production of high quality optical films with reduced stress.

20 Claims, 37 Drawing Sheets

OTHER PUBLICATIONS

"Wavelength tunable optical add–after–drop filter with flat passband for WDM networks", B.J. Offrein et al., IEEE Photonics Technology Letters, vol. 11, No. 2, 1999, pp. 239–241.

"High refractive index difference and low loss optical waveguide fabricated by low temperature processes", K. Imoto et al., Electronics Letters, 1993, vol. 29, No. 12, pp. 1123–1124.

* cited by examiner

| Publication | PECVD Reaction | 'DELTA-n' Control Method | Post-dep. Thermal Treatment T° (°C) |
|---|---|---|---|
| Valette S., 1987 | Unknown | P doping | Not specified |
| Valette S., 1988 | Unknown | P doping | 400°C |
| Grand G., 1990 | Unknown | P doping | 1000°C |
| Lui K., 1995 | Unknown | Content in Si, P | Not specified |
| Ojha S., 1998 | Unknown | Ge, B, or P doping | Not specified |
| Canning J., 1998 | Unknown | Ge doping | Not specified |
| Bulla D., 1998 | TEOS | TEOS | Not specified |
| Johnson C., 1998 | $SiH_4 + O_2$ | Si ion Implantation | 400°C |
| Boswell R. W., 1997 | $SiH_4 + O_2$ | $SiH_4/O_2$ flow ratio | 1000°C |
| Bazylenko M. V., 1995 | $SiH_4 + O_2 + CF_4$ | $(SiH_4+O_2)/CF_4$ flow ratio | Not specified |
| Bazylenko M. V., 1996 | $SiH_4 + O_2 + CF_4$ | $(SiH_4+O_2)/CF_4$ flow ratio | 1000°C |
| Durandet A., 1996 | $SiH_4 + O_2 + CF_4$ | $(SiH_4+O_2)/CF_4$ flow ratio | 100°C |
| Kasper K., 1991 | $SiH_4 + N_2O$ | $SiH_4/N_2O$ flow ratio | 1060°C |
| Lai Q., 1992 | $SiH_4 + N_2O$ | $SiH_4/N_2O$ flow ratio | 1100°C |
| Lai Q., 1993 | $SiH_4 + N_2O$ | $SiH_4/N_2O$ flow ratio | 1100°C |
| Pereyra I., 1997 | $SiH_4 + N_2O$ | $SiH_4/N_2O$ flow ratio | 400°C |
| Alayo M., 1998 | $SiH_4 + N_2O$ | $SiH_4/N_2O$ flow ratio | 1000°C |
| Kenyon T., 1997 | $SiH_4 + N_2O + Ar$ | $SiH_4/N_2O/Ar$ flow ratio | 1000°C |
| Lam D. K. W., 1984 | $SiH_4 + N_2O + NH_3$ | $SiH_4/N_2O/NH_3$ flow ratio | Not specified |
| Bruno F., 1991 | $SiH_4 + N_2O + NH_3$ | $SiH_4/N_2O/NH_3$ flow ratio | 1100°C |
| Yokohama S., 1995 | $SiH_4 + N_2O + NH_3$ | $SiH_4/N_2O/NH_3$ flow ratio | Not specified |
| Agnihotri O. P., 1997 | $SiH_4 + N_2O + NH_3$ | $SiH_4/N_2O/NH_3$ flow ratio | 700-900°C |
| Germann R., 1999 | $SiH_4 + N_2O + NH_3$ | Unknown | 1100°C |
| Offrein B., 1999 | $SiH_4 + N_2O + NH_3$ | Unknown | 1150°C |
| Hoffmann M., 1995 | $SiH_4 + N_2O + NH_3 + Ar$ | $SiH_4/N_2O/NH_3/Ar$ flow ratio | Not specified |
| Hoffmann M., 1997 | $SiH_4 + N_2O + NH_3 + Ar$ | $SiH_4/N_2O/NH_3/Ar$ flow ratio | Not specified |
| Tu Y., 1995 | $SiH_4 + N_2O + NH_3 + N_2$ | $N_2O/(N_2O + NH_3)$ flow ratio | 1050°C |
| Poenar D., 1997 | $SiH_4 + N_2O + NH_3 + N_2$ | $SiH_4/N_2O/NH_3/N_2$ flow ratio | 850°C |
| Ridder R., 1998 | $SiH_4 + N_2O + NH_3 + N_2$ | $SiH_4/N_2O/NH_3/Ar$ flow ratio | 1100°C |
| Worhoff K., 1999 | $SiH_4 + N_2O + NH_3 + N_2$ | $SiH_4/N_2O/NH_3/N_2$ flow ratio | 1150°C |
| Bulat E. S., 1993 | $SiH_4 + N_2O + N_2 + O_2 + He + CF_4$ | $SiH_4/(N_2O/N_2)/O_2/CF_4$ flow ratio | 425°C |
| This Patent Application | $SiH_4 + N_2O + PH_3 + N_2$ | Patented Pending Method | 650°C |

FIG. 1

| | H-OH | SiO-H | SiN-H | Si:N-H | Si-H | Si=O | N=N | Si-O-Si | Si-O-Si | Si-ON | Si-OH | Si-O-Si | Si-O-Si |
|---|---|---|---|---|---|---|---|---|---|---|---|---|---|
| Min | 3550 | 3470 | 3380 | 3300 | 2210 | 1800 | 1530 | 1080 | 1000 | 910 | 860 | 740 | 410 |
| Ave | 3650 | 3510 | 3420 | 3380 | 2260 | 1875 | 1555 | 1180 | 1080 | 950 | 885 | 810 | 460 |
| Max | 3750 | 3550 | 3460 | 3460 | 2310 | 1950 | 1580 | 1280 | 1160 | 990 | 910 | 880 | 510 |
| Min | 2.817 | 2.882 | 2.959 | 3.030 | 4.525 | 5.556 | 6.536 | 9.259 | 10.000 | 10.989 | 11.628 | 13.514 | 24.390 |
| Ave | 2.740 | 2.849 | 2.924 | 2.959 | 4.425 | 5.333 | 6.431 | 8.475 | 9.256 | 10.526 | 11.299 | 12.346 | 21.739 |
| Max | 2.667 | 2.817 | 2.890 | 2.890 | 4.329 | 5.128 | 6.329 | 7.813 | 8.621 | 10.101 | 10.989 | 11.364 | 19.608 |
| Min | 1.408 | 1.441 | 1.479 | 1.515 | 2.262 | 2.778 | 3.268 | 4.630 | 5.000 | 5.495 | 5.814 | 6.757 | 12.195 |
| Ave | 1.370 | 1.425 | 1.462 | 1.479 | 2.212 | 2.667 | 3.215 | 4.237 | 4.630 | 5.263 | 5.650 | 6.173 | 10.870 |
| Max | 1.333 | 1.408 | 1.445 | 1.445 | 2.165 | 2.564 | 3.165 | 3.906 | 4.310 | 5.051 | 5.495 | 5.682 | 9.804 |
| Min | 0.939 | 0.961 | 0.986 | 1.010 | 1.508 | 1.852 | 2.179 | 3.086 | 3.333 | 3.663 | 3.876 | 4.505 | 8.130 |
| Ave | 0.913 | 0.950 | 0.975 | 0.986 | 1.475 | 1.778 | 2.144 | 2.825 | 3.086 | 3.509 | 3.766 | 4.115 | 7.246 |
| Max | 0.889 | 0.939 | 0.963 | 0.963 | 1.443 | 1.709 | 2.110 | 2.604 | 2.874 | 3.367 | 3.663 | 3.788 | 6.536 |
| Min | 0.704 | 0.720 | 0.740 | 0.758 | 1.131 | 1.389 | 1.634 | 2.315 | 2.500 | 2.747 | 2.907 | 3.378 | 6.098 |
| Ave | 0.685 | 0.712 | 0.731 | 0.740 | 1.106 | 1.333 | 1.608 | 2.119 | 2.315 | 2.632 | 2.825 | 3.086 | 5.435 |
| Max | 0.667 | 0.704 | 0.723 | 0.723 | 1.082 | 1.282 | 1.582 | 1.953 | 2.155 | 2.525 | 2.747 | 2.841 | 4.902 |
| Min | 0.563 | 0.576 | 0.592 | 0.606 | 0.905 | 1.111 | 1.307 | 1.852 | 2.000 | 2.198 | 2.326 | 2.703 | 4.878 |
| Ave | 0.548 | 0.570 | 0.585 | 0.592 | 0.885 | 1.067 | 1.286 | 1.695 | 1.852 | 2.105 | 2.260 | 2.469 | 4.348 |
| Max | 0533 | 0.563 | 0.578 | 0.578 | 0.866 | 1.026 | 1.266 | 1.563 | 1.724 | 2.020 | 2.198 | 2.273 | 3.922 |
| Min | 0.469 | 0.480 | 0.493 | 0.505 | 0.754 | 0.926 | 1.089 | 1.543 | 1.667 | 1.832 | 1.938 | 2.252 | 4.065 |
| Ave | 0.457 | 0.475 | 0.487 | 0.493 | 0.737 | 0.889 | 1.072 | 1.412 | 1.543 | 1.754 | 1.883 | 2.058 | 3.623 |
| Max | 0.444 | 0.469 | 0.482 | 0.482 | 0.722 | 0.855 | 1.055 | 1.302 | 1.437 | 1.684 | 1.832 | 1.894 | 3.268 |
| Min | 0.402 | 0.412 | 0.423 | 0.433 | 0.646 | 0.794 | 0.934 | 1.323 | 1.429 | 1.570 | 1.661 | 1.931 | 3.484 |
| Ave | 0.391 | 0.407 | 0.418 | 0.423 | 0.632 | 0.762 | 0.919 | 1.211 | 1.323 | 1.504 | 1.614 | 1.764 | 3.106 |
| Max | 0.381 | 0.402 | 0.413 | 0.413 | 0.618 | 0.733 | 0.904 | 1.116 | 1.232 | 1.443 | 1.570 | 1.623 | 2.801 |
| Min | 0.352 | 0.360 | 0.370 | 0.379 | 0.566 | 0.694 | 0.817 | 1.157 | 1.250 | 1.374 | 1.453 | 1.689 | 3.049 |
| Ave | 0.342 | 0.356 | 0.365 | 0.370 | 0.553 | 0.667 | 0.804 | 1.059 | 1.157 | 1.316 | 1.412 | 1.543 | 2.717 |
| Max | 0.333 | 0.352 | 0.361 | 0.361 | 0.541 | 0.641 | 0.791 | 0.977 | 1.078 | 1.263 | 1.374 | 1.420 | 2.451 |

FIG. 2

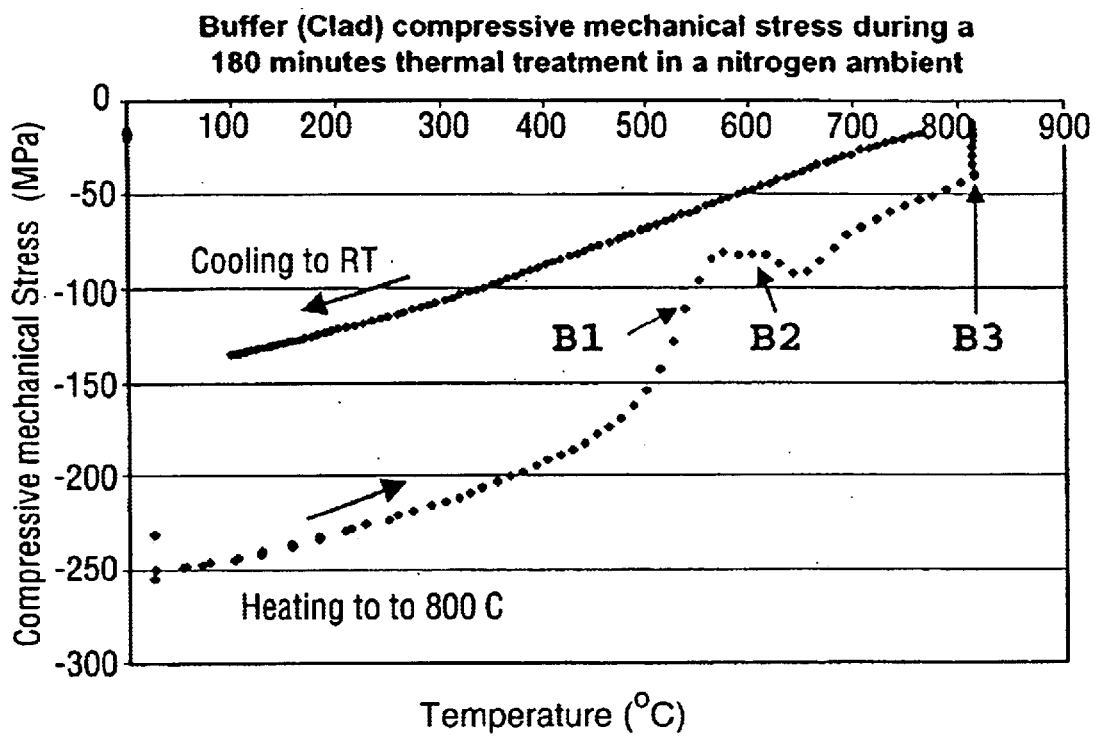
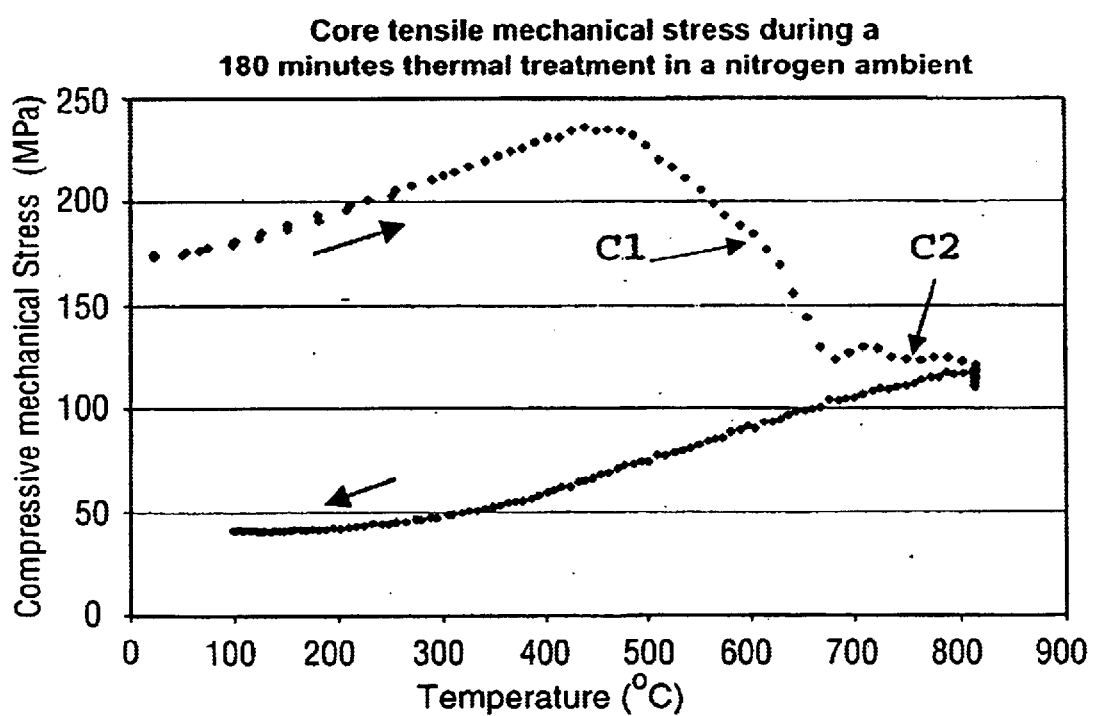
FIG. 10

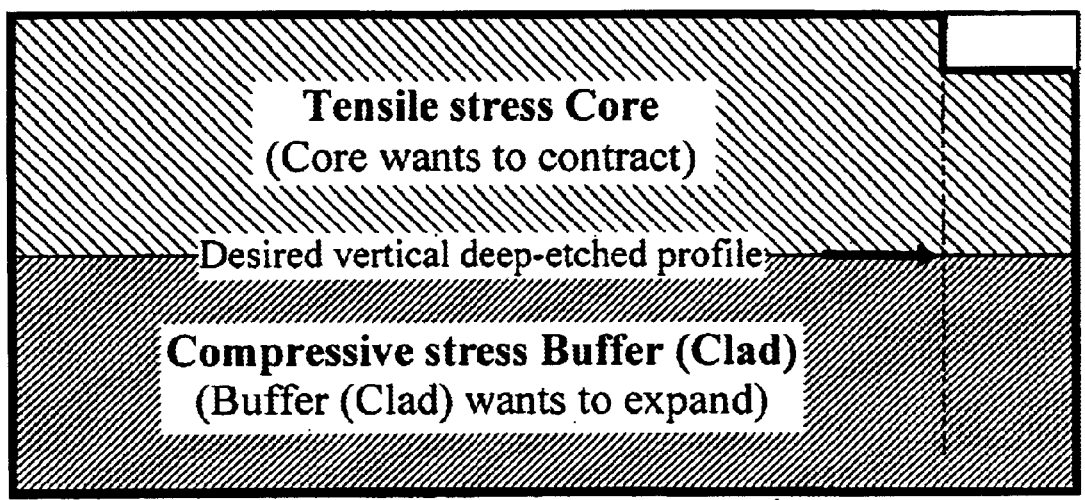
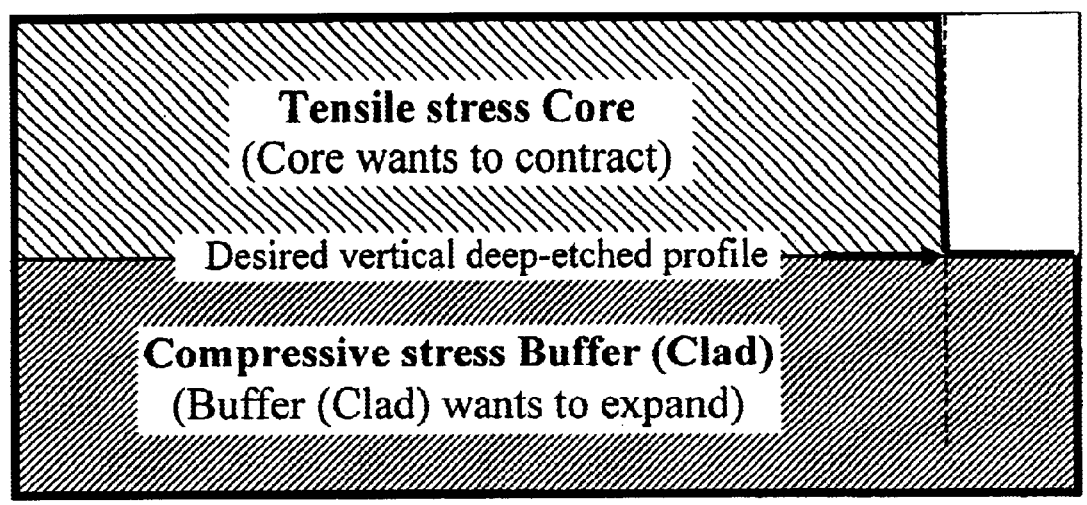
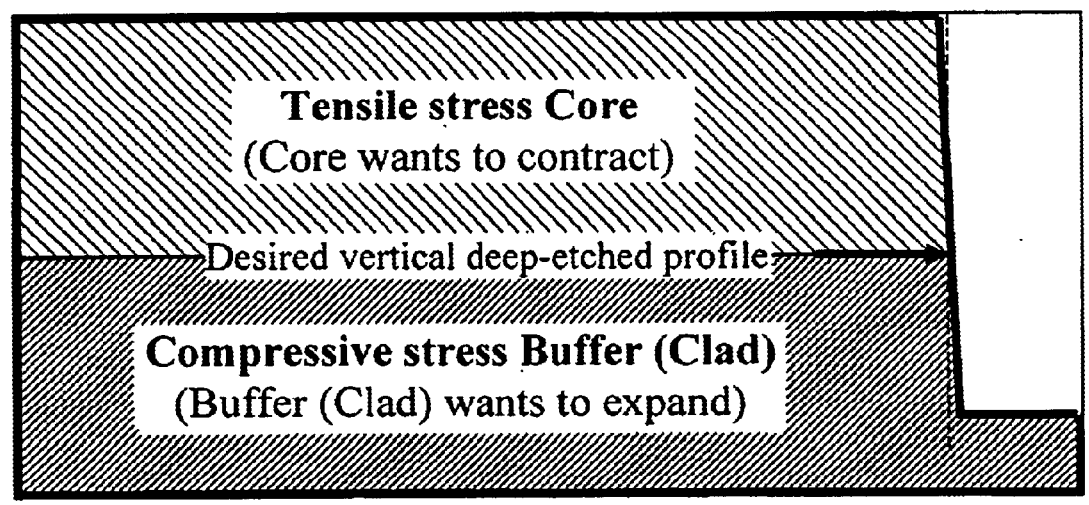
FIG. 12

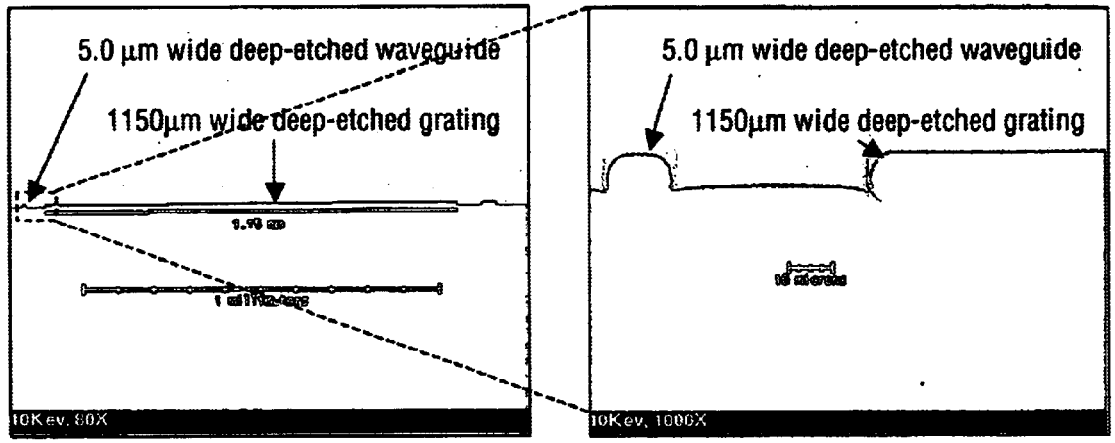
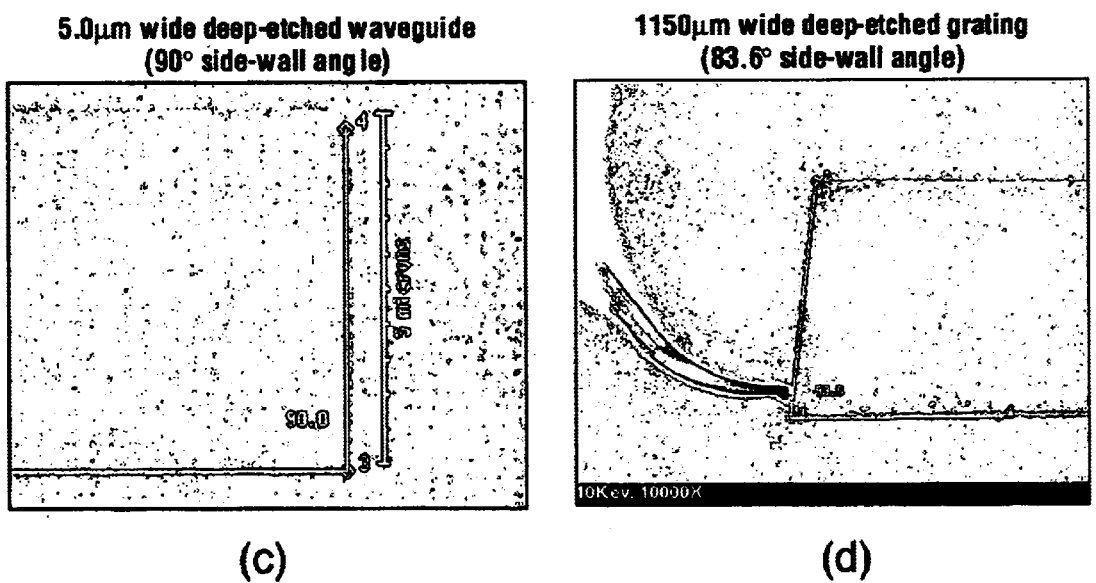
FIG. 13

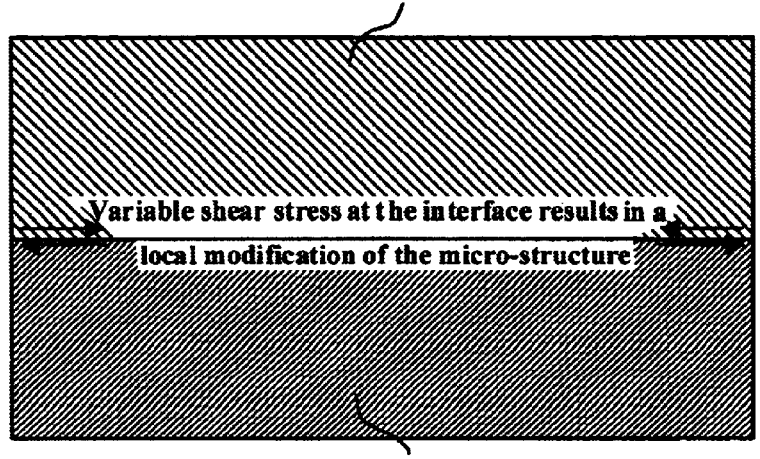
Tensile stress Core
(Core wants to contract)
Variable shear stress at the interface results in a local modification of the micro-structure
Compressive stress Buffer (Clad) layer
(Buffer (Clad) layer wants to expand)
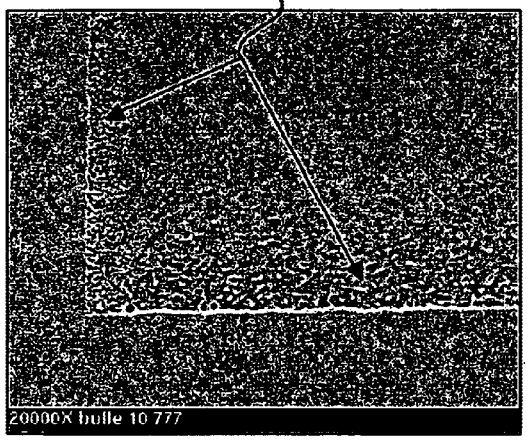
Modified micro-structure near the interfaces
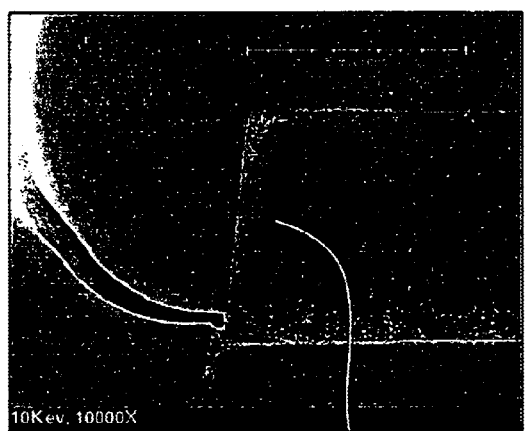
Modfied micro-structure near the interface
FIG. 14

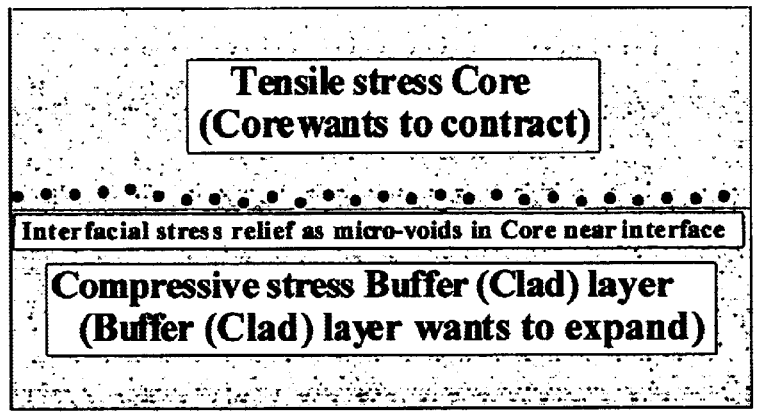
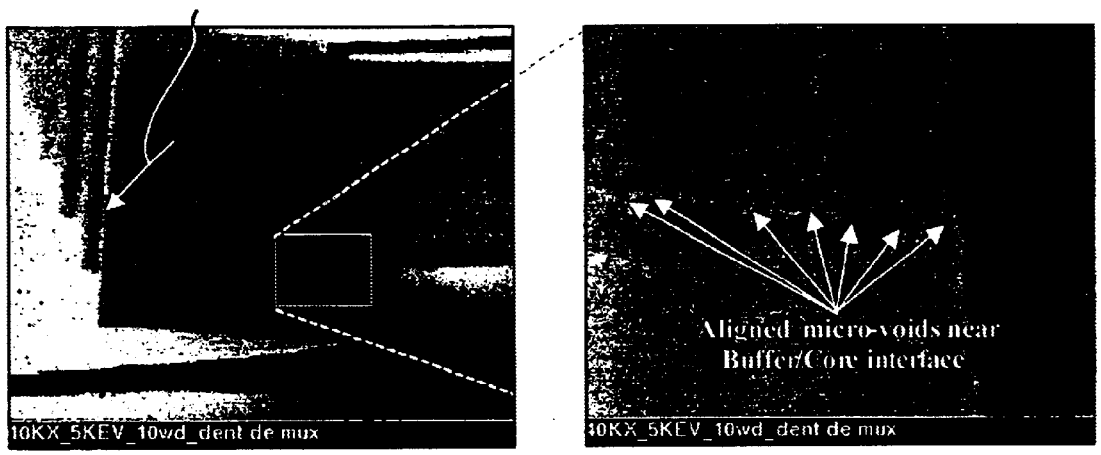
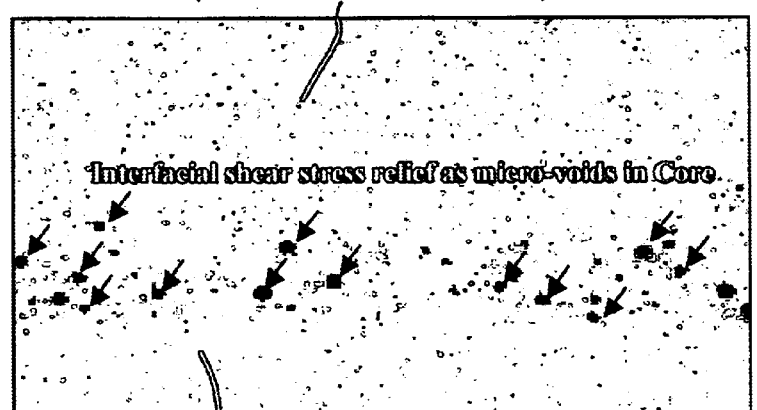
FIG. 15

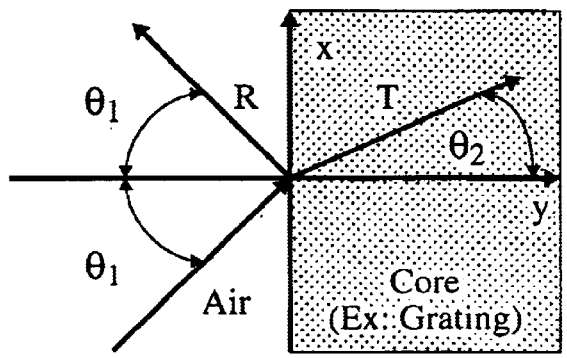
Electric Field ⊥ Plane of Incidence
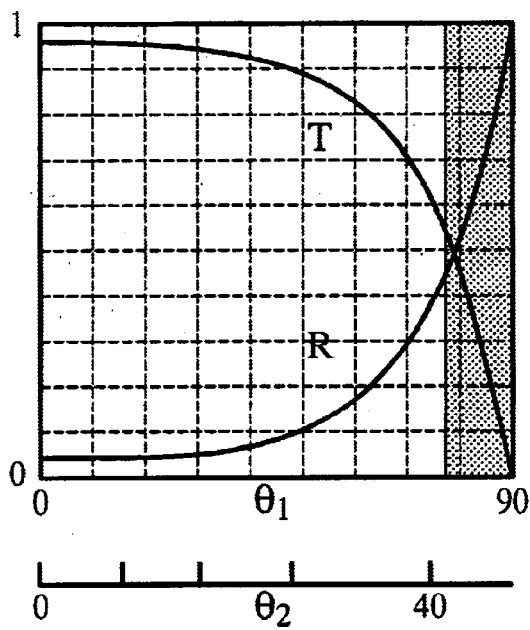
Electric Field // Plane of Incidence
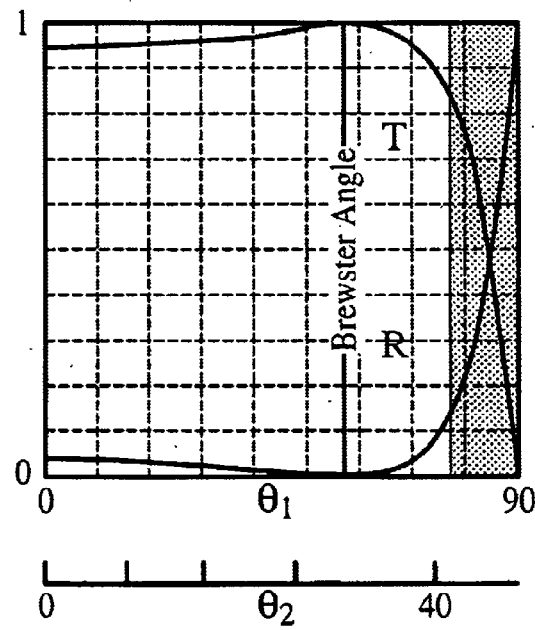
FIG. 17

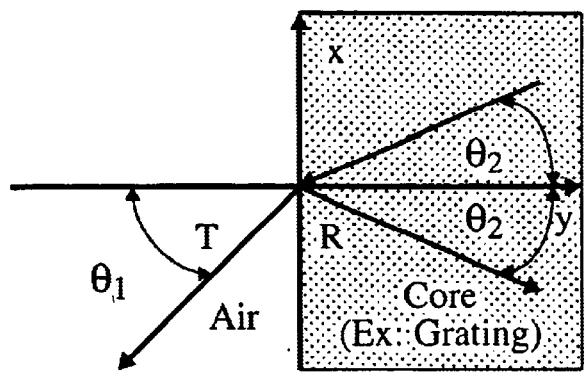
Electric Field ⊥ Plane of Incidence
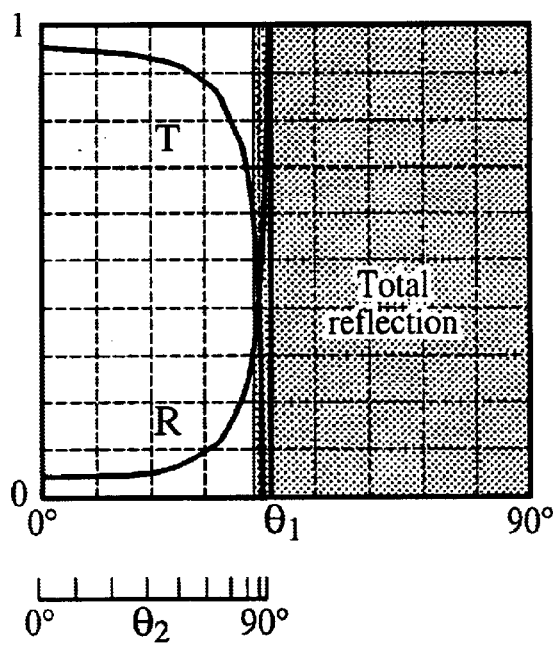
Electric Field // Plane of Incidence
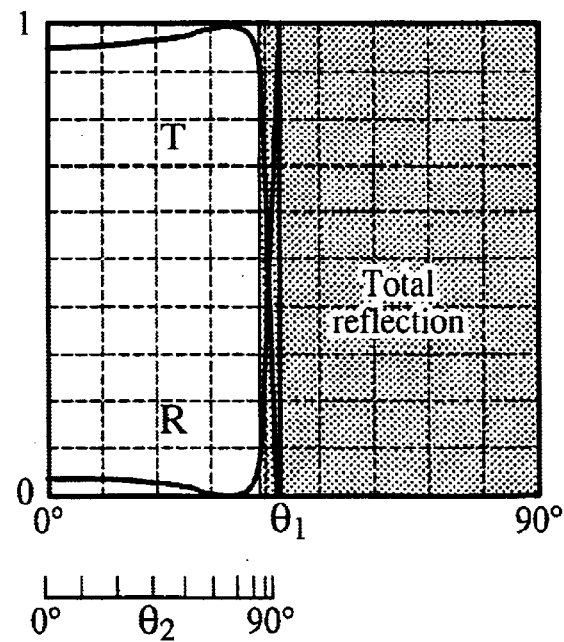
FIG. 18

METHOD OF DEPOSITING AN OPTICAL QUALITY SILICA FILM BY PECVD

BACKGROUND OF THE INVENTION

1. Field of the Invention

This invention relates to the manufacture of high quality optical films, and in particular to a method of depositing an optical quality silica film by PECVD. The invention can be applied to the manufacture of photonic devices, for example, Mux/Demux devices for use fiber optic communications.

2. Description of Related Art

The manufacture of integrated optical devices, such as optical Multiplexers (Mux) and Demultiplexers (Dmux) requires the fabrication of optical quality elements, such as waveguides and gratings highly transparent in the 1.30 $\mu$m and 1.55 $\mu$m optical bands. These silica-based optical elements are basically composed of three layers: buffer, core and cladding. For reasons of simplicity, the buffer and cladding layers are typically of the same composition and refractive index. In order to confine the 1.55 $\mu$m (and/or 1.30 $\mu$m) wavelength laser beam, the core must have a higher refractive index than the buffer and cladding layers. The required refractive index difference is referred to as the 'delta-n' and is one of the most important characteristics of these silica-based optical elements.

It is very difficult to fabricate transparent silica-based optical elements in the 1.55 $\mu$m wavelength (and/or 1.30 wavelength) optical region while maintaining a suitable difference delta-n and preventing stress-induced mechanical and problems. Our co-pending U.S. patent application Ser. No. 09/799,491 filed on Mar. 7, 2000 entitled 'Method of Making a Functional Device with Deposited Layers subject to High Temperature Anneal" describes an improved Plasma Enhanced Chemical Vapour Deposition technique for these silica-based elements which allows the attainment of the required 'delta-n' while eliminating the undesirable residual Si:N—H oscillators (observed as a FTIR peak centered at 3380 cm$^{-1}$ whose $2^{nd}$ harmonics could cause an optical absorption between 1.445 and 1.515 $\mu$m), SiN—H oscillators (centered at 3420 cm$^{-1}$ whose $2^{nd}$ harmonics could cause an optical absorption between 1.445 and 1.479 $\mu$m) and SiO—H oscillators (centered at 3510 cm$^{-1}$ and whose $2^{nd}$ harmonics could cause an optical absorption between 1.408 and 1.441 $\mu$m) after a high temperature thermal treatment in a nitrogen ambient, typically at 800° C.

With such a high temperature thermal treatment are associated some residual stress-induced mechanical problems of deep-etched optical elements (mechanical movement of the side-walls) and some residual stress-induced mechanical problems at the buffer/core interface or at the core/cladding interface (micro-structural defects, micro-voiding and separation).

Recently published literature reveals various PECVD approaches to obtain these high performance optically transparent silica-based optical elements: Valette S., New integrated optical multiplexer-demultiplexer realized on silicon substrate, ECIO '87, 145, 1987; Grand G., Low-loss PECVD silica channel waveguides for optical communications, Electron. Lett., 26 (25), 2135, 1990; Bruno F., Plasma-enhanced chemical vapor deposition of low-loss SiON optical waveguides at 1.5-$\mu$m wavelength, Applied Optics, 30 (31), 4560, 1991; Kapser K., Rapid deposition of high-quality silicon-oxinitride waveguides, IEEE Trans. Photonics Tech. Lett., 5 (12), 1991; Lai Q., Simple technologies for fabrication of low-loss silica waveguides, Elec. Lett., 28 (11), 1000, 1992; Lai Q., Formation of optical slab waveguides using thermal oxidation of SiOx, Elec. Lett., 29 (8), 714, 1993; Liu K., Hybrid optoelectronic digitally tunable receiver, SPIE, Vol 2402, 104, 1995; Tu Y., Single-mode SiON/SiO2/Si optical waveguides prepared by plasma-enhanced Chemical vapor deposition, Fiber and integrated optics, 14, 133, 1995; Hoffmann M., Low temperature, nitrogen doped waveguides on silicon with small core dimensions fabricated by PECVD/RIE, ECIO'95, 299, 1995; Bazylenko M., Pure and fluorine-doped silica films deposited in a hollow cathode reactor for integrated optic applications, J. Vac. Sci. Technol. A 14 (2), 336, 1996; Poenar D., Optical properties of thin film silicon-compatible materials, Appl. Opt. 36 (21), 5112, 1997; Hoffmann M., Low-loss fiber-matched low-temperature PECVD waveguides with small-core dimensions for optical communication systems, IEEE Photonics Tech. Lett., 9 (9), 1238, 1997; Pereyra I., High quality low temperature DPECVD silicon dioxide, J. Non-Crystalline Solids, 212, 225, 1997; Kenyon T., A luminescence study of silicon-rich silica and rare-earth doped silicon-rich silica, Fourth Int. Symp. Quantum Confinement Electrochemical Society, 97-11, 304, 1997; Alayo M., Thick SiOxNy and SiO2 films obtained by PECVD technique at low temperatures, Thin Solid Films, 332, 40, 1998; Bulla D., Deposition of thick TEOS PECVD silicon oxide layers for integrated optical waveguide applications, Thin Solid Films, 334, 60, 1998; Valette S., State of the art of integrated optics technology at LETI for achieving passive optical components, J. of Modern Optics, 35 (6), 993, 1988; Ojha S., Simple method of fabricating polarization-insensitive and very low crosstalk AWG grating devices, Electron. Lett., 34 (1), 78, 1998; Johnson C., Thermal annealing of waveguides formed by ion implantation of silica-on-Si, Nuclear Instruments and Methods in Physics Research, B141, 670, 1998; Ridder R., Silicon oxynitride planar waveguiding structures for application in optical communication, IEEE J. of Sel. Top. In Quantum Electron., 4 (6), 930, 1998; Germann R., Silicon-oxynitride layers for optical waveguide applications, 195$^{th}$ meeting of the Electrochemical Society, 99-1, May 1999, Abstract 137, 1999; Worhoff K., Plasma enhanced cyhemical vapor deposition silicon oxynitride optimized for application in integrated optics, Sensors and Actuators, 74, 9, 1999; and Offrein B., Wavelength tunable optical add-after-drop filter with flat passband for WDM networks, IEEE Photonics Tech. Lett., 11 (2), 239, 1999.

A comparison of these various PECVD techniques is summarised in FIG. 1 which shows the approaches and methods used to modify the 'delta-n' between buffer (clad) and core with post-deposition thermal treatment.

The various techniques can be grouped into main categories: PECVD using unknown chemicals, unknown chemical reactions and unknown boron (B) and/or phosphorus (P) chemicals and unknown chemical reactions to adjust the 'delta-n' (When specified, the post-deposition thermal treatments range from 400 to 1000° C.); PECVD using TEOS and unknown means of adjusting the 'delta-n' (The post-deposition thermal treatments are not specified); PECVD using oxidation of $SiH_4$ with $O_2$ coupled with silicon ion implantation or adjustment of silicon oxide stoichiometry as means of adjusting the 'delta-n' (The post-deposition thermal treatments range from 400 to 1000° C.); PECVD using oxidation of $SiH_4$ with $O_2$ coupled with the incorporation of $CF_4$ ($SiH_4/O_2/CF_4$ flow ratio) as means of adjusting the 'delta-n' (When specified, the post-deposition thermal treatments range from 100 to 1000° C.); PECVD using oxidation of $SiH_4$ with $N_2O$ coupled with variations of $N_2O$ concentration ($SiH_4/N_2O$ flow ratio) as means of adjusting the silicon oxide stoechiometry and the 'delta-n' (The post-deposition thermal treatments range from 400 to 1100° C.); PECVD using oxidation of $SiH_4$ with $N_2O$ coupled with variations of $N_2O$ concentration and with the incorporation of Ar ($SiH_4/N_2O/Ar$ flow ratio) as means of adjusting the silicon oxide stoechiometry and the 'delta-n' (The post-deposition thermal treatments is 1000° C.); PECVD using oxidation of $SiH_4$ with $N_2O$ coupled with the incorporation of $NH_3$ ($SiH_4/N_2O/NH_3$ flow ratio) to form silicon oxynitrides with various 'delta-n' (When specified, the post-deposition thermal treatments range from 700 to 1100° C.); PECVD using oxidation of $SiH_4$ with $N_2O$ coupled with the incorporation of $NH_3$ and Ar ($SiH_4/N_2O/NH_3/Ar$ flow ratio) as to form silicon oxynitrides with various 'delta-n' (The post-deposition thermal treatments are not specified); PECVD using oxidation of $SiH_4$ with $N_2O$ coupled with the incorporation of $NH_3$ and $N_2$ chemicals variation ($SiH_4/N_2O/NH_3/N_2$ flow ratio) as to form silicon oxynitrides with various 'delta-n' (The post-deposition thermal treatments range from 850 to 1150° C.); PECVD using oxidation of $SiH_4$ with $N_2O$ and $O_2$ coupled with the incorporation of $CF_4$, $N_2$ and He ($SiH_4/(N_2O/N_2)/O_2/CF_4$ flow ratio) as to form complex mixtures of carbon and fluorine containing silicon oxide as means of adjusting the 'delta-n' (The post-deposition thermal treatments is 425° C.).

Our co-pending U.S. patent application Ser. No. 09/833,711 entitled 'Optical Quality Silica Films' describes an improved Plasma Enhanced Chemical Vapour Deposition technique for silica films which shows that the independent control of the $SiH_4$, $N_2O$ and $N_2$ gases as well as of the total deposition pressure via an automatic control of the pumping speed of the vacuum pump in a five-dimensional space consisting of a first independent variable, the $SiH_4$ flow; a second independent variable, the $N_2O$ flow; a third independent variable, the $N_2$ flow; a fourth independent variable; the total deposition pressure (controlled by an automatic adjustment of the pumping speed); and the observed film characteristics; permits the elimination of the undesirable residual Si:N—H oscillators (observed as a FTIR peak centered at 3380 $cm^{-1}$ whose $2^{nd}$ harmonics could cause an optical absorption between 1.445 and 1.515 $\mu m$), SiN—H oscillators (centered at 3420 $cm^{-1}$ whose $2^{nd}$ harmonics could cause an optical absorption between 1.445 and 1.479 $\mu m$) and SiO—H oscillators (centered at 3510 $cm^{-1}$ and whose $2^{nd}$ harmonics could cause an optical absorption between 1.408 and 1.441 $\mu m$) after thermal treatment at a low post-deposition temperature of 800° C. to provide improved silica films with reduced optical absorption in the 1.55 $\mu m$ wavelength (and/or 1.30 $\mu m$ wavelength) optical region.

Another co-pending U.S. patent application Ser. No. 09/867,662 entitled 'Method of Depositing Optical Films" describes a new improved Plasma Enhanced Chemical Vapour Deposition technique of silica waveguides which shows that the independent control of the $SiH_4$, $N_2O$, $N_2$ and $PH_3$ gases as well as of the total deposition pressure via an automatic control of the pumping speed of the vacuum pump in a six-dimensional space, namely a first independent variable, the $SiH_4$ flow; a second independent variable, the $N_2O$ flow; a third independent variable, the $N_2$ flow; a fourth independent variable, the $PH_3$ flow; a fifth independent variable; the total deposition pressure (controlled by an automatic adjustment of the pumping speed); and the observed waveguides characteristics, is key to achieving the required 'delta-n' while still eliminating the undesirable residual Si:N—H oscillators (observed as a FTIR peak centered at 3380 $cm^{-1}$ whose $2^{nd}$ harmonics could cause an optical absorption between 1.445 and 1.515 $\mu m$), SiN—H oscillators (centered at 3420 $cm^{-1}$ whose $2^{nd}$ harmonics could cause an optical absorption between 1.445 and 1.479 $\mu m$) and SiO—H oscillators (centered at 3510 $cm^{-1}$ and whose $2^{nd}$ harmonics could cause an optical absorption between 1.408 and 1.441 $\mu m$) after thermal treatment at a low post-deposition temperature of 800° C. as to provide improved silica waveguides with reduced optical absorption in the 1.55 $\mu m$ wavelength (and/or 1.30 wavelength) optical region.

While these techniques are capable of producing optical quality films, they can result in stress-induced mechanical problems for deep-etched optical components.

SUMMARY OF THE INVENTION

According to the present invention there is provided a method of depositing an optical quality silica film by PECVD (Plasma Enhanced Chemical Vapor Deposition), comprising independently setting a predetermined flow rate for a raw material gas; independently setting a predetermined flow rate for an oxidation gas; independently setting a predetermined flow rate for a carrier gas; independently setting a predetermined total deposition pressure; and applying a post deposition heat treatment to the deposited film at a temperature selected to optimize the mechanical properties without affecting the optical properties of the deposited film.

In a preferred embodiment flow rate for a dopant gas is also independently set. The observed FTIR characteristics of the deposited film are monitored to determine the optimum post deposition heat treatment temperature.

This technique permits the required 'delta-n' to be achieved while eliminating the undesirable residual Si:N—H oscillators (observed as a FTIR peak centered at 3380 $cm^{-1}$ whose $2^{nd}$ harmonics could cause an optical absorption between 1.445 and 1.515 $\mu m$), SiN—H oscillators (centered at 3420 $cm^{-1}$ whose $2^{nd}$ harmonics could cause an optical absorption between 1.445 and 1.479 $\mu m$) and SiO—H oscillators (centered at 3510 $cm^{-1}$ and whose $2^{nd}$ harmonics could cause an optical absorption between 1.408 and 1.441 $\mu m$) after an optimised thermal treatment in a nitrogen. The technique can provide improved silica-based optical elements with reduced optical absorption in the 1.55 $\mu m$ wavelength (and/or 1.30 $\mu m$ wavelength) optical region without the residual stress-induced mechanical problems of deep-etched optical elements (mechanical movement of side-walls), without the residual stress-induced mechanical problems at the buffer/core or core/cladding interfaces (micro-structural defects, micro-voiding and separation) and without the residual stress-induced optical problems (polarisation dependant power loss).

BRIEF DESCRIPTION OF THE DRAWINGS

The invention will now be described in more detail, by way of example only, with reference to the accompanying drawings, in which:

FIG. 1 is a comparison table showing various PECVD approaches for controlling the refractive index and reducing the optical absorption of silica films;

FIG. 2 shows the FTIR fundamental infrared absorption peaks and their corresponding higher harmonics peaks associated with the residual compounds resulting from high temperature thermal treatments of PECVD silica-based optical components in a nitrogen ambient;

FIG. 10 shows the stress hysteresis of buffer (cladding) and core in a nitrogen ambient using a 180 minutes stabilization at 800° C.;

FIG. 12 shows the gradually sloped side-wall formation from the elastic strain of deep-etched buffer/core optical elements resulting from the (compressive stress buffer)/(tensile stress core) combination;

FIG. 13 shows side-wall angle measurements of neighboring 5.0 μm wide deep-etched waveguide and a 1150 μm wide deep-etched grating; FIGS. 13a and 13b show the relative position between an isolated 5.0 μm wide deep-etched waveguide and its neighboring 1150 μm wide deep-etched grating at two different magnifications; FIG. 13c shows the sidewall of the 5.0 μm wide deep-etched waveguide facing the neighboring grating has a slope of about 90°; FIG. 13d shows the side-wall of the 1150 μm wide deep-etched grating facing the neighboring deep-etched waveguide has a much smaller slope of about 84°;

FIG. 14 shows how the interfacial stress relief of the shear stress building at the buffer/core or core/cladding interfaces results in a noticeable modification of the micro-structure of these interfaces;

FIG. 15 shows how the interfacial stress relief of the shear stress building at the buffer/core or core/cladding interfaces results in an important modification of the micro-structure and in the formation of micro-voids in the core and near these interfaces;

FIG. 17 shows the effect of the incidence angle of infrared light at the air/core interface on the reflection and transmission of infrared optical power (case where the infrared light is incoming from the air side of the side-wall of core a waveguide, a grating or of an another optical element); and FIG. 18 shows the effect of the incidence angle of infrared light at the air/core interface on the reflection and transmission of infrared optical power (case where the infrared light is incoming from the core side of the side-wall of core a waveguide, a grating or of an another optical element).

DETAILED DESCRIPTION OF THE PREFERRED EMBODIMENTS

Figure 3A:
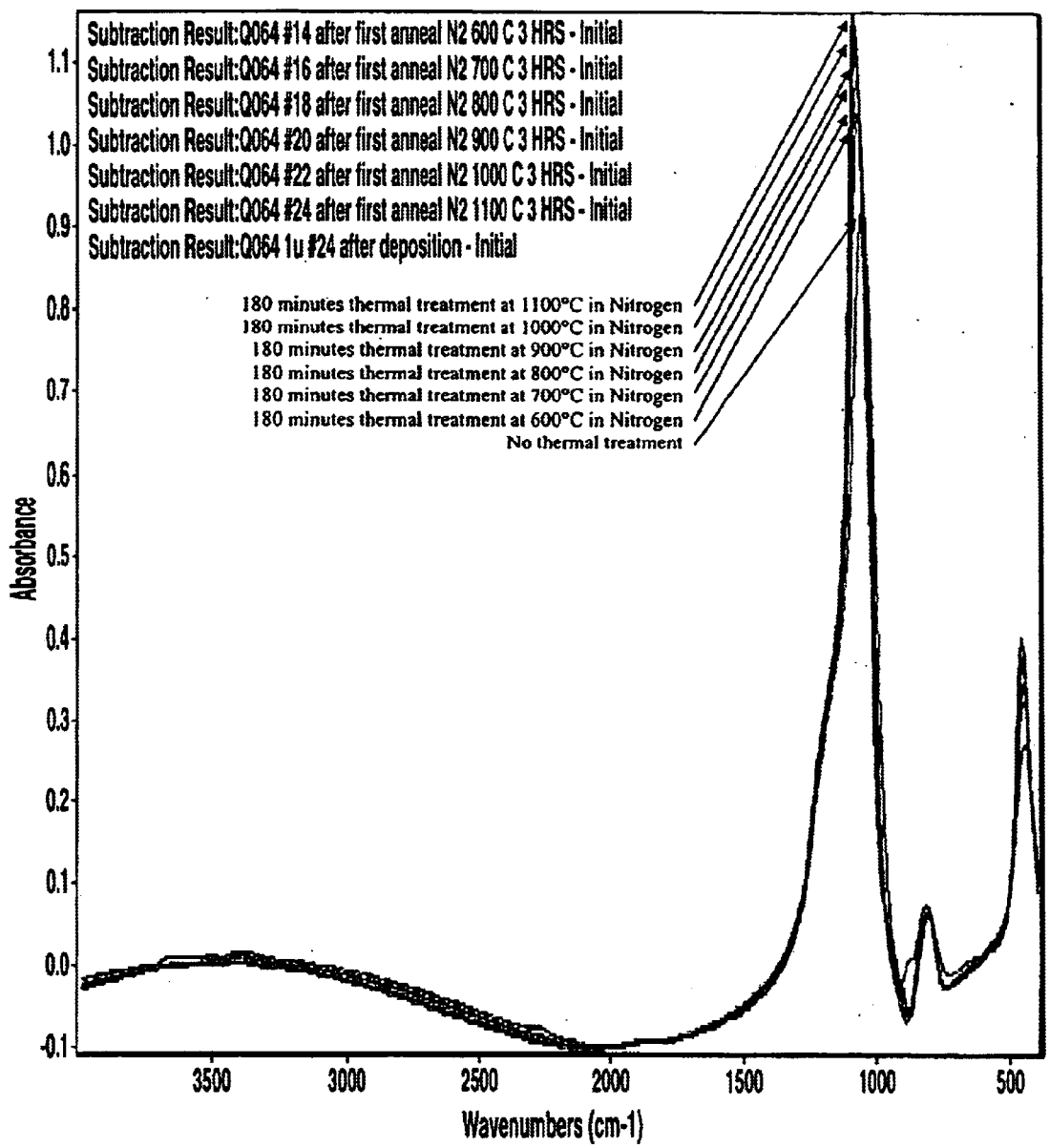
FIG. 3a shows the basic FTIR spectra of various buffers (claddings) obtained with a typical PECVD process after a 180 minutes thermal treatment in a nitrogen ambient at various temperatures.

The invention can be implemented to create PECVD optical quality silica-based optical elements using a commercially available PECVD system, the "Concept One" system manufactured by Novellus Systems in California, USA, and a standard diffusion tube.

FIG. 2 lists some FTIR fundamental infrared absorption peaks and their corresponding higher harmonics peaks associated with the various residual compounds resulting the Plasma Enhanced Chemical Vapour Deposition (PECVD) of buffer (cladding) from a silane ($SiH_4$) and nitrous oxide ($N_2O$) gas mixture at a relatively low temperature of 400° C. using the following reaction:

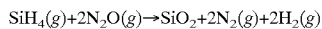

$$SiH_4(g) + 2N_2O(g) \rightarrow SiO_2 + 2N_2(g) + 2H_2(g)$$

and following high temperature thermal treatments in a nitrogen ambient. It will be seen that the FTIR fundamental infrared absorption peaks and their corresponding higher harmonics peaks associated of the residual compounds resulting from high temperature thermal treatments of PECVD silica films in a nitrogen ambient will contribute to the optical absorption in the 1.30 to 1.55 μm optical bands. The second vibration harmonics of the HO—H oscillators in trapped water vapour in the micro-pores of the silica films (3550 to 3750 cm$^{-1}$) increase the optical absorption near 1.333 to 1.408 μm. The second vibration harmonics of the SiO—H oscillators in the silica films (3470 to 3550 cm$^{-1}$) increases the optical absorption near 1.408 to 1.441 μm. The second vibration harmonics of the Si:N—H oscillators in the silica films (3300 to 3460 cm$^{-1}$) increases the optical absorption near 1.445 to 1.515 μm. The second vibration harmonics of the SiN—H oscillators in the silica films (3380 to 3460 cm$^{-1}$) increases the optical absorption near 1.445 to 1.479 μm. The third vibration harmonics of the Si—H oscillators in the silica films (2210 to 2310 cm$^{-1}$) increases the optical absorption near 1.443 to 1.505 μm. The fourth vibration harmonics of the Si═O oscillators in the silica films (1800 to 1950 cm$^{-1}$) increases the optical absorption near 1.282 to 1.389 μm. The fifth vibration harmonics of the N═N oscillators in the silica films (1530 to 1580 cm$^{-1}$) increases the optical absorption near 1.266 to 1.307 μm.

The negative effects of these the oscillators on the optical properties of silica-based optical components are reported in the literature. See, for example, Grand G., Low-loss PECVD silica channel waveguides for optical communications, Electron. Lett., 26 (25), 2135, 1990; Bruno F., Plasma-enhanced chemical vapor deposition of low-loss SiON optical waveguides at 1.5-μm wavelength, Applied Optics, 30 (31), 4560, 1991; Imoto K., High refractive index difference and low loss optical waveguide fabricated by low temperature processes, Electronic Letters, 29 (12), 1993; Hoffmann M., Low temperature, nitrogen doped waveguides on silicon with small core dimensions fabricated by PECVD/RIE, ECIO'95, 299, 1995; Bazylenko M., Pure and fluorine-doped silica films deposited in a hollow cathode reactor for integrated optic applications, J. Vac. Sci. Technol. A 14 (2), 336, 1996; Pereyra I., High quality low temperature DPECVD silicon dioxide, J. Non-Crystalline Solids, 212, 225, 1997; Kenyon T., A luminescence study of silicon-rich silica and rare-earth doped silicon-rich silica, Electrochem. Soc. Proc. Vol. 97-11, 304, 1997; Alayo M., Thick SiOxNy and SiO2 films obtained by PECVD technique at low temperatures, Thin Solid Films, 332, 40, 1998. Germann R., Silicon-oxynitride layers for optical waveguide applications, 195th meeting of the Electrochemical Society, 99-1, May 1999, Abstract 137, 1999; Worhoff K., Plasma enhanced chemical vapor deposition silicon oxynitride optimized for application in integrated optics, Sensors and Actuators, 74, 9, 1999.

This literature describes the tentative elimination of optical absorption (i.e. of the six residual oscillators) using thermal decomposition reactions during thermal treatments under a nitrogen ambient at a maximum temperature lower than 1350° C., the fusion point of the silicon wafer.

Comparative Examples

Optical absorption of typical PECVD buffer (cladding) following a 180 minutes thermal treatment in a nitrogen ambient at various high temperatures FIG. 3a, FIG. 4a, FIG. 6a, FIG. 7a, FIG. 8a and FIG. 9a show the FTIR spectra of typically deposited PECVD silica films before and after a 180 minutes long high temperature thermal treatment in a nitrogen ambient at a temperature of either 600, 700, 800, 900, 1000 or 1100° C. It can be seen that the higher the thermal decomposition temperature of the high temperature thermal treatment in a nitrogen ambient, the better the basic FTIR spectra of the treated silica films.

FIG. 3a shows the expected gradually more intense and smaller FWHM Si—O—Si "rocking mode" absorption peak (centred at 460 cm$^{-1}$) and Si—O—Si "in-phase-stretching mode" absorption peak (centred at 1080 cm$^{-1}$) as the temperature of the 180 minutes long thermal treatment in a nitrogen ambient is increased from 600° C. to 1100° C.

Figure 4A:
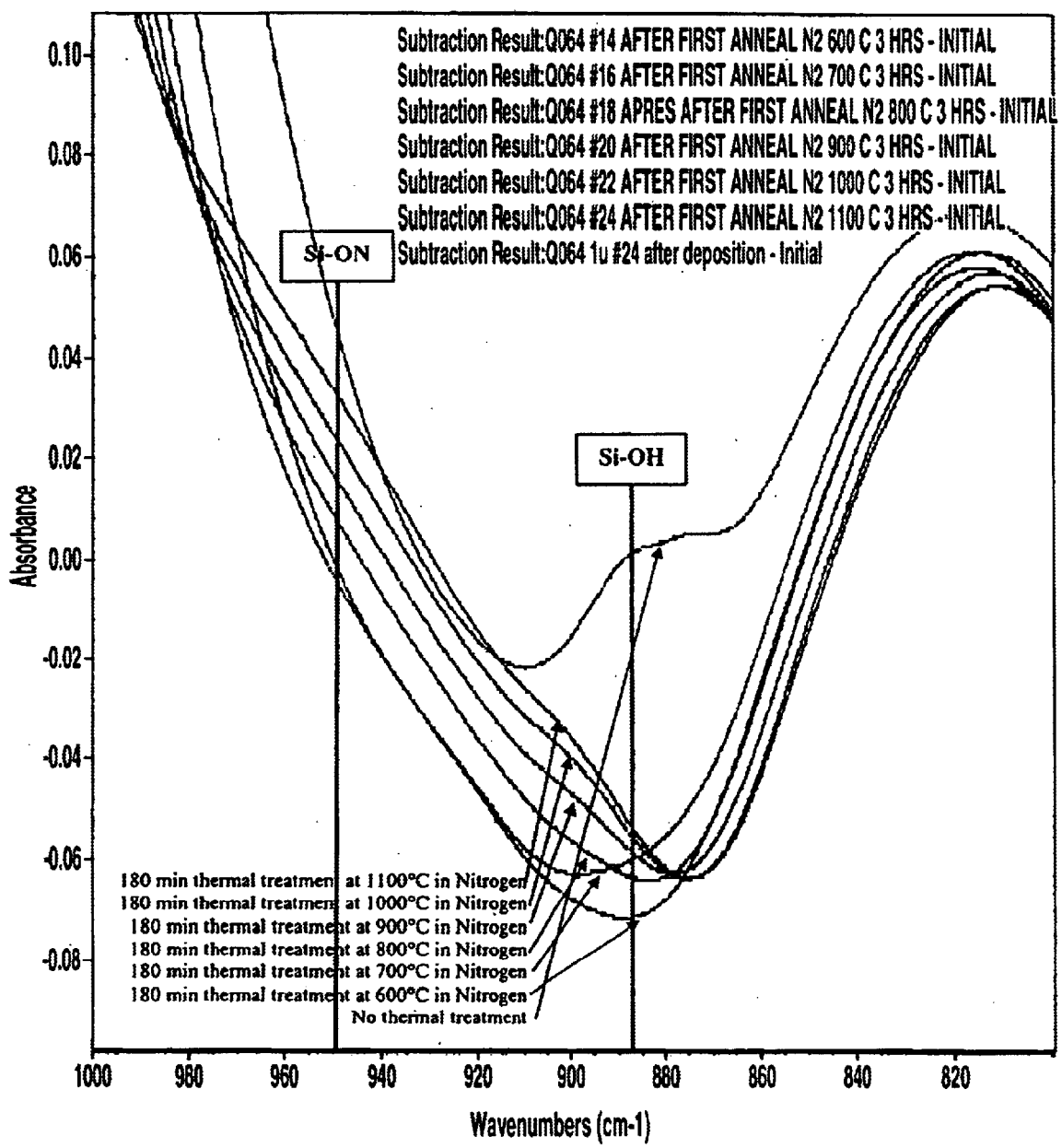
FIG. 4a shows the in-depth FTIR spectra from 810 to 1000 cm$^{-1}$ of various buffers (clads) obtained with a typical PECVD process after a 180 minutes thermal treatment in a nitrogen ambient at various temperatures.

FIG. 4a shows that the elimination of the Si—OH oscillators (centered at 885 cm$^{-1}$) is easy and already complete after the 180 minutes long thermal treatment in a nitrogen ambient at 600° C. FIG. 4a also shows that the elimination of the Si—ON oscillators (centred at 950 cm$^{-1}$) is much more difficult and that the higher the temperature of the 180 minutes long thermal treatment in a nitrogen ambient, the more nitrogen incorporation as Si—ON oscillators (i.e. as SiONH and/or SiON$_2$ compounds).

Figure 6A:
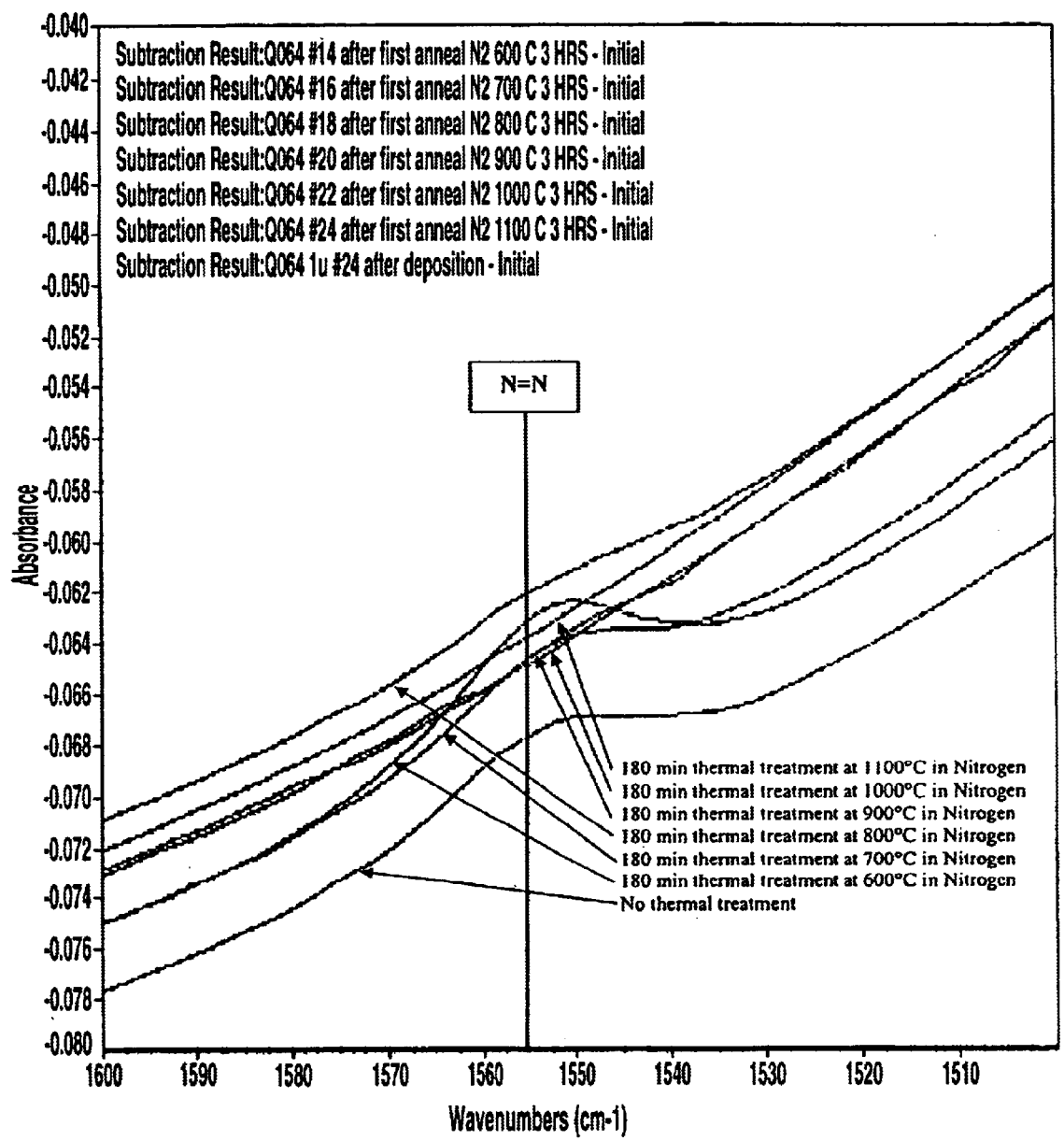
FIG. 6a shows the in-depth FTIR spectra from 1500 to 1600 cm$^{-1}$ of various buffers (claddings) obtained with a typical PECVD process after a 180 minutes thermal treatment in a nitrogen ambient at various temperatures.

FIG. 6a shows that the elimination of the N=N oscillators (centered at 1555 cm$^{-1}$) is also very difficult and does require the temperature of the high temperature thermal treatment in a nitrogen ambient to reach 1000° C.

Figure 7A:
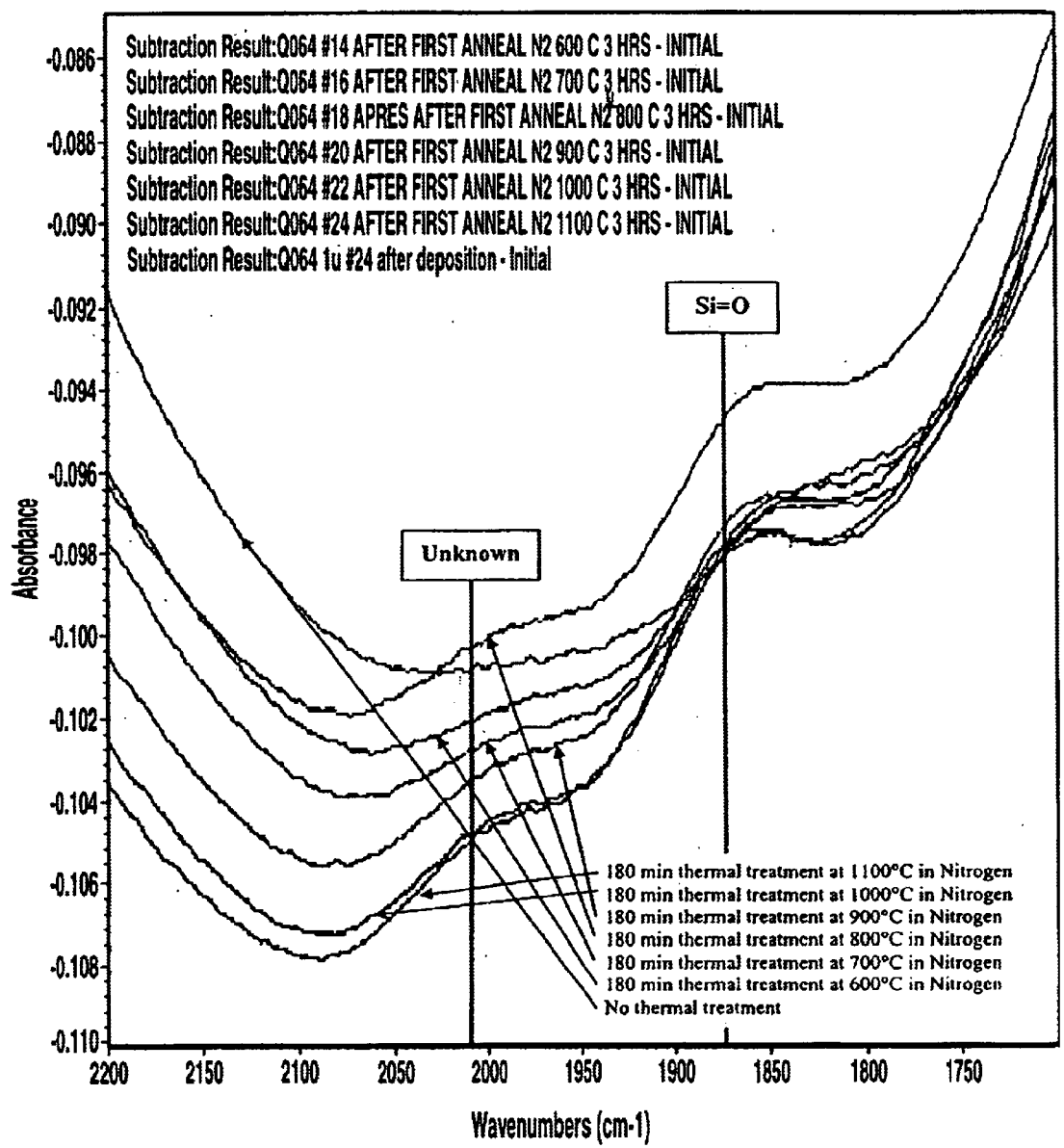
FIG. 7a shows the in-depth FTIR spectra from 1700 to 2200 cm$^{-1}$ of various buffers (claddings) obtained with a typical PECVD process after a 180 minutes thermal treatment in a nitrogen ambient at various temperatures.

FIG. 7a shows that there is very little influence of the temperature of the high temperature thermal treatment in a nitrogen ambient on the Si=O oscillators (centered at 1875 cm$^{-1}$) and on the unknown oscillator (centered at 2010 cm$^{-1}$).

Figure 8A:
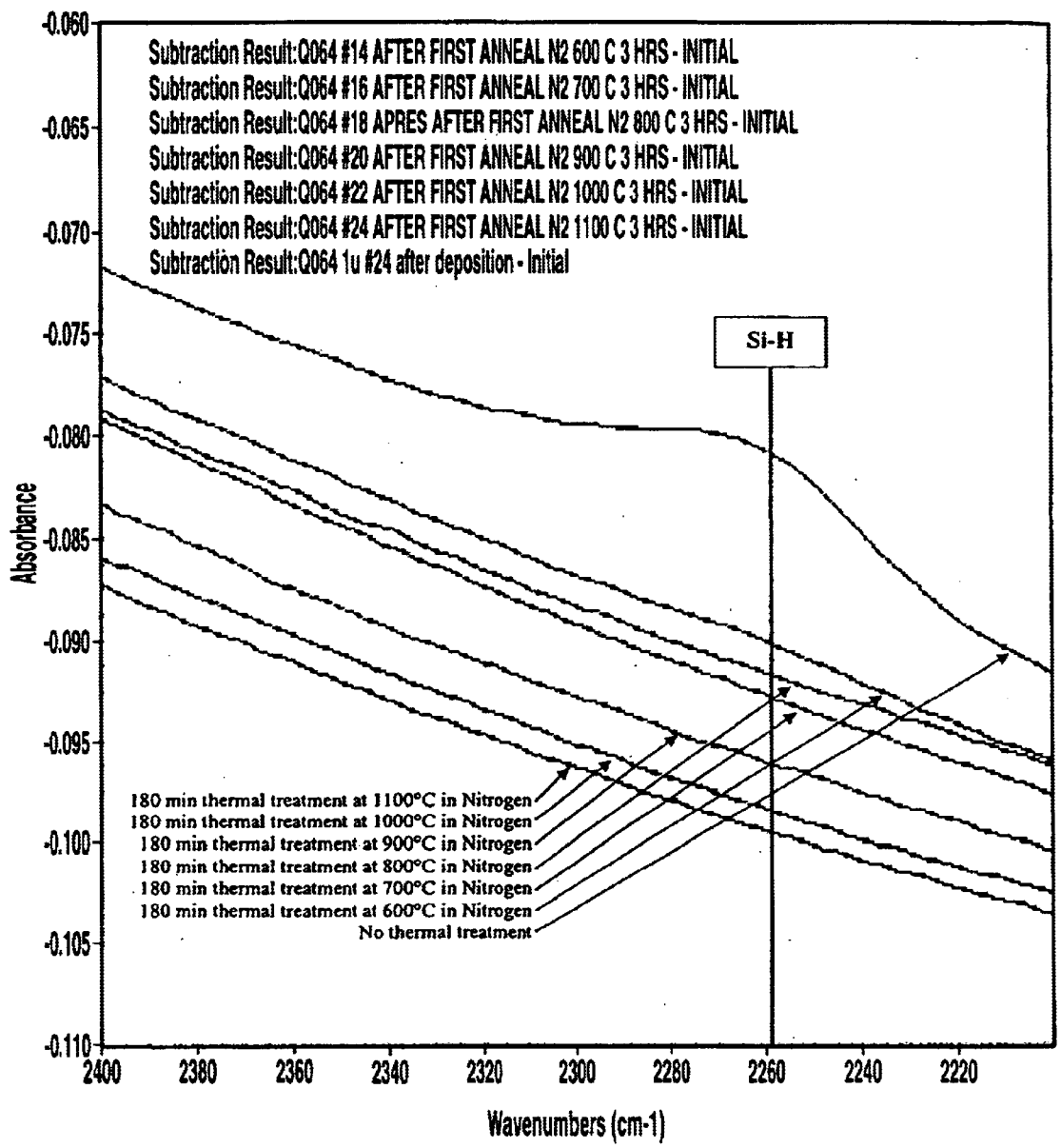
FIG. 8a shows the in-depth FTIR spectra from 2200 to 2400 cm$^{-1}$ of various buffers (cladding) obtained with a typical PECVD process after a 180 minutes thermal treatment in a nitrogen ambient at various temperatures.

FIG. 8a shows that the elimination of the Si-H oscillators (centered at 2260 cm$^{-1}$ and whose $3^{rd}$ harmonics could cause an optical absorption between 1.443 and 1.508 µm) is easy and already complete after the 180 minutes long thermal treatment in a nitrogen ambient at 600° C.

Figure 9A:
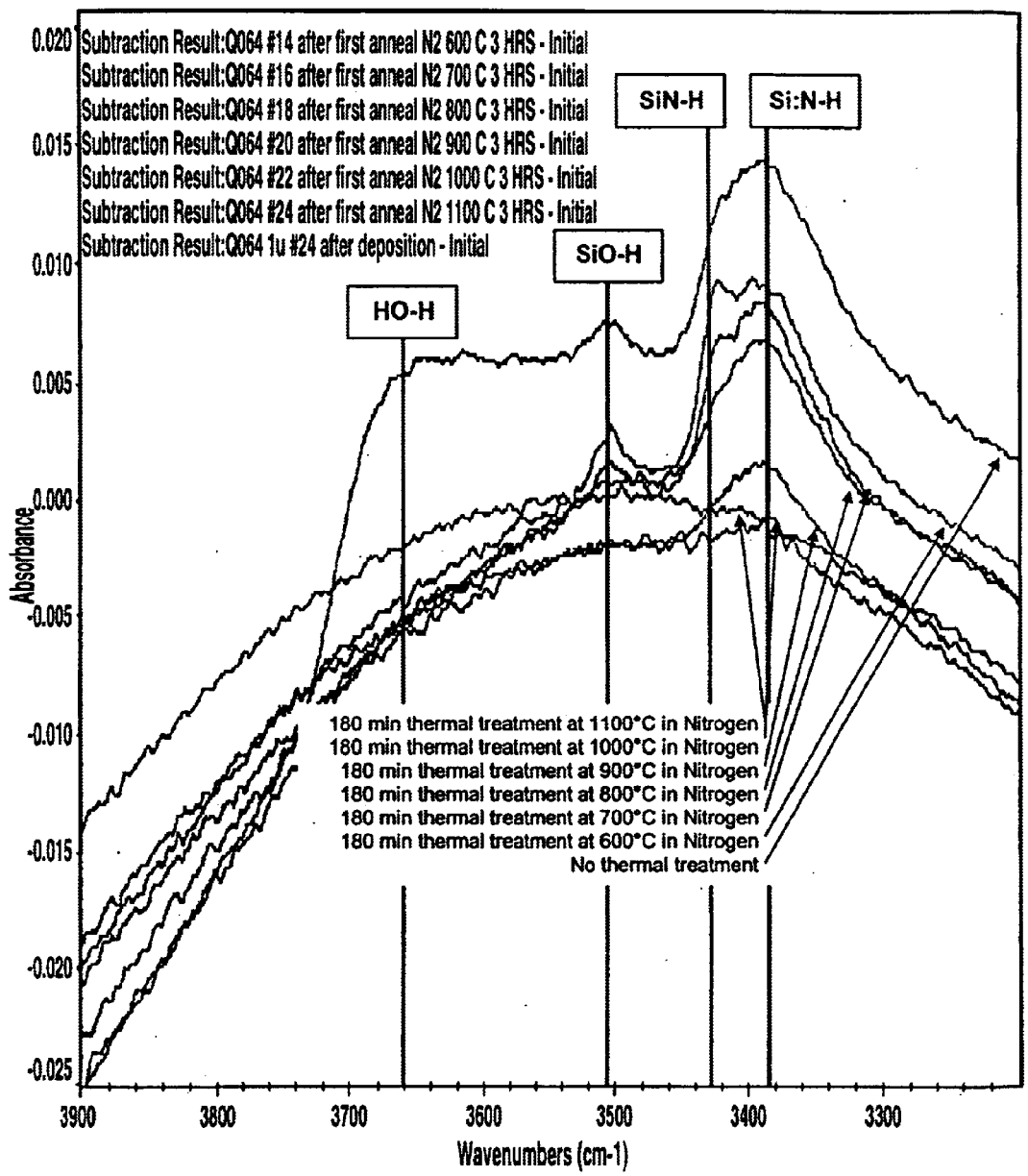
FIG. 9a shows the in-depth FTIR spectra from 3200 to 3900 cm$^{-1}$ of various buffers (claddings) obtained with a typical PECVD process after a 180 minutes thermal treatment in a nitrogen ambient at various temperatures.

FIG. 9a shows that the elimination of the Si:N—H oscillators (centered at 3380 cm$^{-1}$ whose $2^{nd}$ harmonics could cause an optical absorption between 1.445 and 1.515 µm) is also very difficult and does require the temperature of the high temperature thermal treatment in a nitrogen ambient to reach 1100° C. The complete elimination of the Si:N—H oscillators is extremely difficult because the nitrogen atoms of these oscillators are bonded to the silicon atoms of the SiO$_2$ network via two covalent bonds. FIG. 9a also shows that the elimination of the SiN—H oscillators (centered at 3420 cm$^{-1}$ whose $2^{nd}$ harmonics could cause an optical absorption between 1.445 and 1.479 µm) is almost as difficult and does require the temperature of the high temperature thermal treatment in a nitrogen ambient to reach 1000° C. FIG. 9a also shows that the elimination of the SiO—H oscillators (centered at 3510 cm$^{-1}$ and whose $2^{nd}$ harmonics could cause an optical absorption between 1.408 and 1.441 µm) is slightly easier and does require the temperature of the high temperature thermal treatment in a nitrogen ambient to reach 900° C. Finally, FIG. 9a also shows that the elimination of the HO—H oscillators (centered at 3650 cm$^{-1}$ and whose $2^{nd}$ harmonics could cause an optical absorption between 1.333 and 1.408 µm) is very easy since already complete after the high temperature thermal treatment in a nitrogen ambient of only 600° C.

It is apparent from the various FTIR spectra that it is necessary to use extremely high temperature thermal treatments in a nitrogen ambient in order to eliminate the residual optical absorption of typically deposited PECVD silica films. In particular, it is demonstrated that the elimination of the residual nitrogen and hydrogen of typically deposited PECVD silica films is very difficult since the residual Si:N—H oscillators (whose $2^{nd}$ harmonics could cause an optical absorption between 1.445 and 1.515 µm) requires a temperature of 1100° C. because the nitrogen atoms of these oscillators are bonded to the silicon atoms of the SiO$_2$ network via two covalent bonds, the elimination of the SiN—H oscillators (whose $2^{nd}$ harmonics could cause an optical absorption between 1.445 and 1.479 µm) requires a temperature of 1000° C., and the elimination of the SiO—H oscillators (whose $2^{nd}$ harmonics could cause an optical absorption between 1.408 and 1.441 µm) requires a temperature of 900° C.

It is very difficult to achieve high optical quality silica-based optical components from typically deposited PECVD silica films using thermal treatments in nitrogen ambient at temperatures lower than 1100° C.

Our co-pending U.S. patent application Ser. No. 09/833, 711 describes an improved Plasma Enhanced Chemical Vapour Deposition technique for silica films which involves the independent control of the SiH$_4$, N$_2$O and N$_2$ gases as well as of the total deposition pressure via an automatic control of the pumping speed of the vacuum pump in a five-dimensional space. The first independent variable, the SiH$_4$ gas flow, is fixed at 0.20 std liter/min. The second independent variable, the N$_2$O gas flow, is fixed at 6.00 std liter/min. The third independent variable, the N$_2$ gas flow, being fixed at 3.15 std liter/min. The fourth independent variable, the total deposition pressure, being varied between of 2.00 Torr, 2.10 Torr, 2.20 Torr, 2.30 Torr, 2.40 Torr, 2.50 Torr, and 2.60 Torr. The fifth dimension is the observed FTIR characteristics of various buffers (claddings), as reported in FIG. 3b, FIG. 4b, FIG. 6b, FIG. 7b, FIG. 8b and FIG. 9b.

The five-dimensional space permits the elimination of these residual nitrogen and hydrogen atoms as to achieve high optical quality silica-based optical components from typically deposited PECVD silica films a 180 minutes thermal treatment in a nitrogen ambient at a reduced temperature of 800° C.

Figure 3B:
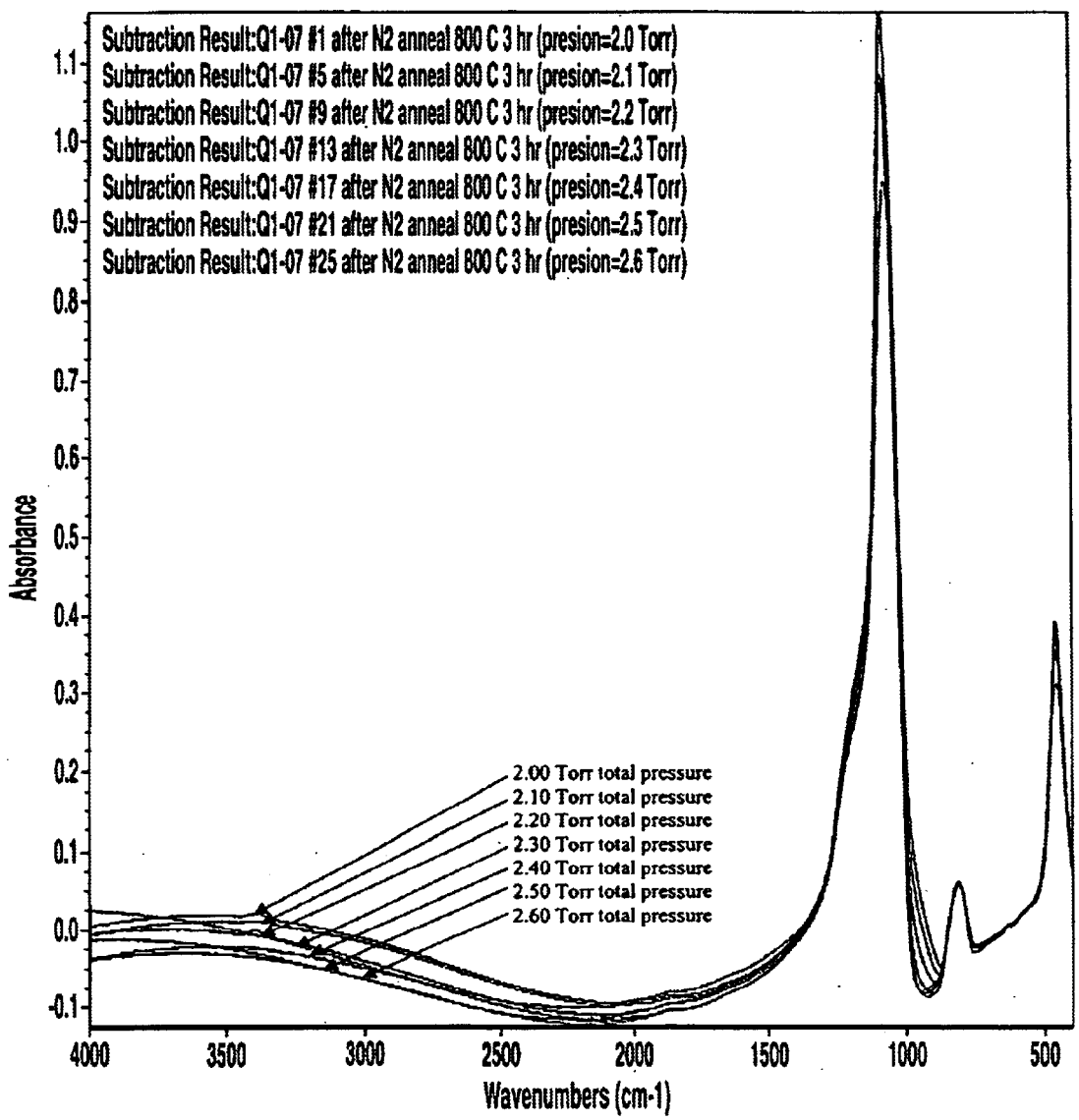
FIG. 3b shows the basic FTIR spectra of various buffers (claddings) obtained with the PECVD deposition technique described in our co-pending U.S. patent application Ser. No. 09/833,711 and after a thermal treatment in a nitrogen ambient at 800° C.
Figure 4B:
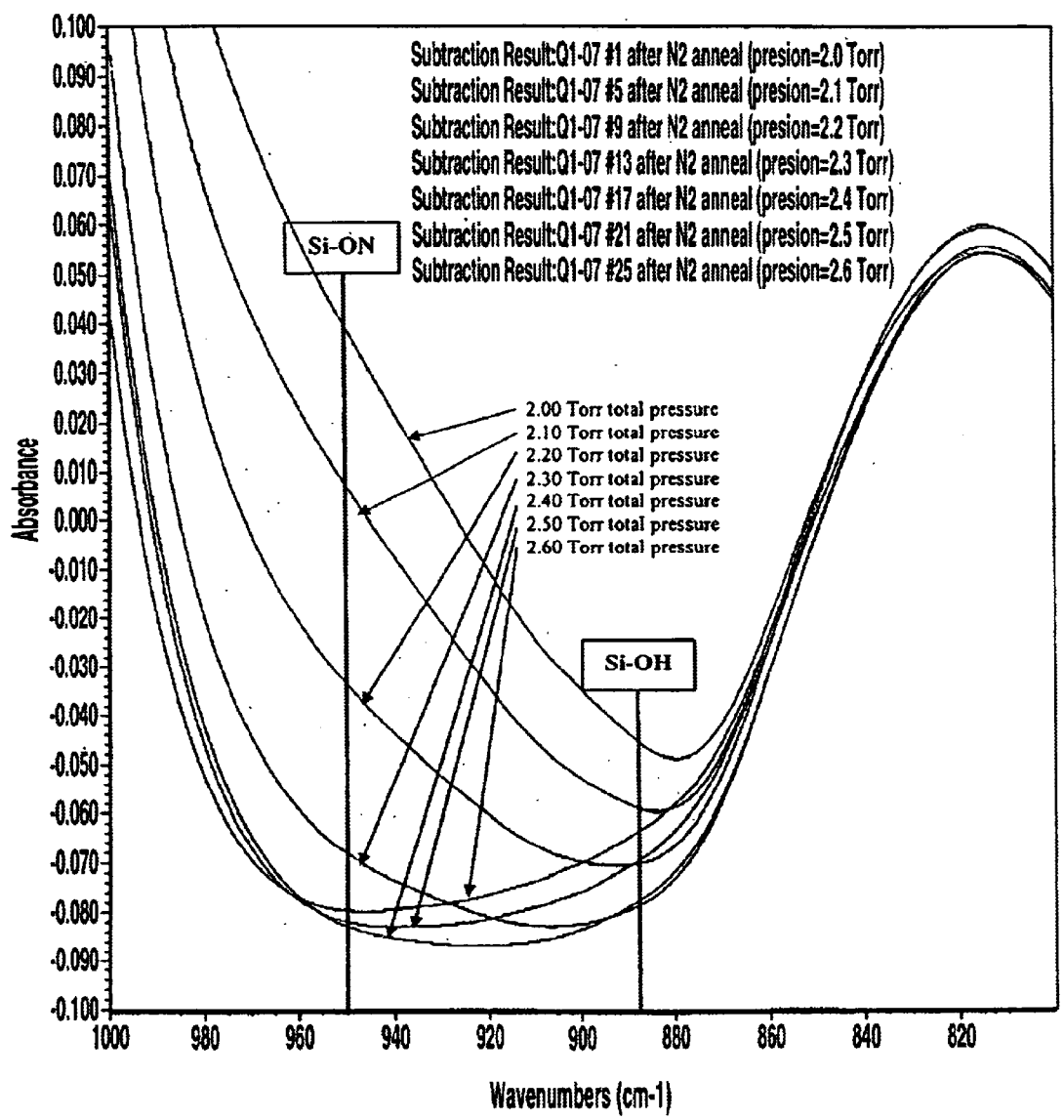
FIG. 4b shows the in-depth FTIR spectra from 810 to 1000 cm$^{-1}$ of various buffers (clads) obtained with the PECVD deposition technique described in our co-pending U.S. patent application Ser. No. 09/833,711 titled after a thermal treatment in a nitrogen ambient at 800° C.
Figure 6B:
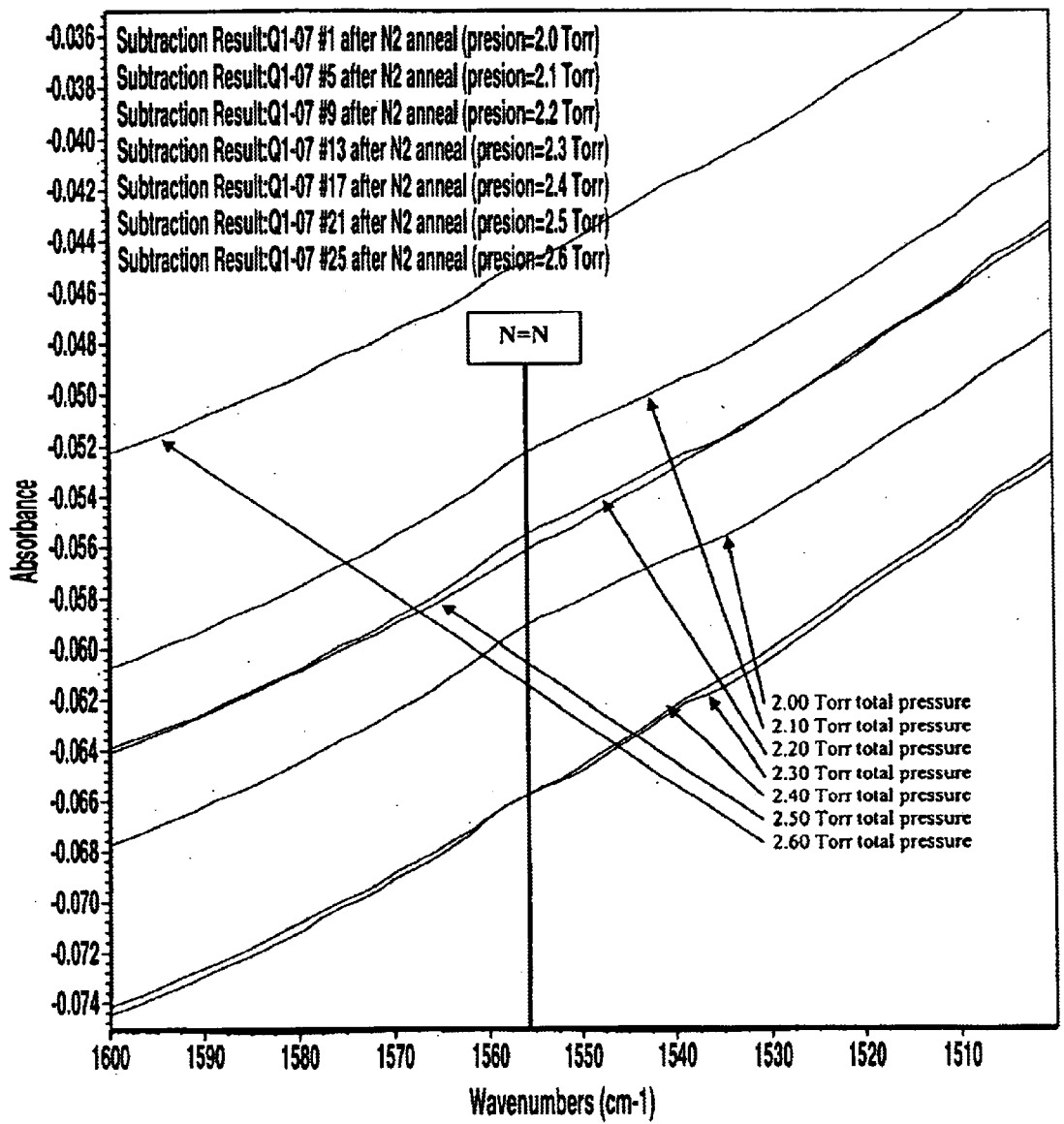
FIG. 6b shows the in-depth FTIR spectra from 1500 to 1600 cm$^{-1}$ of various buffers (claddings) obtained with the PECVD deposition technique described in our co-pending U.S. patent application Ser. No. 09/833,711 after a thermal treatment in a nitrogen ambient at 800° C.
Figure 7B:
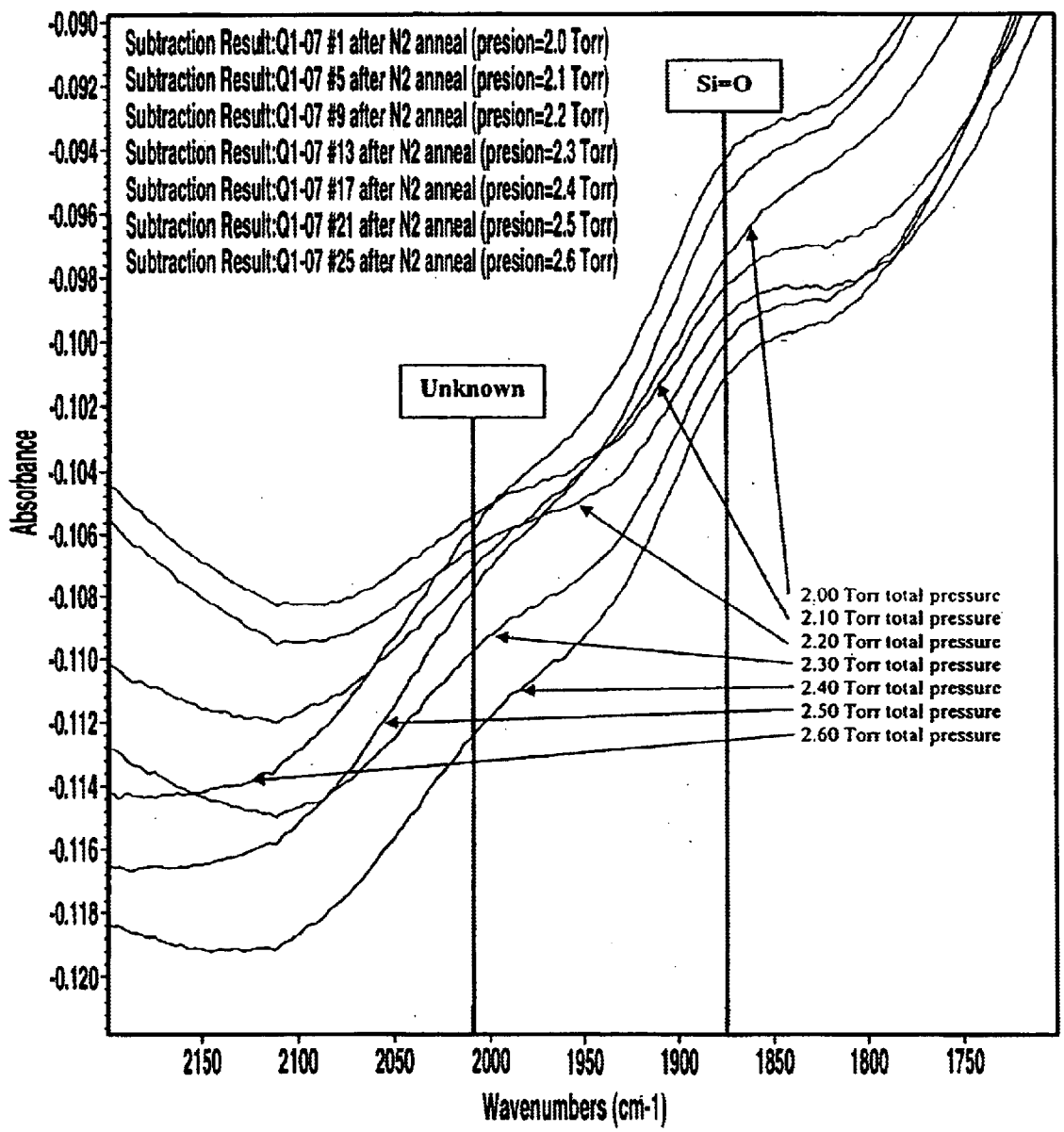
FIG. 7b shows the in-depth FTIR spectra from 1700 to 2200 cm$^{-1}$ of various buffers (claddings) obtained with the PECVD deposition technique described in our co-pending U.S. patent application Ser. No. 09/833,711 after a thermal treatment in a nitrogen ambient at 800° C.
Figure 8B:
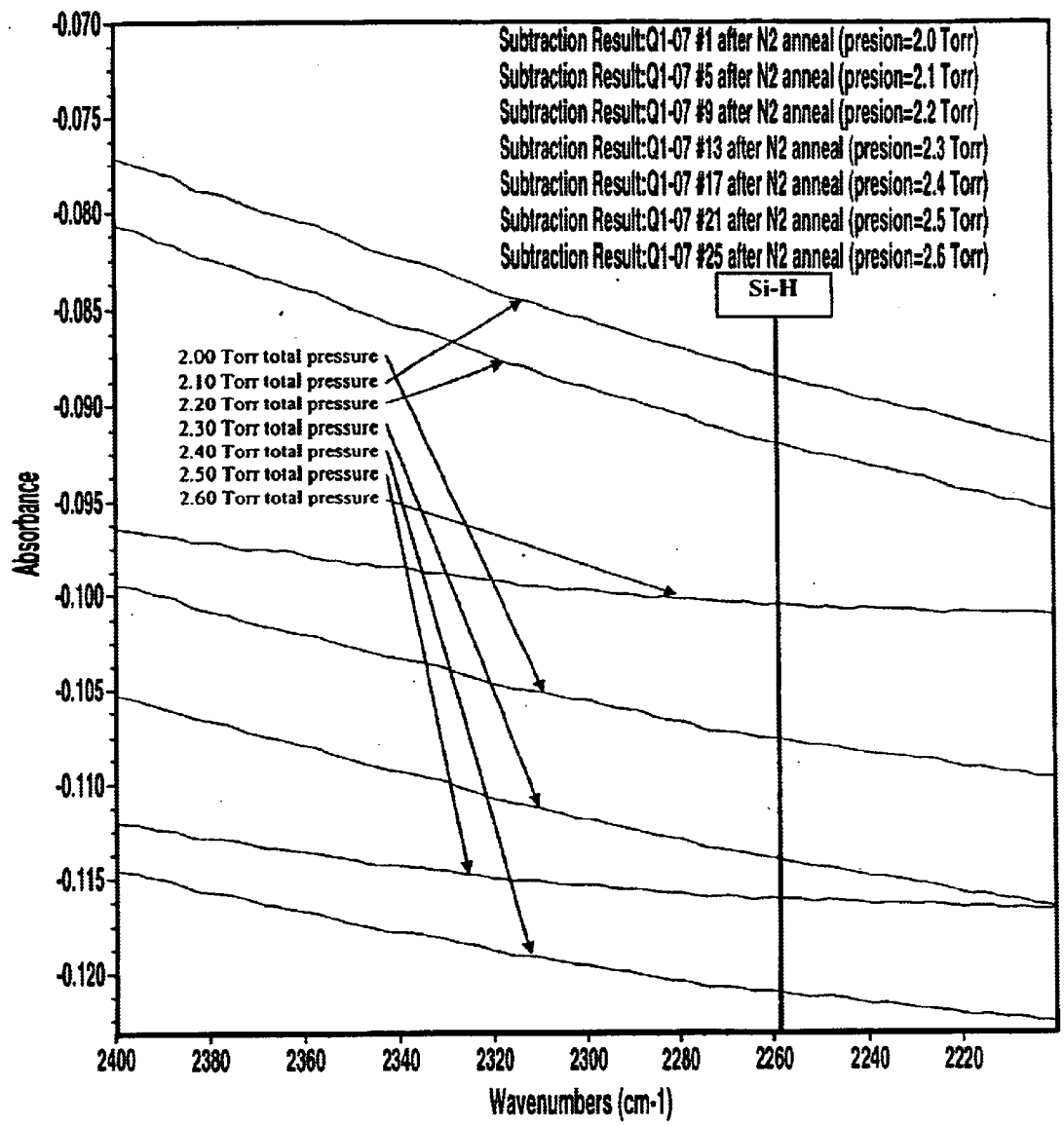
FIG. 8b shows the in-depth FTIR spectra from 2200 to 2400 cm$^{-1}$ of various buffers (claddings) obtained with the PECVD deposition technique described in our co-pending U.S. patent application Ser. No. 09/833,711 after a thermal treatment in a nitrogen ambient at 800° C.
Figure 9B:
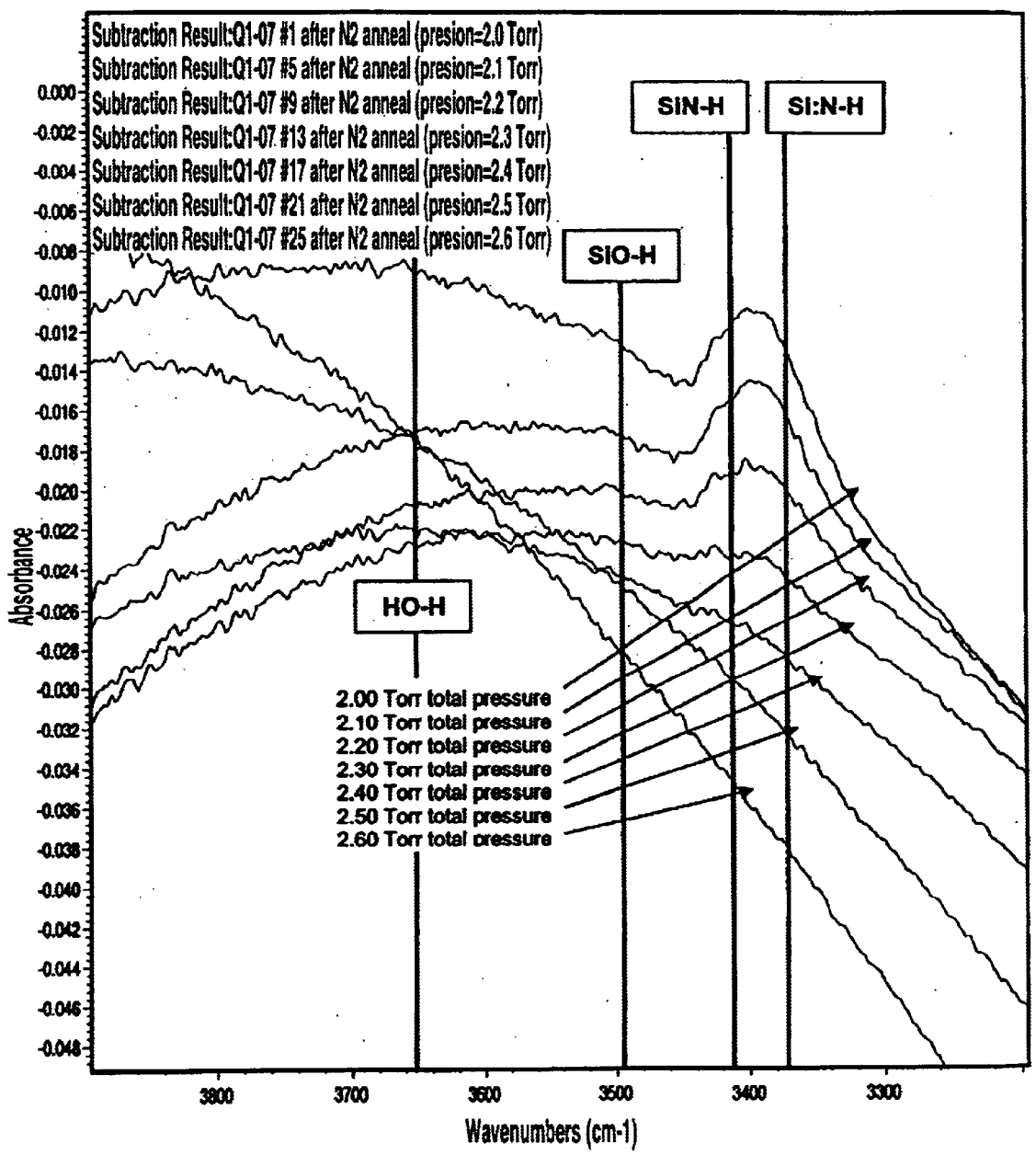
FIG. 9b shows the in-depth FTIR spectra from 3200 to 3900 cm$^{-1}$ of various buffers (claddings) obtained with the PECVD deposition technique described in our co-pending U.S. patent application Ser. No. 09/833,711 after a thermal treatment in a nitrogen ambient at 800° C.

FIG. 3b, FIG. 4b, FIG. 6b, FIG. 7b, FIG. 8b and FIG. 9b show the FTIR spectra of PECVD silica films deposited using a commercially available PECVD system, the "Concept One" system manufactured by Novellus Systems in California, USA, using the fixed flow rates of silane (SiH$_4$), of nitrous oxide (N$_2$O) and of nitrogen (N$_2$O), as described in this co-pending U.S. patent application Ser. No. 09/833, 711. These spectra are obtained before and after a 180 minutes thermal treatment in a nitrogen ambient at a reduced temperature of 800° C. in a standard diffusion tube. It is clear that the technique described in our co-pending application allows the attainment of high optical quality silica films after a 180 minutes thermal treatment in a nitrogen ambient at a reduced temperature of 800° C. and that the independent control of the downstream pressure of this improved PECVD deposition technique has a major effect on the FTIR spectra of the treated silica films:

FIG. 3b shows a more intense and smaller FWHM Si—O—Si "rocking mode" absorption peak (centred at 460 cm$^{-1}$) and Si—O—Si "in-phase-stretching mode" absorption peak (centred at 1080 cm$^{-1}$) as the total deposition pressure is increased from 2.00 Torr to 2.40 Torr followed by a slight degradation as the pressure is increased further more up to 2.60 Torr;

FIG. 4b shows the gradual elimination of the Si—OH oscillators (centered at 885 cm$^{-1}$) as the total deposition pressure is increased from 2.00 Torr up to the optimum pressure of 2.40 Torr followed by a slight degradation as the pressure is increased further more up to 2.60 Torr. FIG. 4b also shows the gradual elimination of the Si—ON oscillators (centred at 950 cm$^{-1}$) as the total deposition pressure is increased from 2.00 Torr to 2.40 Torr followed by a slight degradation as the pressure is increased further more up to 2.60 Torr. The optimum separation and deep valley observed at 2.40 Torr is an indication that the silica films resulting from this optimum deposition pressure are composed of high quality SiO$_2$ material. This contrasts with the upper-mentioned results of typical PECVD silica films which still incorporate a lot of Si—ON oscillators even after much higher temperature thermal treatments in a nitrogen ambient;

FIG. 6b shows the gradual and total elimination of the N=N oscillators (centered at 1555 cm$^{-1}$) as the total deposition pressure is increased from 2.00 Torr to 2.60 Torr. This also contrasts with the upper-mentioned results of typical PECVD silica films which require a 180 minutes thermal treatment in a nitrogen ambient at a temperature of 1000° C. in order to achieve similar results;

FIG. 7b shows the gradual elimination of the Si=O oscillators (centered at 1875 $cm^{-1}$) and on the unknown oscillator (centered at 2010 $cm^{-1}$) as the total deposition pressure is increased from 2.00 Torr to 2.40 Torr followed by a slight degradation as the pressure is increased further more up to 2.60 Torr. These effects are not that important since only the fourth harmonics of the Si=O oscillators could absorb in the 1.30 to 1.55 $\mu$m optical bands;

FIG. 8b shows that the Si—H oscillators (centered at 2260 $cm^{-1}$ which $3^{rd}$ harmonics could cause an optical absorption between 1.443 and 1.508 $\mu$m) are completely eliminated for all deposition pressures;

FIG. 9b shows the spectacular gradual elimination of the Si:N—H oscillators (centered at 3380 $cm^{-1}$ whose $2^{nd}$ harmonics could cause an optical absorption between 1.445 and 1.515 $\mu$m) as the total deposition pressure is increased from 2.00 Torr to 2.60 Torr. This contrasts with the upper-mentioned results of typical PECVD silica films which require a thermal treatment in a nitrogen ambient at a temperature of 1100° C. in order to achieve similar results. FIG. 9b also shows a spectacular gradual elimination of the SiN—H oscillators (centered at 3420 $cm^{-1}$ whose $2^{nd}$ harmonics could cause an optical absorption between 1.445 and 1.479 $\mu$m) as the total deposition pressure is increased from 2.00 Torr to 2.60 Torr. This also contrasts with the upper-mentioned results of typical PECVD silica films which require a thermal treatment in a nitrogen ambient at a temperature of 1000° C. in order to achieve similar results. FIG. 9b also shows that the SiO—H oscillators (centered at 3510 $cm^{-1}$ and whose $2^{nd}$ harmonics could cause an optical absorption between 1.408 and 1.441 $\mu$m) are completely eliminated for all deposition pressures. This also contrasts with the upper-mentioned results of typical PECVD silica films which require a thermal treatment in a nitrogen ambient at a temperature of 900° C. in order to achieve similar results. Finally, FIG. 9b also shows that the elimination of the HO—H oscillators (centered at 3650 $cm^{-1}$ and whose $2^{nd}$ harmonics could cause an optical absorption between 1.333 and 1.408 $\mu$m) are completely eliminated for all deposition pressures.

It is apparent from the various FTIR spectra that our co-pending U.S. patent application Ser. No. 09/833,711 prohibits the use of extremely high temperature thermal treatments in a nitrogen ambient in order to eliminate the residual optical absorption of typically deposited PECVD silica films. In particular, it is demonstrated that the elimination of the residual nitrogen and hydrogen of typically deposited PECVD silica films is completely achieved after a 180 minutes thermal treatment in a nitrogen ambient at a reduced temperature of 800° C. The residual Si:N—H oscillators (whose $2^{nd}$ harmonics could cause an optical absorption between 1.445 and 1.515 $\mu$m) are completely eliminated as the total deposition pressure is increased from 2.00 Torr to 2.60 Torr. The residual SiN—H oscillators (whose $2^{nd}$ harmonics could cause an optical absorption between 1.445 and 1.479 $\mu$m) are also completely eliminated as the total deposition pressure is increased from 2.00 Torr to 2.60 Torr. The residual SiO—H oscillators (whose $2^{nd}$ harmonics could cause an optical absorption between 1.408 and 1.441 $\mu$m) are also completely eliminated as the total deposition pressure is increased from 2.00 Torr to 2.60 Torr.

It is then very easy to achieve high optical quality silica films after a 180 minutes thermal treatment in a nitrogen ambient at a reduced temperature of 800° C. using the technique described in our co-pending U.S. patent application Ser. No. 09/833,711.

Our co-pending U.S. patent application Ser. No. 09/799, 491 shows the spectacular effect of a fifth independent variable, the phosphine, $PH_3$ gas flow, on the optimization of the optical properties of the various buffer (cladding) and core waveguides in a six-dimensional space. The first independent variable, the $SiH_4$ gas flow, is fixed at 0.20 std liter/mi. The second independent variable, the $N_2O$ gas flow, is fixed at 6.00 std liter/min. The third independent variable, the $N_2$ gas flow, is fixed at 3.15 std liter/min. The fourth independent variable, the $PH_3$ gas flow, is varied between 0.00 std liter/min, 0.12 std liter/min; 0.25 std liter/min; 0.35 std liter/min; 0.50 std liter/min; and 0.65 std liter/min.

The fifth independent variable, the total deposition pressure, is fixed at 2.60 Torr The sixth dimension is the observed FTIR characteristics of various buffer (cladding) and core waveguides, as reported in: FIG. 3c, FIG. 4c, FIG. 5c, FIG. 6c, FIG. 7c, FIG. 8c, & FIG. 9c.

Figure 3C:
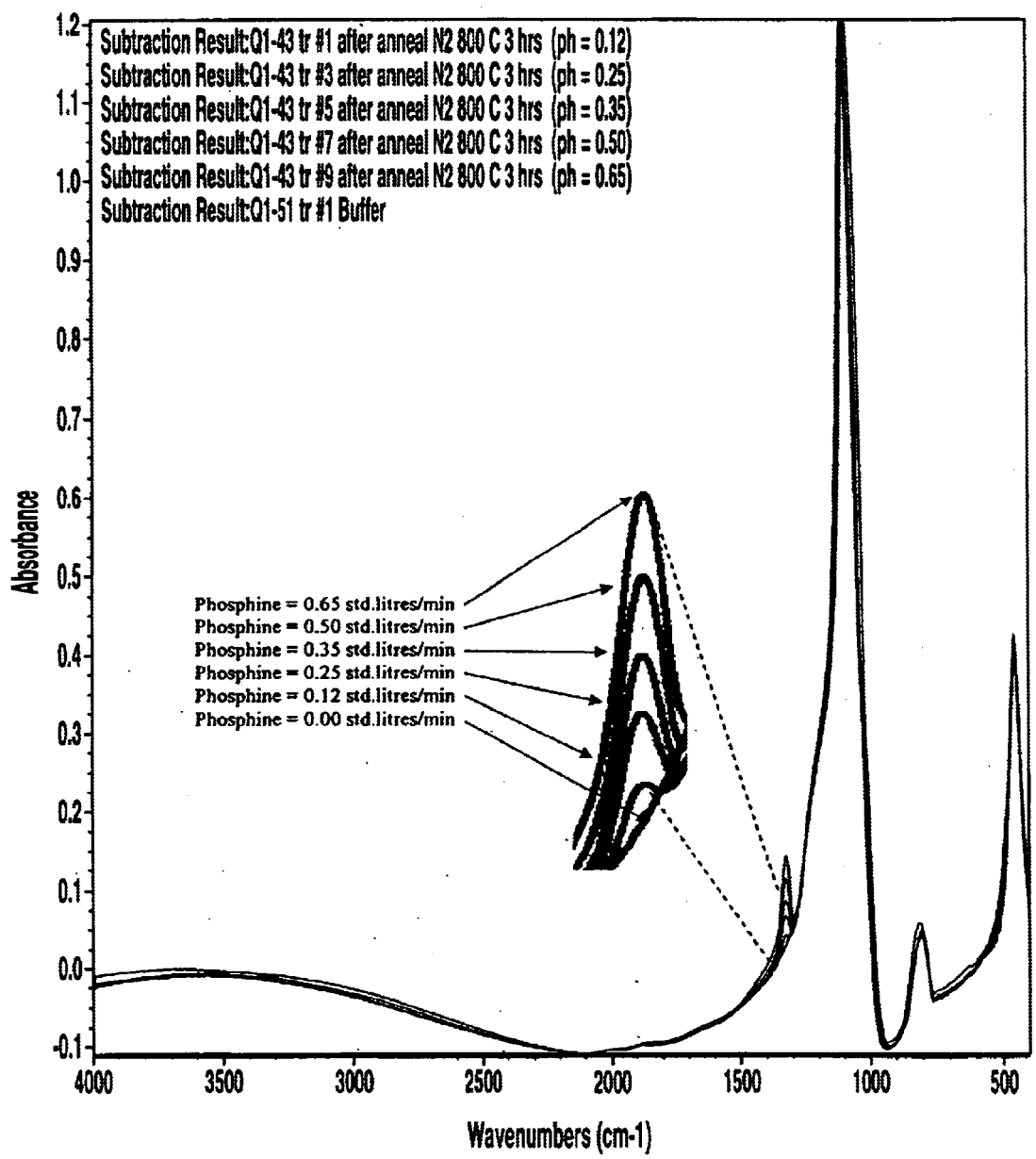
FIG. 3c shows the basic FTIR spectra of various cores obtained at 2.60 Torr with the PECVD deposition technique described in our co-pending U.S. patent application Ser. No. 09/799,4091 and after a thermal treatment in a nitrogen ambient at 800° C.
Figure 4C:
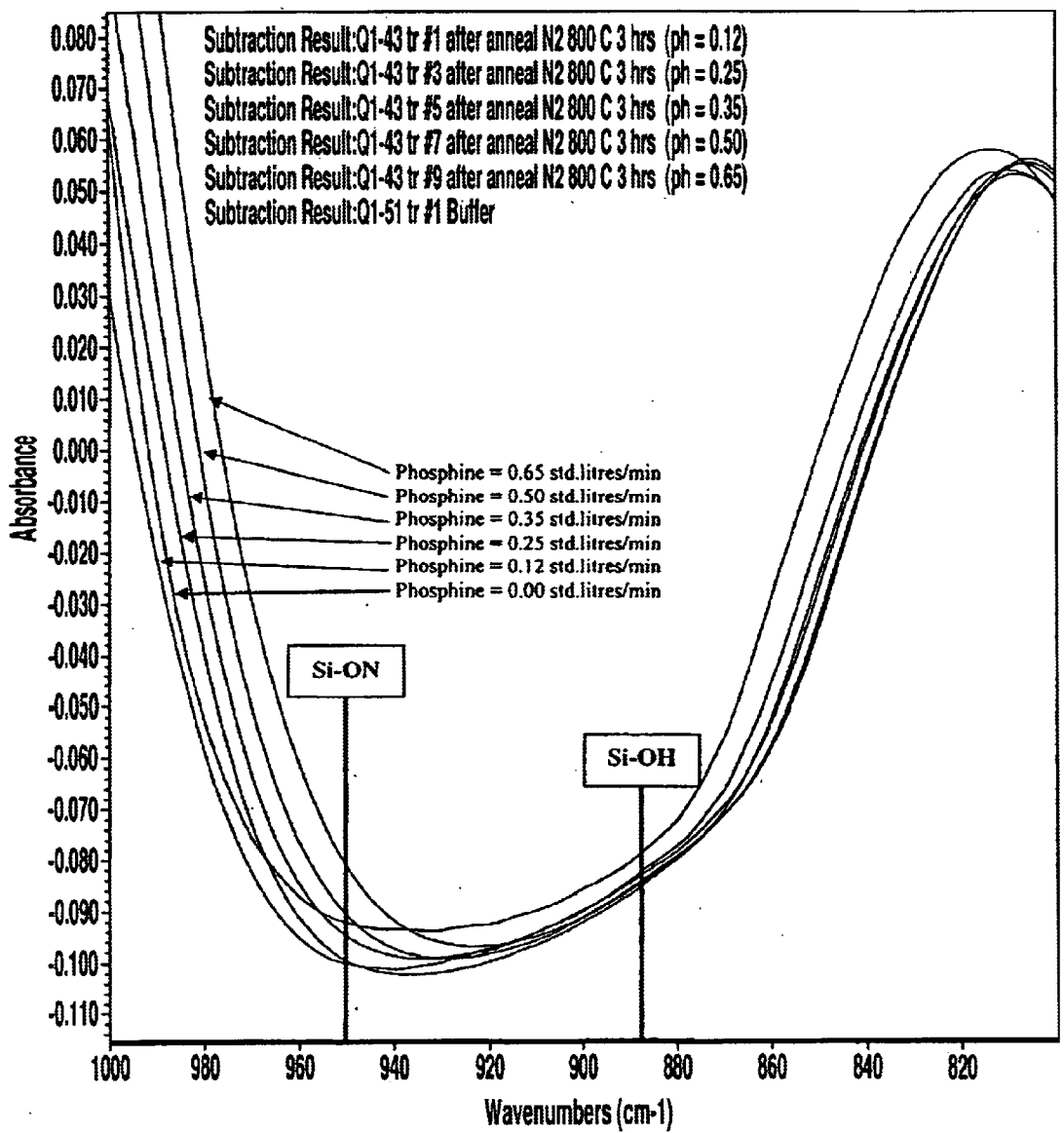
FIG. 4c shows the in-depth FTIR spectra from 810 to 1000 cm$^{-1}$ of various cores obtained at 2.60 Torr with the PECVD deposition technique described in our co-pending U.S. patent application Ser. No. 09/799,491 after a thermal treatment in a nitrogen ambient at 800° C.

FIG. 3c, FIG. 4c, FIG. 5c, FIG. 6c, FIG. 7c, FIG. 8c and FIG. 9c show the FTIR spectra of PECVD silica films deposited using a commercially available PECVD system, the "Concept One" system manufactured by Novellus Systems in California, USA, using the fixed optimum total deposition pressure and the fixed flow rates of silane ($SiH_4$), of nitrous oxide ($N_2O$) and of nitrogen ($N_2O$), as described in our co-pending U.S. patent application Ser. No. 09/799, 491. These spectra are obtained after a high temperature thermal treatment for 180 minutes in a nitrogen ambient at a fixed temperature of only 800° C in a standard diffusion tube. It is clear that the technique described in our co-pending patent application allows the achievement of high optical quality silica waveguides after a 180 minutes thermal treatment in a nitrogen ambient at a reduced temperature of 800° C.:

FIG. 3c shows that the intense and small FWHM Si—O—Si "rocking mode" absorption peak (centred at 460 $cm^{-1}$) and Si—O—Si "in-phase-stretching mode" absorption peak (centred at 1080 $cm^{-1}$) of the fixed deposition pressure of 2.60 Torr of FIG. 3b is maintained in FIG. 3c as the $PH_3$ flow rate is gradually increased from 0.00 std liter/min to 0.65 std liter/min. This means that at a fixed deposition pressure of 2.60 Torr, the control of the $PH_3$ gas flow independently of the $SiH_4$ gas flow, of the $N_2O$ gas flow and of the $N_2$ gas flow has no effect on the basic FTIR spectra of the treated silica films;

FIG. 4c shows that an even more gradual elimination of the Si—OH oscillators (centered at 885 $cm^{-1}$) is observed at the total deposition pressure of 2.60 Torr as the $PH_3$ flow rate is increased from 0.00 std liter/min to 0.65 std liter/min. FIG. 4c also shows that a gradual elimination of the Si—ON oscillators (centred at 950 $cm^{-1}$) is also observed at the total deposition pressure of 2.60 Torr as the $PH_3$ flow rate is increased from 0.00 std liter/min up to the optimum 0.25 std liter/min followed by a very slight degradation as the $PH_3$ flow rate is increased further more up to 0.65 std liter/min. This spectacular improved elimination of the residual Si—ON oscillators after a 180 minutes thermal treatment of only 800° C. contrasts with the upper-mentioned results of typical PECVD silica films of FIG. 4a which still incorporate a lot of Si—ON oscillators even after a thermal treatment in a nitrogen ambient at a much higher temperature of 1100° C. This also contrasts with the upper-mentioned results of PECVD buffer (cladding) deposited at a non-optimized pressure of less than 2.40 Torr as described in our co-pending U.S. patent application Ser. No. 09/833,711 of FIG. 4b which still incorporate a large number of Si—ON oscillators even after a 180 minutes thermal treatment in a nitrogen ambient at a much higher temperature of 800° C. The optimum separation and deep valley between the Si—O—Si "in-phase-stretching mode" absorption peak (1080 cm$^{-1}$) and the Si—O—Si "bending mode" absorption peak (810 cm$^{-1}$) of the fixed deposition pressure of 2.60 Torr of FIG. 4b is maintained and in fact slightly improved as the PH$_3$ flow rate is gradually increased from 0.00 std liter/min to 0.35 std liter/min.

Figure 5C:
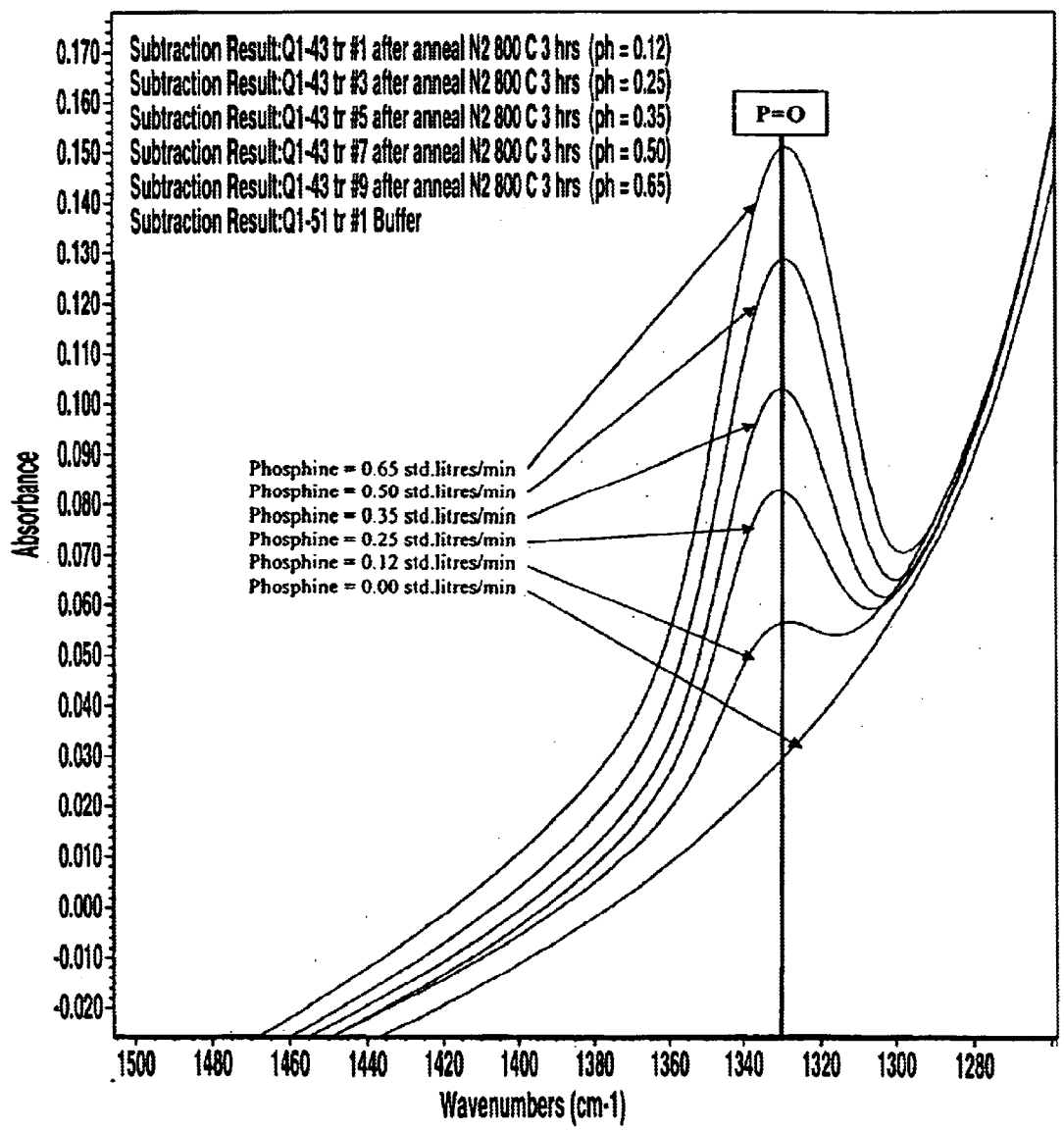
FIG. 5c shows the in-depth FTIR spectra from 1260 to 1500 cm$^{-1}$ of various cores obtained at 2.60 Torr with the PECVD deposition technique described in our co-pending U.S. patent application Ser. No. 09/799,491 after a thermal treatment in a nitrogen ambient at 800° C.

FIG. 5c shows that a gradual appearance of the P═O oscillators (centered at 1330 cm$^{-1}$ and which does not have a higher harmonics which could cause optical absorption in the 1.30 to 1.55 μm optical bands) is observed at the total deposition pressure of 2.60 Torr as the PH$_3$ flow rate is increased from 0.00 std liter/min to 0.65 std liter/min. This FTIR absorption peak is used to calibrate the phosphorus incorporation in core.

Figure 6C:
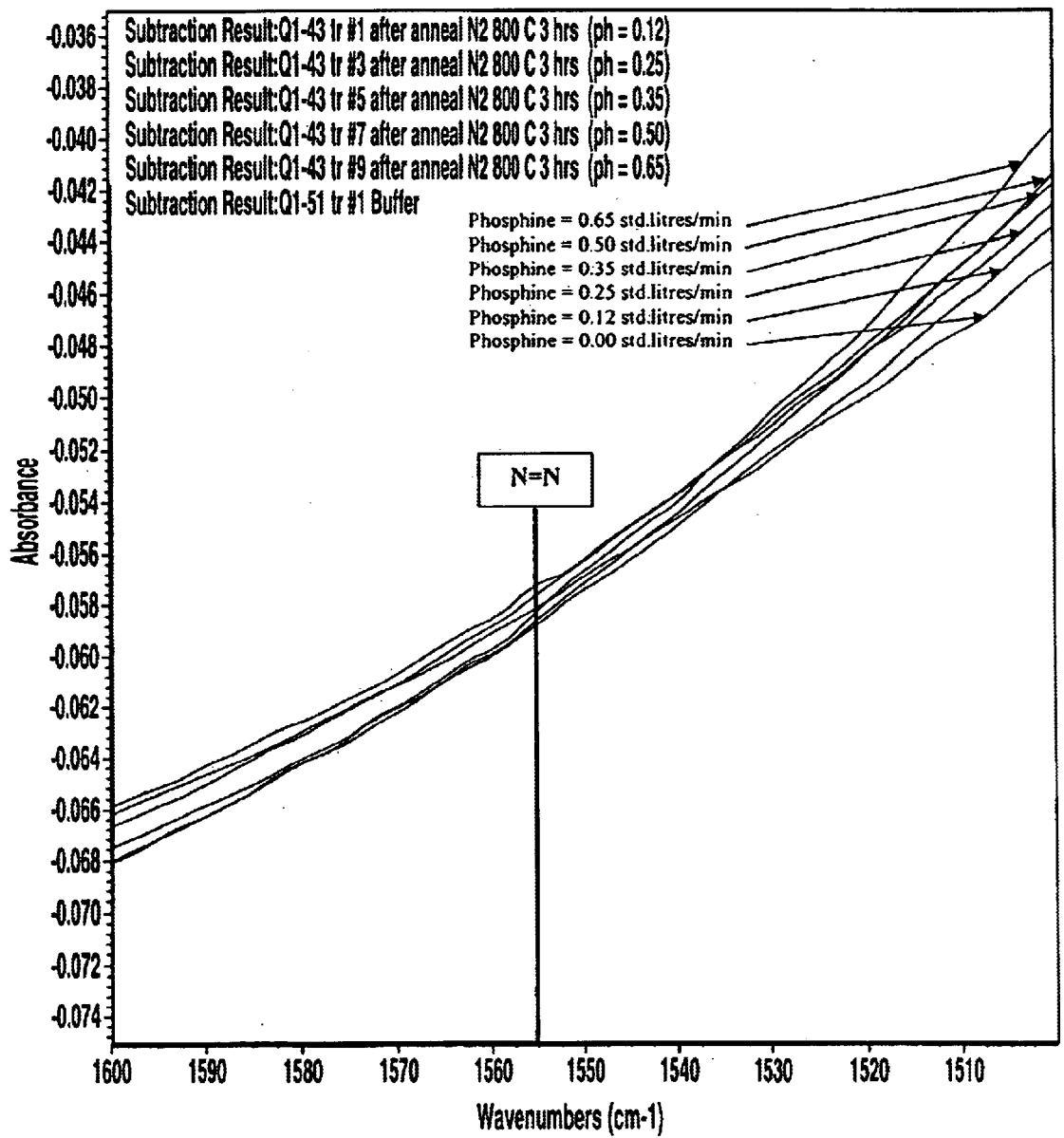
FIG. 6c shows the in-depth FTIR spectra from 1500 to 1600 cm$^{-1}$ of various cores obtained at 2.60 Torr with the PECVD deposition technique described in our co-pending U.S. patent application Ser. No. 09/799,491 after a thermal treatment in a nitrogen ambient at 800° C.

FIG. 6c shows that of the N═N oscillators (centered at 1555 cm$^{-1}$) are completely eliminated at the total deposition pressure of 2.60 Torr for all PH$_3$ flow rate values from 0.00 std liter/min to 0.65 std liter/min. This contrasts with the upper-mentioned results of typical PECVD silica films of FIG. 6a which require a 180 minutes thermal treatment in a nitrogen ambient at a temperature of 1000° C. in order to achieve similar results. This also contrasts with the upper-mentioned results of PECVD buffer (cladding) deposited at a non-optimized pressure of less than 2.40 Torr by our co-pending U.S. patent application Ser. No. 09/833,711' of FIG. 6b which still incorporate a large number of N═N oscillators even after a 180 minutes thermal treatment in a nitrogen ambient at a much higher temperature of 800° C.

Figure 7C:
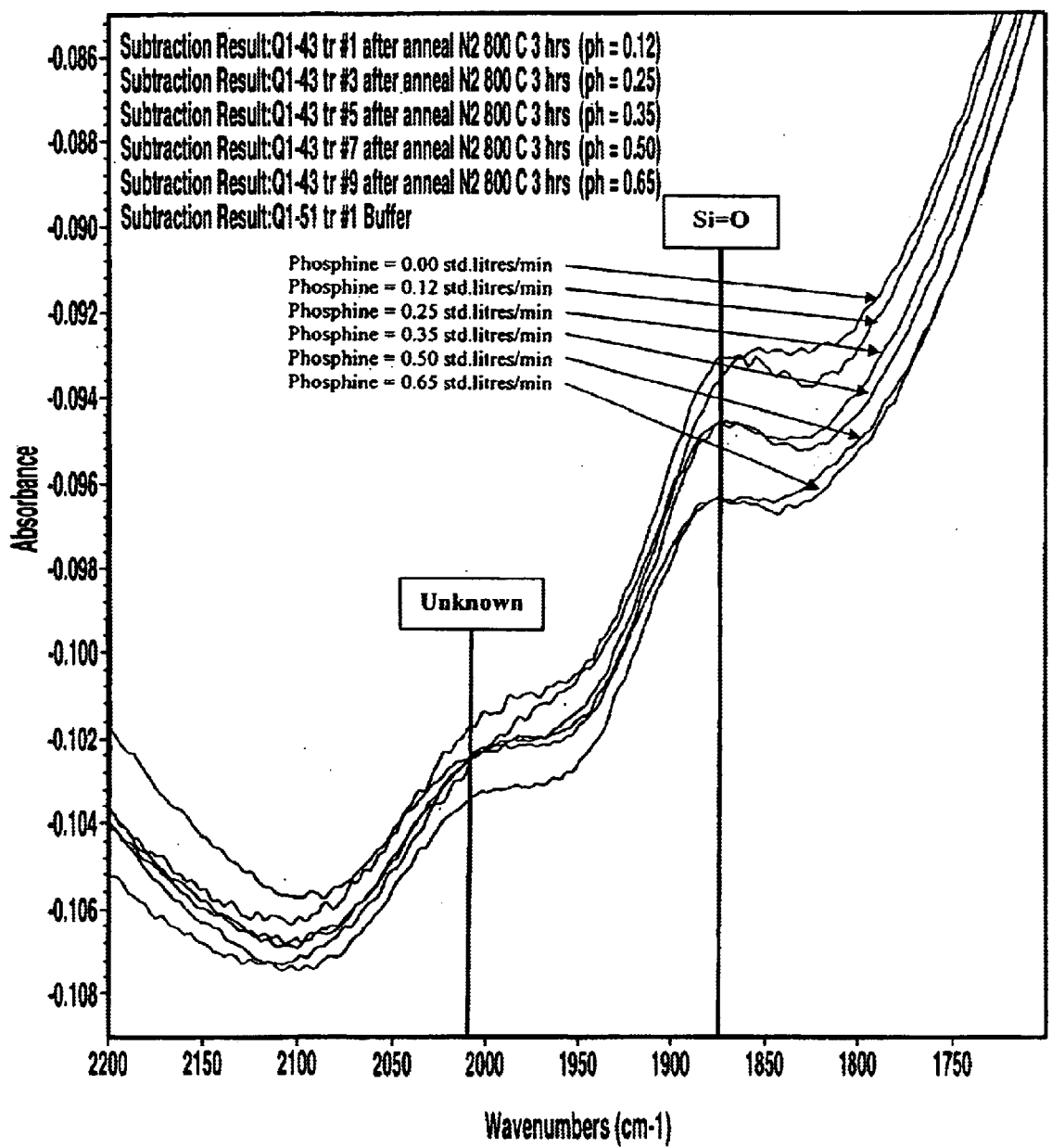
FIG. 7c shows the in-depth FTIR spectra from 1700 to 2200 cm$^{-1}$ of various cores obtained at 2.60 Torr with the PECVD deposition technique described in our co-pending U.S. patent application Ser. No. 09/799,491 after a thermal treatment in a nitrogen ambient at 800° C.
Figure 8C:
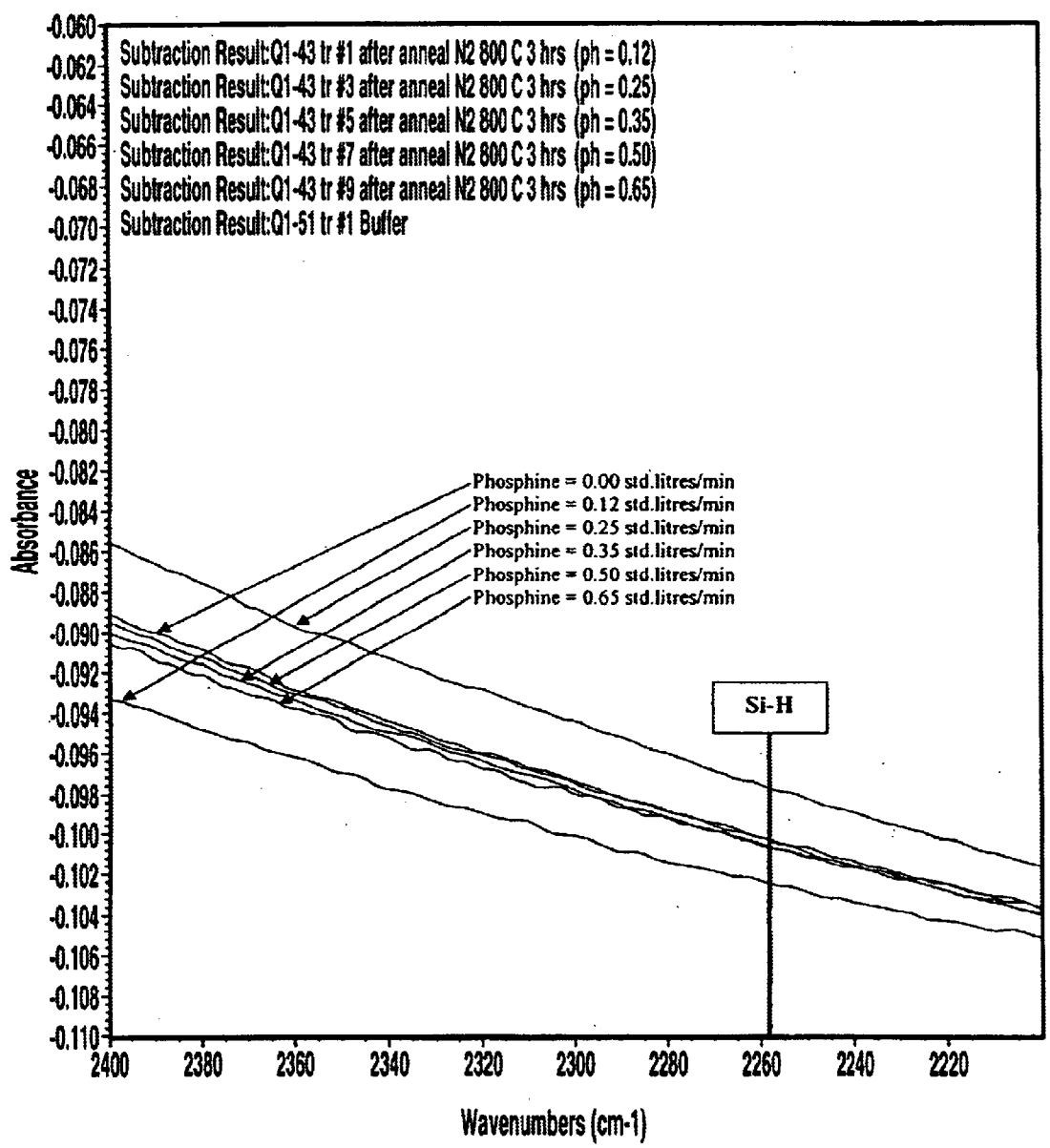
FIG. 8c shows the in-depth FTIR spectra from 2200 to 2400 cm$^{-1}$ of various cores obtained at 2.60 Torr with the PECVD deposition technique described in our co-pending U.S. patent application Ser. No. 09/799,491 after a thermal treatment in a nitrogen ambient at 800° C.

FIG. 7c shows that the Si═O oscillators (centered at 1875 cm$^{-1}$) and the unknown oscillator (centered at 2010 cm$^{-1}$) at the total deposition pressure of 2.60 Torr are not influenced by the PH$_3$ flow rate from 0.00 std liter/min to 0.65 std liter/min. These effects are not that important since only the fourth harmonics of the Si═O oscillators could absorb in the 1.30 to 1.55 μm optical bands;

FIG. 8c shows that the Si—H oscillators (centered at 2260 cm$^{-1}$ and which third harmonics could cause an optical absorption between 1.443 and 1.508 μm) at the total deposition pressure of 2.60 Torr are still completely eliminated by any of all PH$_3$ flow rates from 0.00 std liter/min to 0.65 std liter/min.

Figure 9C:
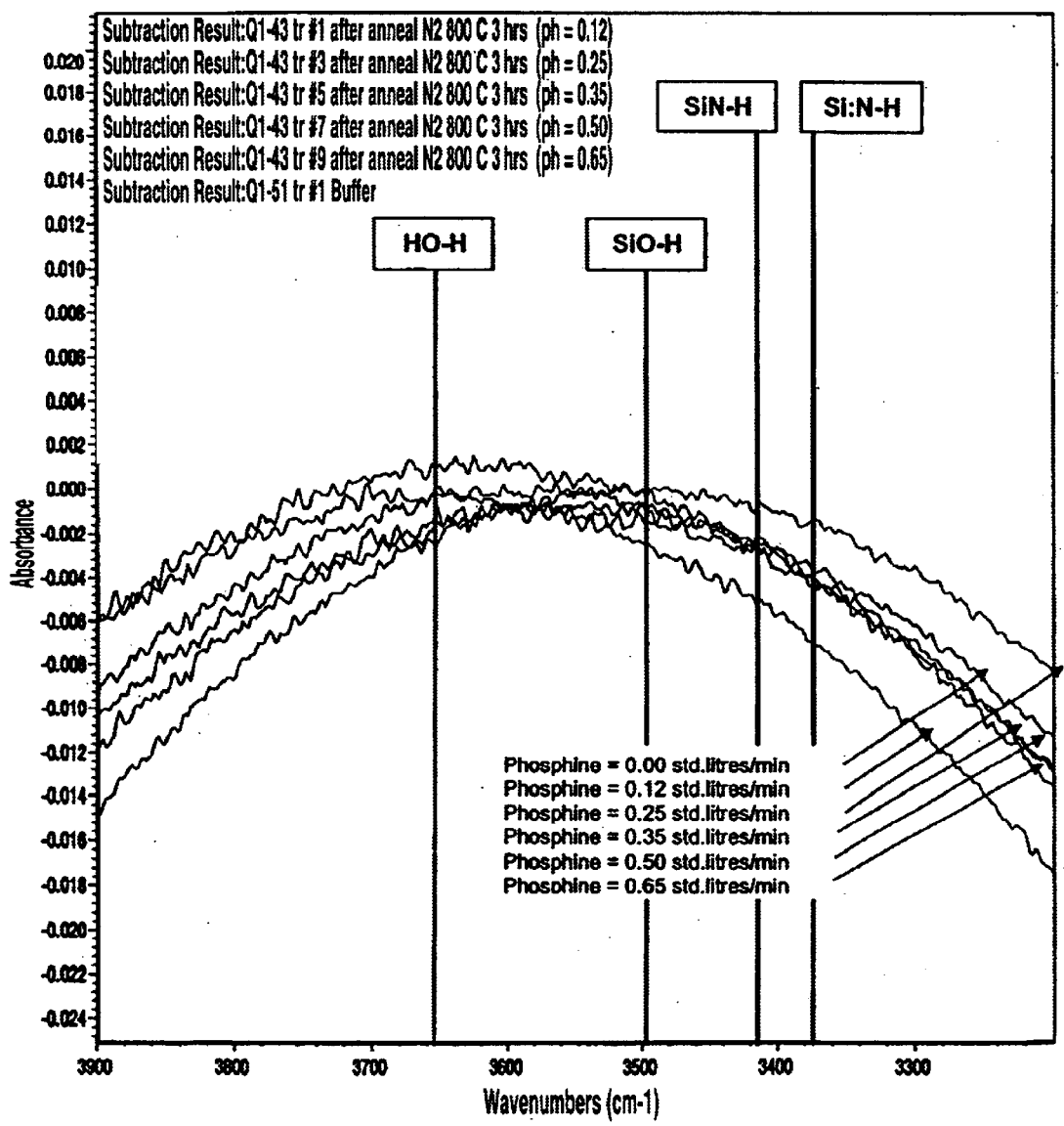
FIG. 9c shows the in-depth FTIR spectra from 3200 to 3900 cm$^{-1}$ of various cores obtained at 2.60 Torr with the PECVD deposition technique described in our co-pending U.S. patent application Ser. No. 09/799,491 after a thermal treatment in a nitrogen ambient at 800° C.

FIG. 9c shows that the complete elimination of the Si:N—H oscillators (centered at 3380 cm$^{-1}$ whose $2^{nd}$ harmonics could cause an optical absorption between 1.445 and 1.515 μm) at the total deposition pressure of 2.60 Torr is maintained for all PH$_3$ flow rates from 0.00 std liter/min to 0.65 std liter/min. This contrasts with the upper-mentioned results of typical PECVD silica films which require a thermal treatment in a nitrogen ambient at a temperature of 1100° C. in order to achieve similar results. This also contrasts with the upper-mentioned results of PECVD buffer (cladding) deposited at a non-optimized pressure of less than 2.40 Torr by our co-pending U.S. patent application Ser. No. 09/833,711 of FIG. 9b which still incorporate a lot of Si:N—H oscillators even after a 180 minutes thermal treatment in a nitrogen ambient at a much higher temperature of 800° C.

FIG. 9c also shows that the a spectacular complete elimination of the SiN—H oscillators (centered at 3420 cm$^{-1}$ whose $2^{nd}$ harmonics could cause an optical absorption between 1.445 and 1.479 μm) at the total deposition pressure of 2.60 Torr is also maintained for all PH$_3$ flow rates from 0.00 std liter/min to 0.65 std liter/min. This contrasts with the upper-mentioned results of typical PECVD silica films which require a thermal treatment in a nitrogen ambient at a temperature of 1000° C. in order to achieve similar results. This also contrasts with the upper-mentioned results of PECVD buffer (cladding) deposited at a non-optimized pressure of less than 2.40 Torr by our co-pending U.S. patent application Ser. No. 09/833,711 of FIG. 9b which still incorporate a lot of SiN—H oscillators even after a 180 minutes thermal treatment in a nitrogen ambient at a much higher temperature of 800° C.

FIG. 9c also shows that the complete elimination of the SiO—H oscillators (centered at 3510 cm$^{-1}$ whose $2^{nd}$ harmonics could cause an optical absorption between 1.408 and 1.441 μm) at the total deposition pressure of 2.60 Torr is maintained for all PH$_3$ flow rates from 0.00 std liter/min to 0.65 std liter/min. This contrasts with the upper-mentioned results of typical PECVD silica films which require a thermal treatment in a nitrogen ambient at a temperature of 900° C. in order to achieve similar results. Finally, FIG. 9c also shows that the complete elimination of the HO—H oscillators (centered at 3650 cm$^{-1}$ whose $2^{nd}$ harmonics could cause an optical absorption between 1.333 and 1.408 μm) at the total deposition pressure of 2.60 Torr is maintained for all PH$_3$ flow rates from 0.00 std liter/min to 0.65 std liter/min.

It is clear from the various FTIR spectra that our co-pending U.S. patent application Ser. No. 09/799,491 allows the use of various PH$_3$ flow rates from 0.00 std liter/min to 0.65 std liter/min. to achieve the required 'delta-n' after a 180 minutes thermal treatment in a nitrogen ambient at a reduced temperature of 800° C. while maintaining excellent optical quality.

However, with this 180 minutes thermal treatment in a nitrogen ambient at a reduced temperature of 800° C. are associated some residual stress-induced mechanical problems of deep-etched optical elements (mechanical movement of the side-walls), some residual stress-induced mechanical problems at the buffer/core interface or at the core/cladding interface (micro-structural defects, micro-voiding and separation) and some residual stress-induced optical problems (polarisation dependant power loss).

FIG. 10 shows the stress hysteresis in a nitrogen ambient of buffer (cladding) and core during the heating of the silicon wafer from room temperature to 800° C., during its stabilization for 180 minutes at 800° C. and during its natural cooling from 800° C. to room temperature.

FIG. 10 shows that the mechanical stress of buffer (cladding) is compressive at about −250 MPa prior to the stress hysteresis cycle; is compressive throughout the complete stress hysteresis cycle; decreases almost linearly as the temperature increases linearly; an expected situation since the (almost constant) coefficient of linear expansion of silica-based buffer (cladding) is smaller than the one of the underlying silicon; and shows three plastic deformation regions during the stress hysteresis cycle, namely Region B1, from 450° C. to 575° C., where it decreases much faster than what is expected from a linear decrease associated with its elastic deformation; Region B2, from 575° C. to 650° C., where it is almost constant; and Region B3, during the 180 minutes stabilization at 800° C., where it decreases as the temperature remains unchanged. The mechanical stress of buffer (cladding) is also compressive at about −150 MPa after the stress hysteresis cycle.

In addition FIG. 10 shows that the mechanical stress of core is tensile at about 175 MPa prior to the stress hysteresis cycle; is tensile throughout the complete stress hysteresis cycle; and increases almost linearly as the temperature increases linearly. This is an expected situation since the (almost constant) coefficient of linear expansion of silica-based core is smaller than the one of the underlying silicon.

FIG. 10 also shows two plastic deformation regions during the stress hysteresis cycle, namely Region C1, from 450° C. to 675° C., where the stress reverses its trends and in fact decreases as the temperature is increasing; and Region C2, from 675° C. to 800° C., where it is almost constant. The stress is tensile at about 40 MPa after the stress hysteresis cycle.

FIG. 10 shows that the optical elements of the device are to be prepared from a (compressive stress buffer)/(tensile stress core) combination bi-layer after a thermal treatment for 180 minutes in a nitrogen ambient at a reduced temperature of 800° C. To this particular combination are associated some residual stress-induced mechanical problems of deep-etched optical elements (mechanical movement of side-walls), some residual stress-induced mechanical problems at the buffer/core or core/cladding interfaces (micro-structural defects, micro-voiding and separation) and some residual stress-induced optical problems (polarisation dependant power loss).

Optical elements, such as gratings or waveguides, require deep-etched (compressive stress buffer)/(tensile stress core) with vertical side-walls and with a seamless buffer/core interface.

Figure 11:
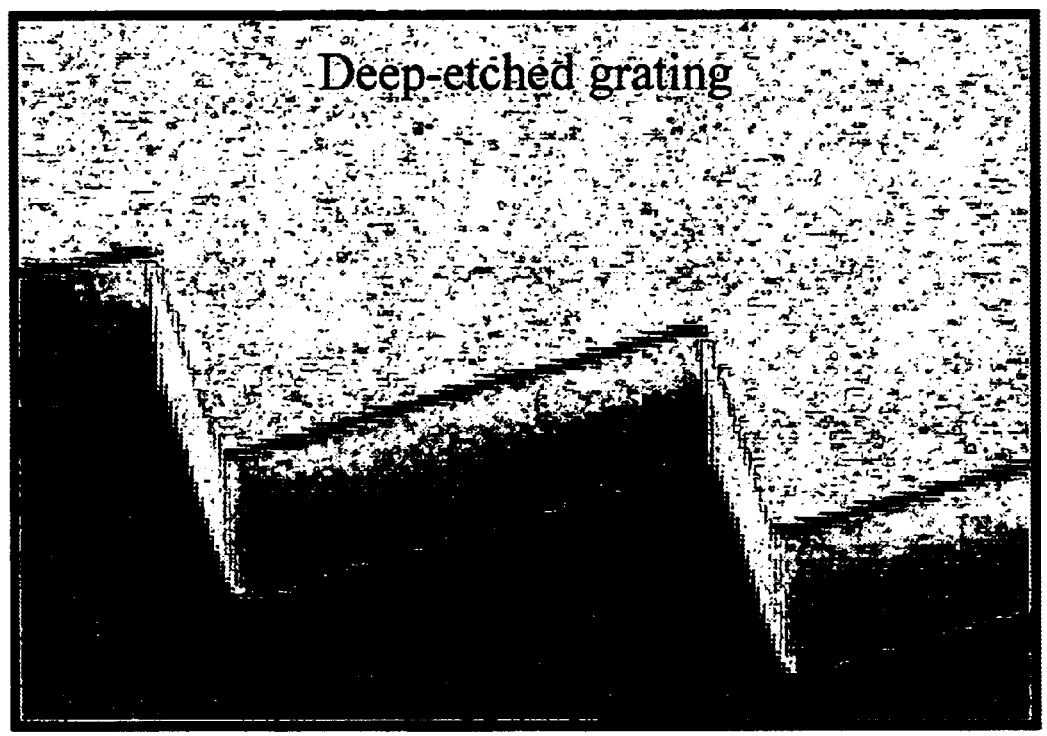
FIG. 11 is SEM pictures of a grating and of a waveguide with quasi-vertical side-walls deep-etched through buffer and core.

FIG. 11 shows SEM pictures of a grating and a waveguide with deep-etched vertical side-walls and with a seamless buffer/core interface deep-etched through buffer and core.

FIG. 12 shows a stress-relief mechanism involving the elastic strain of such a deep-etched (compressive stress buffer)/(tensile stress core) optical element. From this sequence of three graphical representations, it is clear that such a (compressive stress buffer)/(tensile stress core) deep-etched optical element will systematically result in a positively sloped elastic strain of the optical element's side-wall.

This stress-relieve mechanism shows that the lateral strain of the compressive stress buffer forces the deep-etched side-wall of buffer to move outward; and the lateral strain of the tensile stress core forces the deep-etched side-wall of core to move inward.

This combination of strains will systematically result in deep-etched (compressive stress buffer)/(tensile stress core) optical elements with a positive slope side-wall, i.e. a side-wall with an angle smaller than 90°.

To estimate the amplitude of this effect, consider the hypothetical of zero bonding at the buffer/(silicon wafer) interface, of zero bonding at the buffer/core interface, and of zero bonding at the buffer/core interface. The outward elastic strain of the side-wall of the compressive stress buffer, $\epsilon_B$, and the inward elastic strain of the side-wall of the tensile stress core, $\epsilon_C$, would simply be:

$$\epsilon_B = \sigma_B/E_B; \epsilon_C = \sigma_C/E_C$$

where $\sigma_B$ and $E_B$ are respectively the mechanical stress and the modulus of elasticity of buffer and where $\sigma_C$ and $E_C$ are respectively the mechanical stress and the modulus of elasticity of core.

The modulus of elasticity of silica thin films measured by micro-indentation and measured by electrostatic membrane deflection are respectively reported as 70 GPa and 69 GPa in the following two references: Thin Solid Films, Vol. 283, p. 15, (1996); IEEE Transactions on Electron Devices, Vol. ED25, No.10, p.1249, (1978).

To the −150 MPa compressive stress of buffer and 40 MPa tensile stress of core reported in FIG. 10 at room temperature would then be associated a strain of about −0.21% (−0.15 GPa/70GPa) for buffer and of about 0.057% (0.040 GPa/70 GPa) for core. The negative sign indicates that the strain is outward.

This means that the buffer portion of a 5.0 µm wide deep-etched waveguide not bonded to the underlying silicon wafer and not bonded to the core portion of the same deep-etched waveguide would laterally expand by about 0.011 µm (0.21% of 5 µm) and that the buffer portion of a 1150 µm wide deep-etched grating not bonded to the underlying silicon wafer and not bonded to the core portion of the same deep-etched grating would laterally expand by about 2.46 µm (0.21% of 1150 µm). Similarly the core portion of the 5.0 µm wide deep-etched waveguide not bonded to the underlying buffer portion of the same deep-etched waveguide would laterally expand by about 0.0029 µm (0.057% of 5 µm) and that the core portion of a 1150 µm wide deep-etched grating not bonded to the underlying buffer portion of the same deep-etched grating would laterally expand by about 0.66 µm (0.057% of 1150 µm).

In reality, since the buffer is bonded to the underlying silicon wafer and to the upper core at the buffer/core interface, the effect of the outward strain of buffer and of the inward strain of core would be observed as a noticeably different sloped side-wall for a narrow waveguide and for a wide grating.

If we assume a 2.0 µm deep-etched buffer and a 5.0 µm deep-etch core than the single-sided strain of the upper core surface of the 5.0 µm wide deep-etched waveguide and of the 1150 µm wide deep-etched grating could be as high as 0.0070 µm (50% of (0.011+0.0029 µm)) and 1.56 µm (50% of (2.46+0.66 µm)) respectively with respect to the bottom of the resulting 7.0 µm deep-etch optical element. The expected 89.9° (90°-arctan(0.0070 µm/7.0 µm)) side-wall slope of the deep-etched waveguide would not be noticeable on a SEM picture but the expected 77.4° (90°-arctan (1.56 µm/7.0µm)) side-wall slope of the deep-etched grating would certainly be easy to see on a SEM picture.

FIG. 13 shows four SEM pictures. The first two SEM pictures show the relative position between an isolated 5.0 µm wide deep-etched waveguide and its neighboring 1150 µm wide deep-etched grating at two different magnifications. The third SEM picture confirms that side-wall of the 5.0 µm wide deep-etched waveguide facing the neighboring grating has a slope of about 90°. The fourth SEM picture confirms that side-wall of the 1150 µm wide deep-etched grating facing the neighboring deep-etched waveguide has a much smaller slope of about 84°, slightly larger than the expected 77.4° slope. The difference between the measured and expected values will be discussed below.

The mechanical stress of buffer and core must be minimized as to maintain the ideal verticality of the side-wall of the waveguides, of the grating and of the other integrated optical elements of the optical device and allow minimum power loss from undesirable reflection and refraction of the infrared optical beams at the side-wall of these optical elements.

FIG. 14 shows a graphical representation of the variable intensity shear stress building at the (compressive stress buffer)/(tensile stress core) interface and at the (tensile stress core)/(compressive stress clad) interface during the stress hysteresis cycle of FIG. 10 and during the various thermal treatments in a nitrogen ambient.

If the bonding of the buffer/core interface or of the core/cladding interface is strong enough, the exposure of the various optical elements to the various thermal treatments in a nitrogen ambient can result in a modification of the micro-structure near these interfaces.

FIG. 14 also shows some SEM pictures demonstrating the induced modification of the microstructure of core near these buffer/core and core/cladding interfaces.

FIG. 15 shows a graphical representation of the variable intensity shear stress building at the (compressive stress buffer)/(tensile stress core) interface and at the (tensile stress core)/(compressive stress clad) interface during the stress hysteresis cycle of FIG. 10 and during the various thermal treatments in a nitrogen ambient. In this case, the intensity of the shear stress is such that it results in the formation of micro-voids in core and near the interfaces as an interfacial stress relief mechanism. These micro-voids are delineated during wafer preparation for SEM using a very light acid dip etch before loading in the electronic microscope.

If the bonding of the buffer/core interface or of the core/clad interface is strong enough, the exposure of the various optical elements to the various thermal treatments in a nitrogen ambient can result in such a modification of the micro-structure near these interfaces that micro-voids are forming in core and near these interfaces.

FIG. 15 also shows some SEM pictures demonstrating that the induced modification of the microstructure of core near these buffer/core and core/cladding interfaces is cause the formation of micro-voids. It is clear on these SEM pictures that the micro-voids are generated and aligned horizontally in a plane about 0.5 $\mu$m away from the buffer/bore interface. This is not that surprising since the transition from the (compressive stress buffer) to the (tensile stress core) is not absolutely abrupt at the interface and since micro-voids cannot form in a material under compressive stress.

Figure 16:
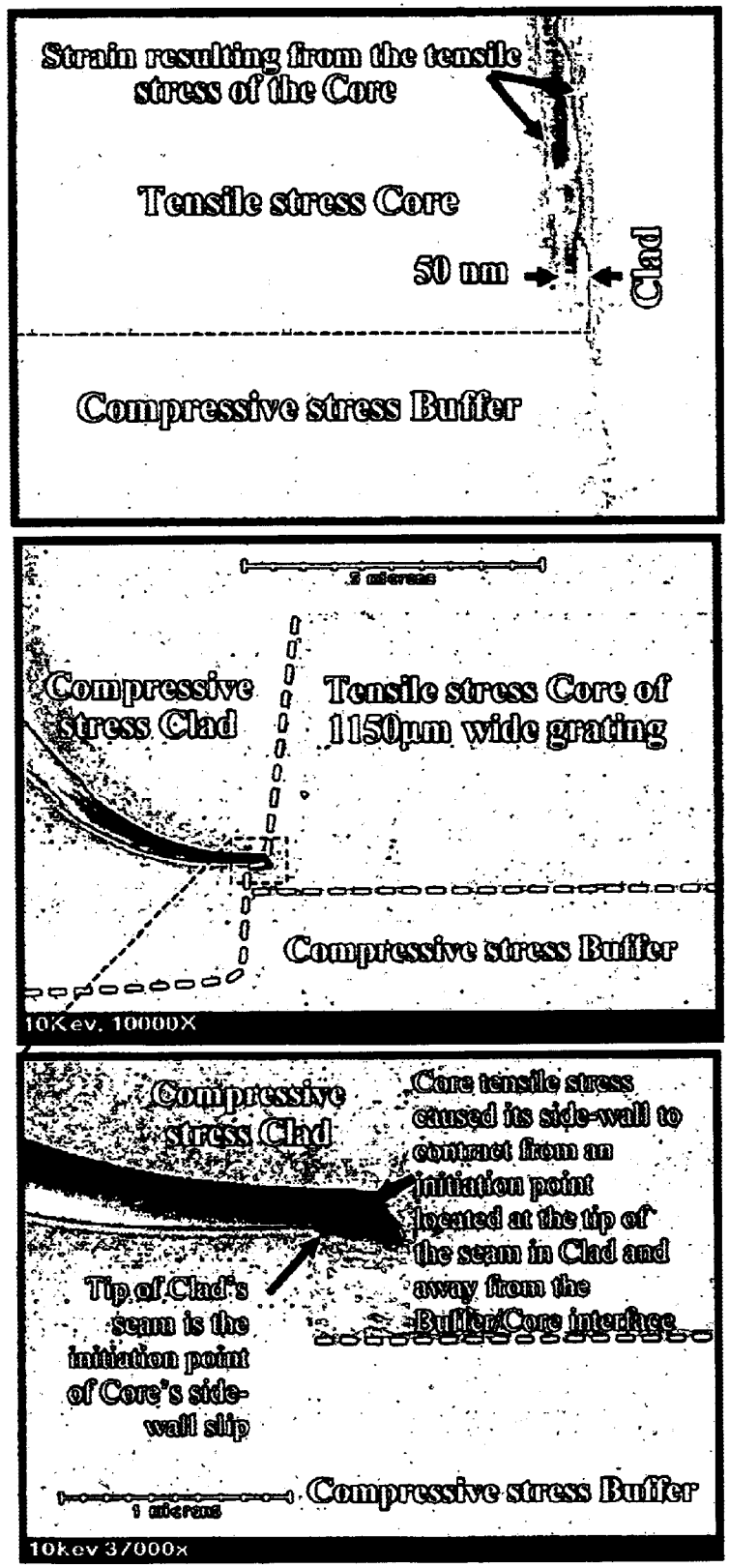
FIG. 16 shows the stress relief contraction of the tensile stress core during SEM preparation.

FIG. 16 shows some SEM pictures which demonstrate the stress relief of the variable intensity shear stress building at the (compressive stress buffer)/(tensile stress core) interface and at the (tensile stress core)/(compressive stress cladding) interface during the stress hysteresis cycle of FIG. 10, during the various thermal treatments in a nitrogen ambient or simply during wafer cleavage for SEM pictures.

In this case, the bonding of the buffer/core interface (or core/cladding interface) is no longer strong enough and the core partially slips on the buffer at the buffer/core interface (or cladding partially delaminate from core at the core/cladding interface).

In one particular case, the interface separation is only observed between core and buffer, indicating that core contraction is the root cause of the delamination.

The second SEM picture of FIG. 16 shows the contraction of the 1150 $\mu$m wide grating. It is clear from this picture that a portion of core has slipped aside over buffer and over a distance of about 0.40 $\mu$m at the periphery of the grating. This is in line with the upper calculated contraction of 0.66 $\mu$m. The slip is again initiated from a point located at the tip of the seam of the cladding and slightly away from the buffer/core interface from which a crack did propagate horizontally in core and about 0.5 $\mu$m away from the buffer/core interface. Since a crack cannot propagate in a material under compressive stress, this crack propagation did require core to be in tensile stress. Since the transition from the compressive stress buffer to the tensile stress core is not absolutely abrupt at the interface, it is normal to see the crack initiation slightly away from the buffer/core interface. The tensile stress-relief mechanism of core has partially releases its energy by propagating a 0.40 $\mu$m long crack in the core and by allowing its side-wall to slip by 0.40 $\mu$m. This lateral of core explains the difference between the observed 84° of FIG. 13 and the expected 77° from the upper calculation of the expected side-wall slope.

FIG. 17 and FIG. 18 are re-plots from J. A. Stratton, 'Electromagnetic Theory', Chapter 9, McGraw-Hill Book Company, New York, 1941.

FIG. 17 and FIG. 18 show the associated optical effect of the incidence angle of infrared light at the air/core interface on the reflection and transmission of infrared optical power (case where the infrared light is incoming respectively from the air side and from the core side of the side-wall of core a waveguide, a grating or of an another optical element). It is clear from FIG. 17 and FIG. 18 that a stress-induced variation of the side-wall slope from 90° to 87°, 84° or to the expected 77° will have a catastrophic effect on the loss of transmitted power of infrared light respectively propagating in Air or in core into the air/core interface of the tip of a waveguide, into the Air/core interface of the grating or into the air/core interface of other optical elements. It is clear from FIG. 17 and FIG. 18 that this stress-induced loss of power will be different for the two propagating modes states of light (i.e. TE and TM) and thus that an undesirable polarization dependent power loss effect (i.e. birefringence effect) is expected.

It will be observed therefore that the mechanical stresses of core, buffer and cladding play a key role in the side-wall slope of deep-etched optical elements. It is also clearly demonstrated that the thermal treatment for 180 minutes in a nitrogen ambient at a reduced temperature of 800° C. is associated with some residual stress-induced mechanical problems of deep-etched optical elements (mechanical movement of side-walls), and some residual stress-induced mechanical problems at the buffer/core or core/cladding interfaces (micro-structural defects, micro-voiding and separation) and some residual stress-induced optical problems (polarisation dependant power loss). An optimisation of the thermal treatments which allows the optical properties to be maintained while modifying the mechanical stress of the core is very important in the manufacture of such integrated optical elements.

EXAMPLE

The technique in accordance with the preferred embodiment of the invention allows the simultaneous optimization of the optical and of the mechanical properties of buffer (cladding) and core in a seven-dimensional space. This consists of a first independent variable, the $SiH_4$ flow, fixed at 0.20 std liter/min; a second independent variable, the $N_2O$ flow, fixed at 6.00 std liter/min; a third independent variable, the $N_2$ flow, fixed at 3.15 std liter/min; a fourth independent variable, the $PH_3$ flow, fixed at 0.50 std liter/min; a fifth independent variable, the total deposition pressure, fixed at 2.60 Torr; and a sixth independent variable, the post-deposition thermal treatment being varied as follows:

- 30 minutes duration thermal treatment in a nitrogen ambient at 600° C.;
- 30 minutes duration thermal treatment in a nitrogen ambient at 700° C.;
- 30 minutes duration thermal treatment in a nitrogen ambient at 750° C.;
- 30 minutes duration thermal treatment in a nitrogen ambient at 800° C.;
- 30 minutes duration thermal treatment in a nitrogen ambient at 850° C.;
- 30 minutes duration thermal treatment in a nitrogen ambient at 900° C.

A seventh dimension is the observed FTIR characteristics of various buffer (cladding) and core silica-based optical elements, as reported in: FIG. 3d, FIG. 4d, FIG. 5d, FIG. 6d, FIG. 7d, FIG. 8d, & FIG. 9d:

FIG. 3d, FIG. 4d, FIG. 5d, FIG. 6d, FIG. 7d, FIG. 8d and FIG. 9d show the FTIR spectra of PECVD silica films deposited using a commercially available PECVD system, the "Concept One" system manufactured by Novellus Systems in California, USA, using the fixed optimum total deposition pressure and the fixed flow rates of silane ($SiH_4$), of nitrous oxide ($N_2O$), of nitrogen ($N_2$), and of phosphine ($PH_3$) as described in our co-pending U.S. patent application Ser. No. 09/799,491. These spectra are obtained after 30 minutes thermal treatments in a nitrogen ambient at various temperatures in a standard diffusion tube. The present invention permits the thermal treatment of the buffer, core and cladding to be optimized so as to minimize mechanical stress induced in the silica-based optical elements without affecting their optical properties.

Figure 3D:
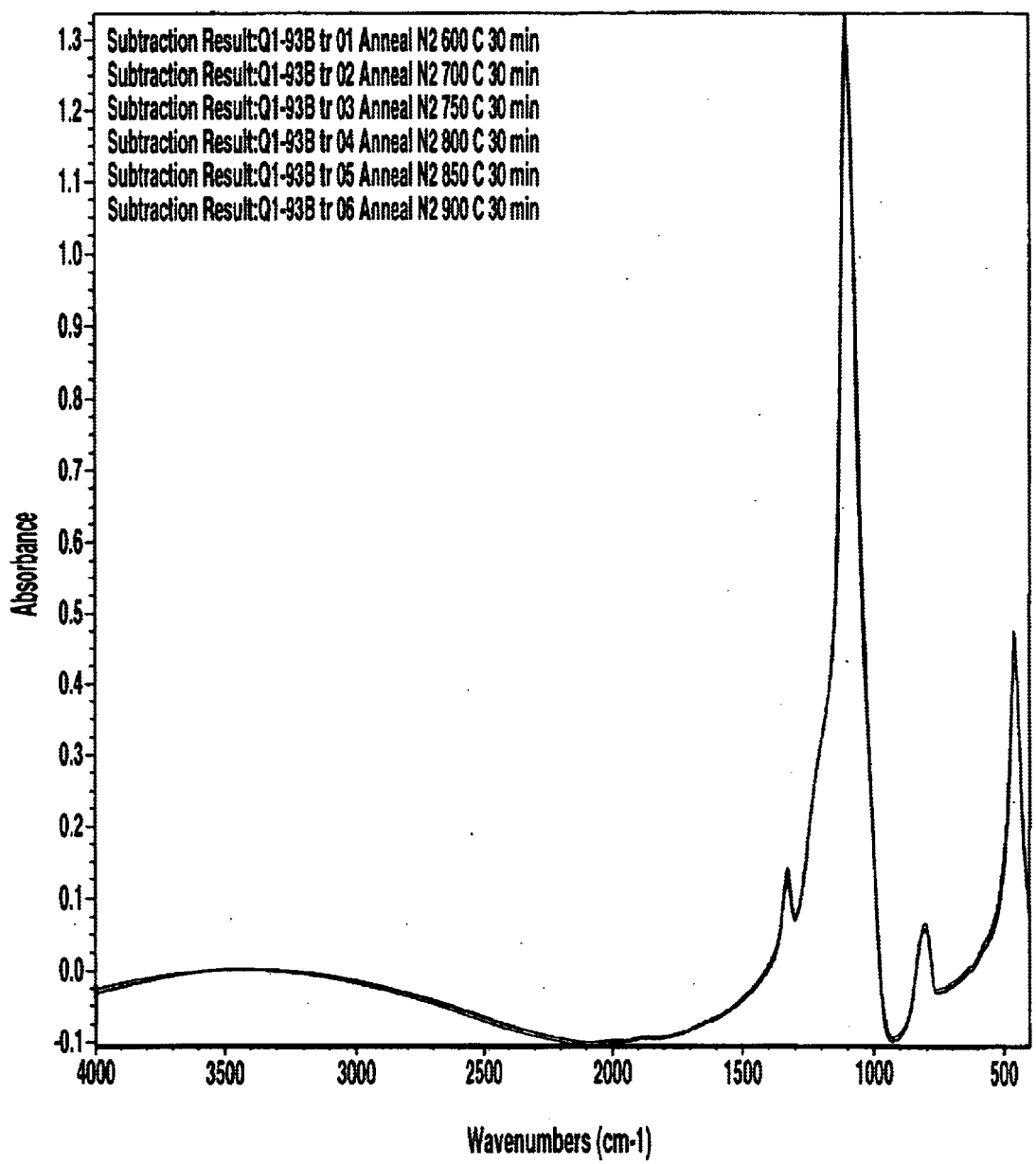
FIG. 3d shows the basic FTIR spectra of various cores obtained with the PECVD deposition technique in accordance with the principles of the invention and after a 30 minutes thermal treatment in a nitrogen ambient at various temperatures.
Figure 4D:
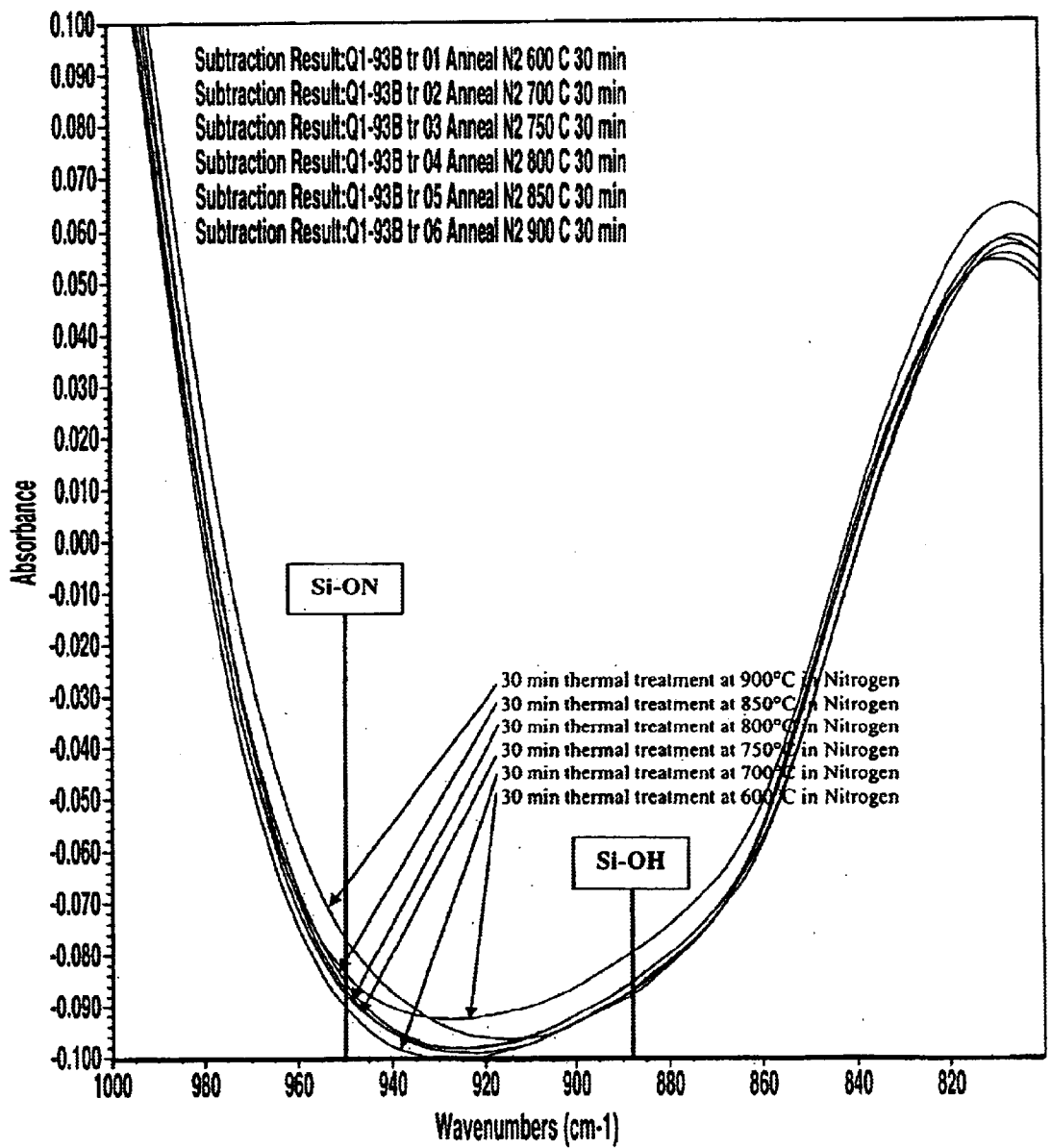
FIG. 4d shows the in-depth FTIR spectra from 810 to 1000 cm$^{-1}$ of various cores obtained with the new PECVD deposition technique after a 30 minutes thermal treatment in a nitrogen ambient at various temperatures.

FIG. 3d shows that the intense and small FWHM Si—O—Si "rocking mode" absorption peak (centred at 460 $cm^{-1}$) and Si—O—Si "in-phase-stretching mode" absorption peak (centred at 1080 $cm^{-1}$) of the fixed deposition pressure of 2.60 Torr of FIG. 3b and of the fixed $PH_3$ flow rate of 0.50 std liter/min of the FIG. 3c is maintained as the temperature of the 30 minutes thermal treatments in a nitrogen ambient is gradually decreased from 900° C. to 600° C. This means that independently of the $SiH_4$ gas flow of the $N_2O$ gas flow of the $N_2$ gas flow and of the $PH_3$ gas flow and as long as the deposition pressure is fixed to 2.60 Torr, the basic FTIR spectra of silica-based optical components are not affected by the temperature variation (between 600° C. and 900° C.) of the 30 minutes thermal treatment in a nitrogen ambient;

FIG. 4d shows that the elimination of the Si—OH oscillators (centered at 885 $cm^{-1}$) of the fixed deposition pressure of 2.60 Torr of FIG. 4b and of the fixed $PH_3$ flow rate of 0.50 std liter/min of the FIG. 4c is maintained. FIG. 4d also shows that the elimination of the Si—ON oscillators (centred at 950 $cm^{-1}$) of the fixed deposition pressure of 2.60 Torr of FIG. 4b and of the fixed $PH_3$ flow rate of 0.50 std liter/min of the FIG. 4c is also maintained. This very spectacular improved elimination of the residual Si—ON oscillators after a 30 minutes thermal treatment of only 600° C. contrasts with the upper-mentioned results of typical PECVD silica films of FIG. 4a which still incorporate a lot of Si—ON oscillators even after a 180 minutes thermal treatment in a nitrogen ambient at a much higher temperature of 1100 ° C. This also contrasts with the upper-mentioned results of PECVD buffer (cladding) deposited at a non-optimized pressure of less than 2.40 Torr by our co-pending U.S. patent application Ser. No. 09/833,711 of FIG. 4b which still incorporate a large number of Si—ON oscillators even after a 180 minutes thermal treatment in a nitrogen ambient at a much higher temperature of 800° C. The optimum separation and deep valley between the Si—O—Si "in-phase-stretching mode" absorption peak (1080 $cm^{-1}$) and the Si—O—Si "bending mode" absorption peak (810 $cm^{-1}$) of the fixed deposition pressure of 2.60 Torr of FIG. 4b and of the fixed $PH_3$ flow rate of 0.50 std liter/min of the FIG. 4c is also maintained. This means that this new technique allows the elimination of the Si—OH oscillators and of the the Si—ON oscillators independently of the thermal treatment of buffer, core and cladding as to allow the thermal treatment optimization of the mechanical properties of the silica-based optical elements without any interaction with the Si—OH oscillators and of the the Si—ON oscillators of these optical elements.

Figure 5D:
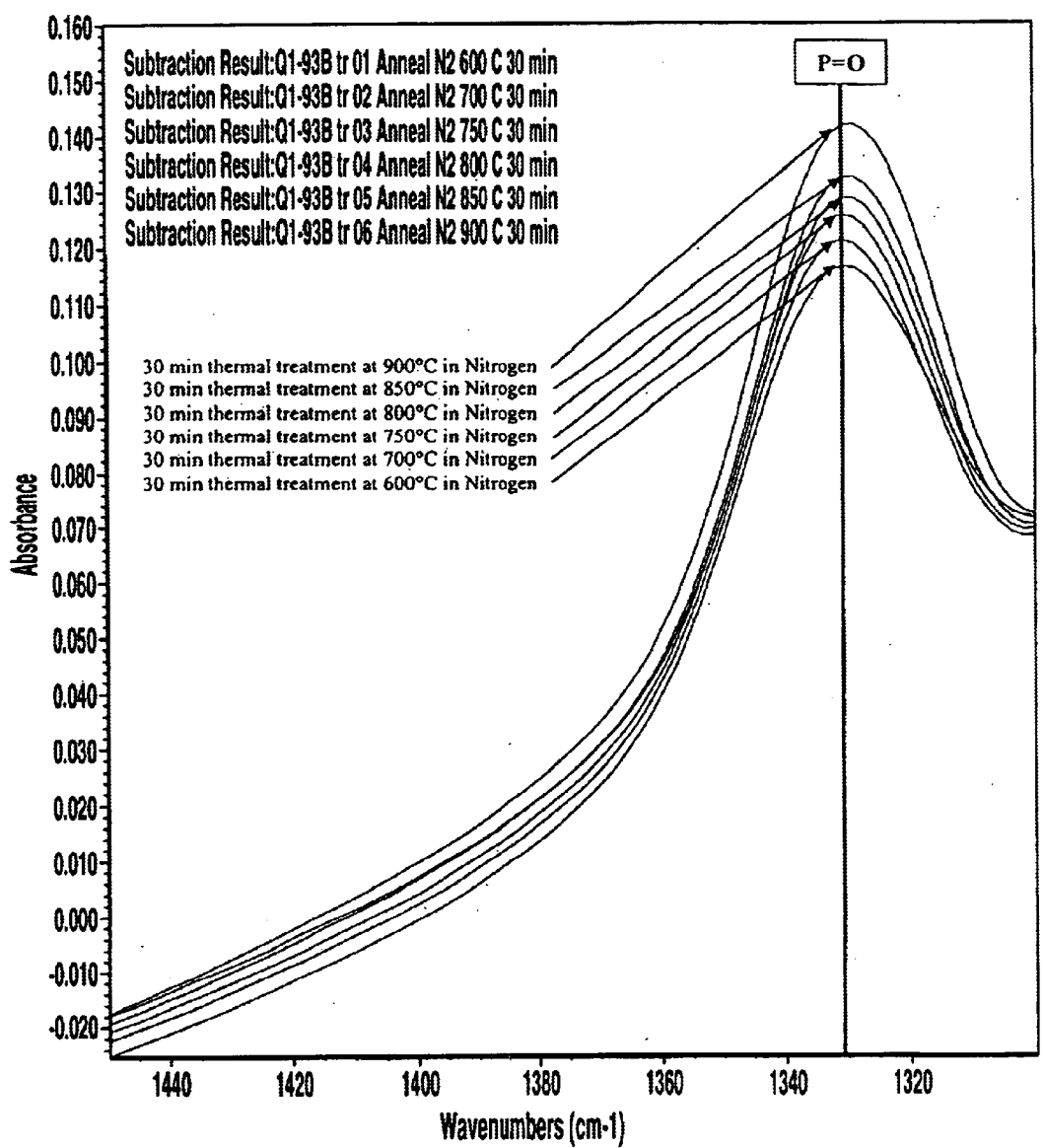
FIG. 5d shows the in-depth FTIR spectra from 1260 to 1500 cm$^{-1}$ of various cores obtained with the new PECVD deposition technique after a 30 minutes thermal treatment in a nitrogen ambient at various temperatures.

FIG. 5d shows the gradual appearance of the P=O oscillators (centered at 1330 $cm^{-1}$ and which does not have a higher harmonics which could cause optical absorption in the 1.30 to 1.55 μm optical bands) as the temperature of the 30 minutes thermal treatment in a nitrogen ambient is increased from 600° C. to 900° C.

Figure 6D:
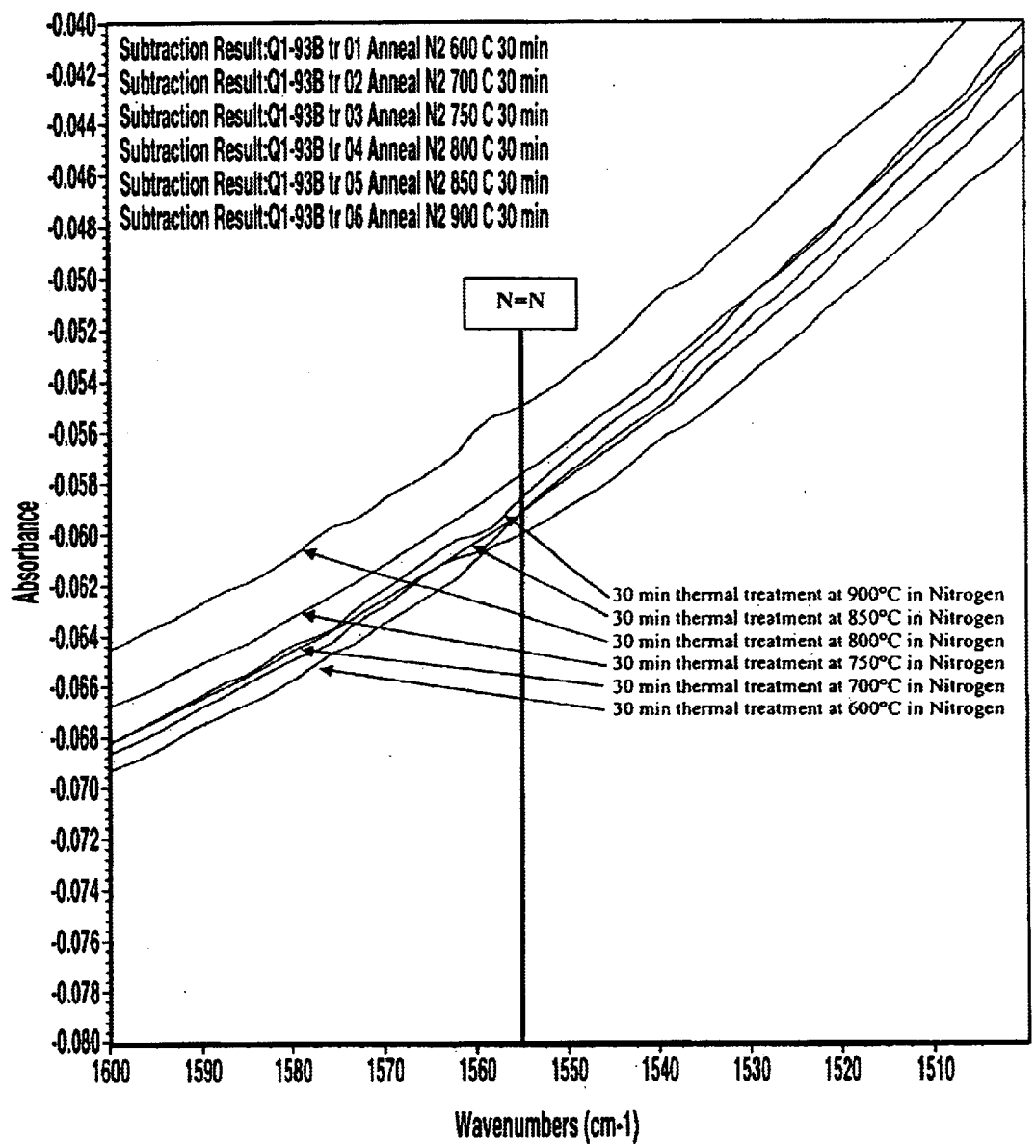
FIG. 6d shows the in-depth FTIR spectra from 1500 to 1600 cm$^{-1}$ of various cores obtained with the new PECVD deposition technique after a 30 minutes thermal treatment in a nitrogen ambient at various temperatures.

FIG. 6d shows that the elimination of the N=N oscillators (centered at 1555 $cm^{-1}$) of the fixed deposition pressure of 2.60 Torr of FIG. 6b and of the fixed $PH_3$ flow rate of 0.50 std liter/min of the FIG. 6c is maintained. This also contrasts with the upper-mentioned results of typical PECVD silica films of FIG. 6a which require a 180 minutes thermal treatment in a nitrogen ambient at a temperature of 1000° C. in order to achieve similar results. This also contrasts with the upper-mentioned results of PECVD buffer (cladding) deposited at a non-optimized pressure of less than 2.40 Torr in our co-pending U.S. patent application Ser. No. 09/833, 711 of FIG. 6b which still incorporate a large number of N=N oscillators even after a 180 minutes thermal treatment in a nitrogen ambient at a much higher temperature of 800° C. This means that this new technique allows the elimination of the N=N oscillators independently of the thermal treatment of buffer, core and cladding as to allow the thermal treatment optimization of the mechanical properties of the silica-based optical elements without any interaction with the N=N oscillators of these optical elements.

Figure 7D:
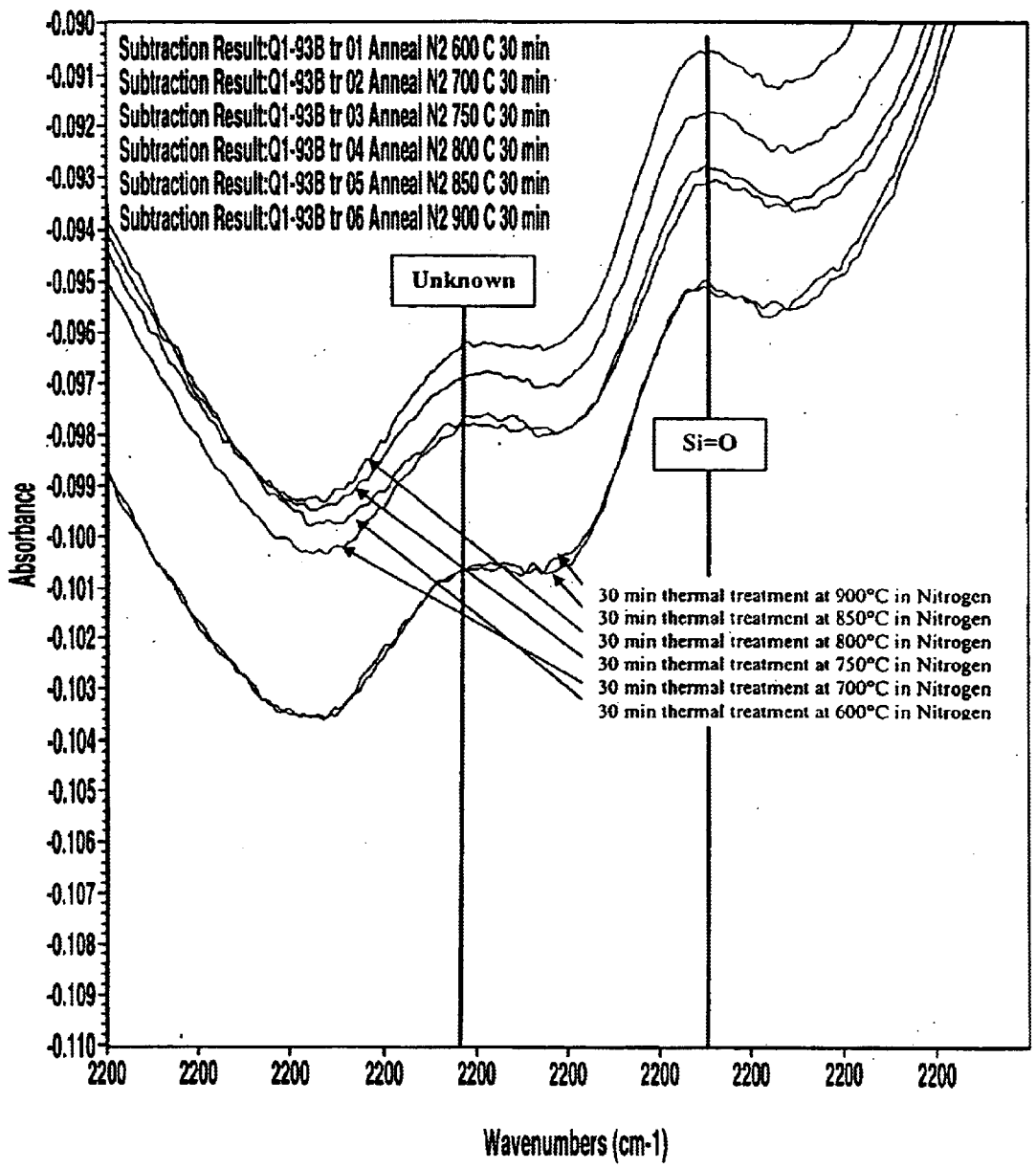
FIG. 7d shows the in-depth FTIR spectra from 1700 to 2200 cm$^{-1}$ of various cores obtained with the new PECVD deposition technique after a 30 minutes thermal treatment in a nitrogen ambient at various temperatures.
Figure 8D:
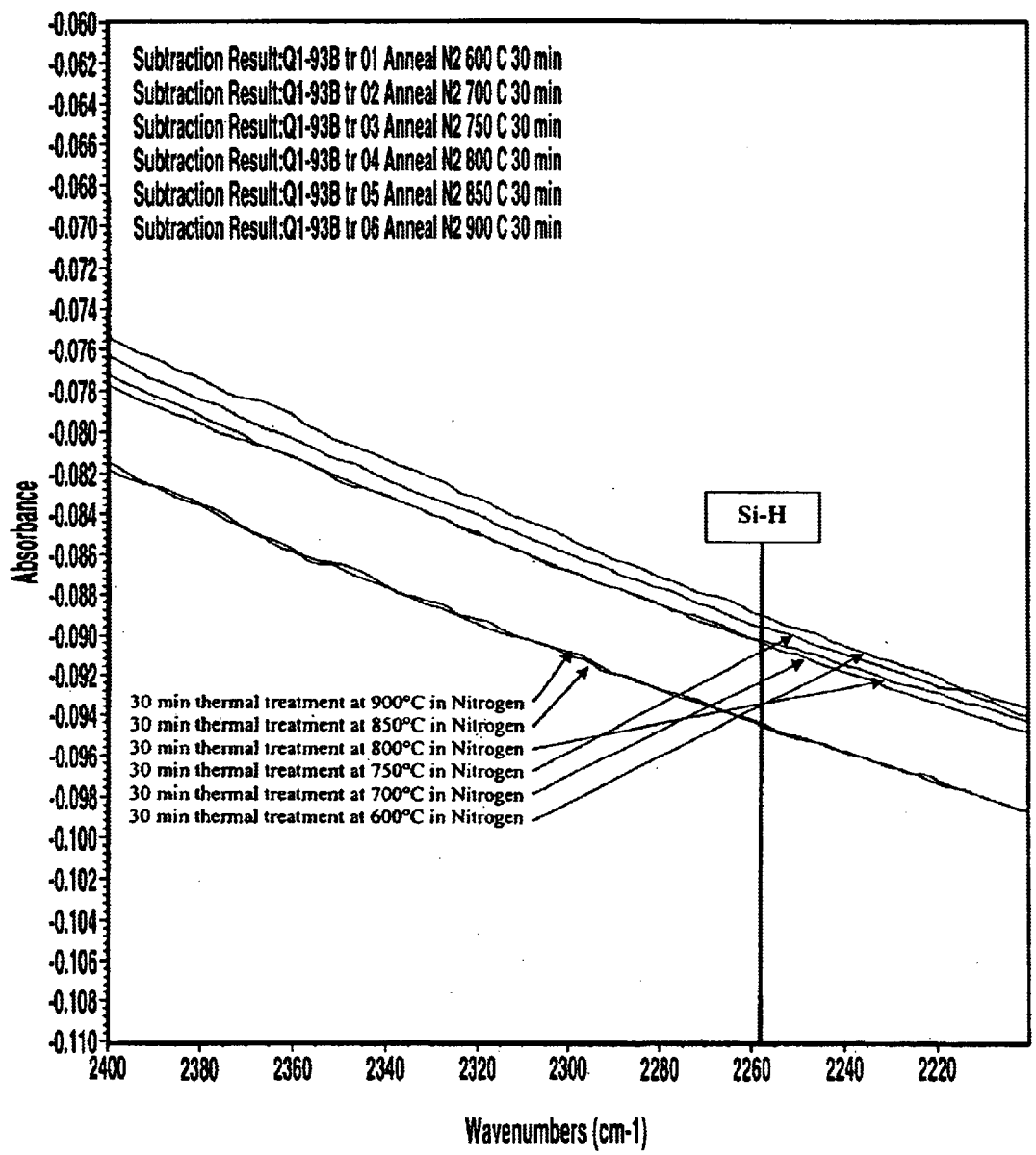
FIG. 8d shows the in-depth FTIR spectra from 2200 to 2400 cm$^{-1}$ of various cores obtained with the new PECVD deposition technique after a 30 minutes thermal treatment in a nitrogen ambient at various temperatures.

FIG. 7d shows that the Si=O oscillators (centered at 1875 $cm^{-1}$) and the unknown oscillator (centered at 2010 $cm^{-1}$) of the fixed deposition pressure of 2.60 Torr of FIG. 7b and of the fixed $PH_3$ flow rate of 0.50 std liter/min of the FIG. 7c are unchanged. These effects are not that important since only the fourth harmonics of the Si=O oscillators could absorb in the 1.30 to 1.55 μm optical bands;

FIG. 8d shows that the elimination of the Si—H oscillators (centered at 2260 $cm^{-1}$ and which third harmonics could cause an optical absorption between 1.443 and 1.508 μm) of the fixed deposition pressure of 2.60 Torr of FIG. 8b and of the fixed $PH_3$ flow rate of 0.50 std liter/min of the FIG. 8c is maintained. This means that this new technique allows the elimination of the Si—H oscillators independently of the thermal treatment of buffer, core and cladding as to allow the thermal treatment optimization of the mechanical properties of the silica-based optical elements without any interaction with the Si—H oscillators of these optical elements.

Figure 9D:
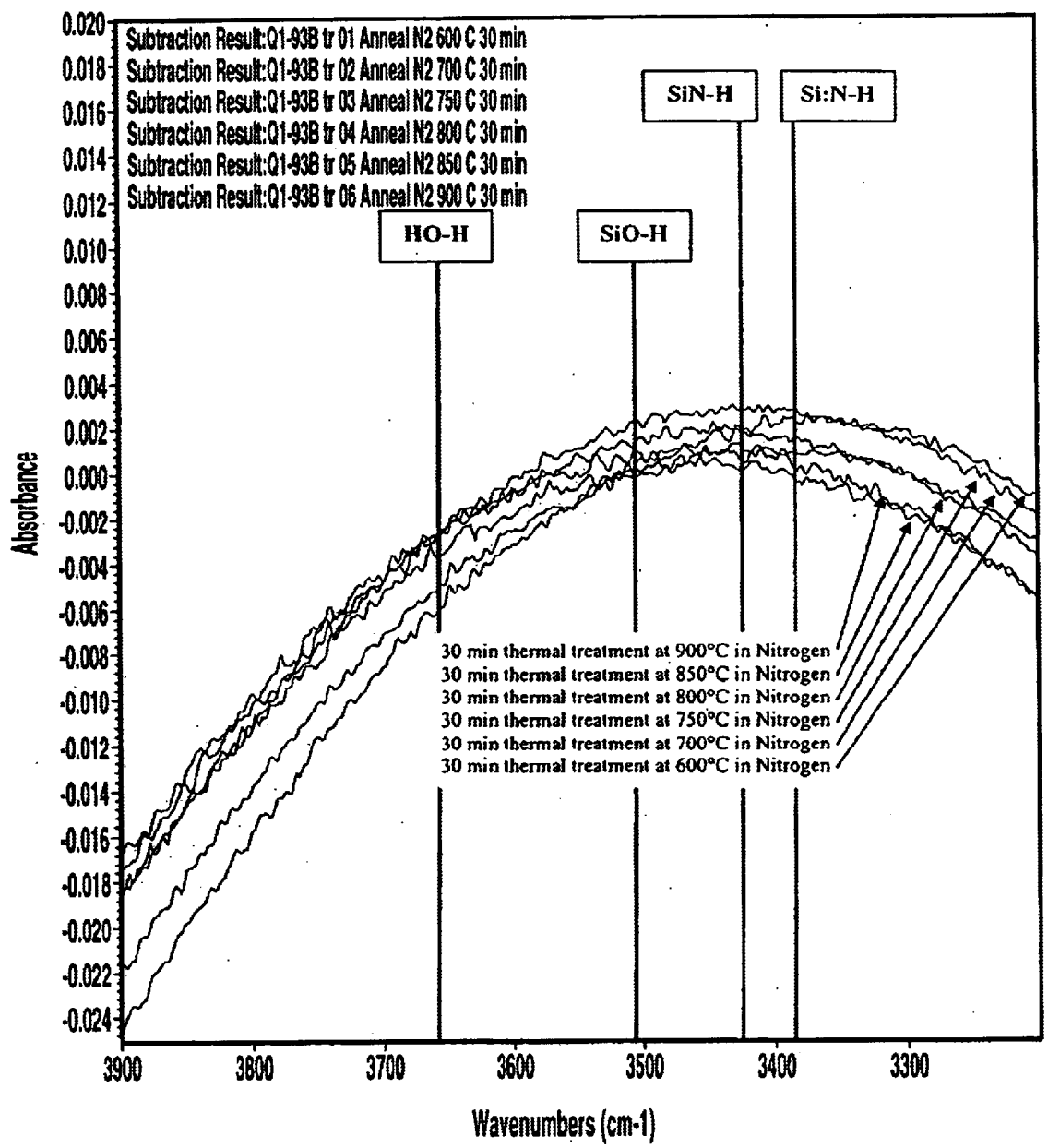
FIG. 9d shows the in-depth FTIR spectra from 3200 to 3900 cm$^{-1}$ of various cores obtained with the new PECVD deposition technique after a 30 minutes thermal treatment in a nitrogen ambient at various temperatures.

FIG. 9d shows that the spectacular complete elimination of the Si:N—H oscillators (centered at 3380 $cm^{-1}$ whose $2^{nd}$ harmonics could cause an optical absorption between 1.445 and 1.515 μm) of the fixed deposition pressure of 2.60 Torr of FIG. 9b and of the fixed $PH_3$ flow rate of 0.50 std liter/min of the FIG. 9c is maintained. This contrasts with the upper-mentioned results of typical PECVD silica films of FIG. 9a which require a 180 minutes thermal treatment in a nitrogen ambient at a temperature of 1100° C. in order to achieve similar results. This also contrasts with the upper-mentioned results of PECVD buffer (cladding) deposited at a non-optimized pressure of less than 2.40 Torr in our co-pending U.S. patent application Ser. No. 09/833,711 of FIG. 9b which still incorporate a lot of Si:N—H oscillators even after a 180 minutes thermal treatment in a nitrogen ambient at a much higher temperature of 800° C. FIG. 9d shows that the a spectacular complete elimination of the SiN—H oscillators (centered at 3420 $cm^{-1}$ whose $2^{nd}$ harmonics could cause an optical absorption between 1.445 and 1.479 μm) of the fixed deposition pressure of 2.60 Torr of FIG. 9b and of the fixed $PH_3$ flow rate of 0.50 std liter/min of the FIG. 9c is also maintained. This contrasts with the upper-mentioned results of typical PECVD silica films of FIG. 9a which require a thermal treatment in a nitrogen ambient at a temperature of 1000° C. in order to achieve similar results. This also contrasts with the upper-mentioned results of PECVD buffer (cladding) deposited at a non-optimized pressure of less than 2.40 Torr in our co-pending U.S. patent application Ser. No. 09/833,711 of FIG. 9b which still incorporate a large number of Si:N—H oscillators even after a 180 minutes thermal treatment in a nitrogen ambient at a much higher temperature of 800° C. FIG. 9d also shows that the complete elimination of the SiO—H oscillators (centered at 3510 cm$^{-1}$ whose $2^{nd}$ harmonics could cause an optical absorption between 1.408 and 1.441 µm) of the fixed deposition pressure of 2.60 Torr of FIG. 9b and of the fixed $PH_3$ flow rate of 0.50 std liter/min of the FIG. 9c is maintained. This contrasts with the upper-mentioned results of typical PECVD silica films which require a thermal treatment in a nitrogen ambient at a temperature of 900° C. in order to achieve similar results. Finally, FIG. 9d also shows that the complete elimination of the HO—H oscillators (centered at 3650 cm$^{-1}$ whose $2^{nd}$ harmonics could cause an optical absorption between 1.333 and 1.408 µm) of the fixed deposition pressure of 2.60 Torr of FIG. 9b and of the fixed $PH_3$ flow rate of 0.50 std liter/min of the FIG. 9c is maintained. This means that this new technique allows the elimination of the Si:N—H oscillators, of the SiN—H oscillators, of the SiO—H oscillators and of the HO—H oscillators independently of the thermal treatment of buffer, core and cladding as to allow the thermal treatment optimization of the mechanical properties of the silica-based optical elements without any interaction with the Si:N—H oscillators, with the SiN—H oscillators, with the SiO—H oscillators or with the HO—H oscillators of these optical elements.

It is clear from these various FTIR spectra that this new technique allows the elimination of the various thermally-induced and stress-related residual mechanical problems by the optimisation of the thermal treatment (i.e. the use of the Regions B1, B2, B3, C1 and C2 of the stress hysteresis of FIG. 10) without affecting the optical absorption properties of optical elements in the 1.55 µm wavelength (and/or 1.30 wavelength) optical region.

It is then clear from these various FTIR spectra, from the stress hysteresis of buffer, core and cladding and from the various presented SEM pictures that this new technique is key to achieving the required 'delta-n' while eliminating the undesirable residual Si:N—H oscillators (observed as a FTIR peak centered at 3380 cm$^{-1}$ whose $2^{nd}$ harmonics could cause an optical absorption between 1.445 and 1.515 µm), SiN—H oscillators (centered at 3420 cm$^{-1}$ whose $2^{nd}$ harmonics could cause an optical absorption between 1.445 and 1.479 µm) and SiO—H oscillators (centered at 3510 cm$^{-1}$ and whose $2^{nd}$ harmonics could cause an optical absorption between 1.408 and 1.441 µm) after an optimised thermal treatment in a nitrogen ambient which can provide improved silica-based optical elements with reduced optical absorption in the 1.55 µm wavelength (and/or 1.30 wavelength) optical region without the residual stress-induced mechanical problems of deep-etched optical elements (mechanical movement of side-walls), without the residual stress-induced mechanical problems at the buffer/core or core/cladding interfaces (micro-structural defects, micro-voiding and separation) and without the residual stress-induced optical problems (polarisation dependant power loss).

It will be apparent to one skilled in the art that many variations of the invention are possible. The PECVD silica films could be deposited at a temperature different than 400° C. It could be deposited at any temperature between 100 and 650° C.

The PECVD equipment could be different than the Novellus Concept One. The requirement is to provide independent control of the four basic control parameters: $SiH_4$ gas flow rate, $N_2O$ gas flow rate, $N_2$ gas flow rate and total deposition pressure.

The buffer (cladding) local optimum ($SiH_4$ gas flow of 0.20 std liter/min, $N_2O$ gas flow of 6.00 std liter/min, $N_2$ gas flow of 3.15 std liter/min and a total deposition pressure of 2.60 Torr) is this four-independent-variables space could have a different set of coordinates ($SiH_4$, $N_2O$, $N_2$, deposition pressure) using the same Novellus Concept One equipment.

The buffer (cladding) local optimum could have a different set of coordinates ($SiH_4$, $N_2O$, $N_2$, deposition pressure) in another PECVD equipment.

The core local optimum ($SiH_4$ gas flow of 0.20 std liter/min, $N_2O$ gas flow of 6.00 std liter/min, $N_2$ gas flow of 3.15 std liter/min, $PH_3$ gas flow of 0.57 std liter/min, and a total deposition pressure of 2.60 Torr) is this five-independent-variables space could have a different set of coordinates ($SiH_4$, $N_2O$, $N_2$, $PH_3$, deposition pressure) using the same Novellus Concept One equipment.

The core local optimum could have a different set of coordinates ($SiH_4$, $N_2O$, $N_2$, $PH_3$, deposition pressure) in another PECVD equipment. The 'delta-n' could be different than 0.015 and range between 0.005 and 0.020.

The $SiH_4$ silicon raw material gas could be replaced by an alternate silicon containing gas, such as: silicon tetrachloride, $SiCl_4$, silicon tetra-fluoride, $SiF_4$, disilane, $Si_2H_6$, dichloro-silane, $SiH_2Cl_2$, chloro-fluoro-silane $SiCl_2F_2$, difluoro-silane, $SiH_2F_2$ or any other silicon containing gases involving the use of hydrogen, H, chlorine, Cl, fluorine, F, bromine, Br, and iodine, I.

The $N_2O$ oxidation gas could be replaced by an alternate oxygen containing gas, such as: oxygen, $O_2$, nitric oxide, $NO_2$, water, $H_2O$, hydrogen peroxide, $H_2O_2$, carbon monoxide, CO or carbon dioxide, $CO_2$.

The $N_2$ carrier gas could be replaced by an alternate carrier gas, such as: helium, He, neon, Ne, argon, Ar or krypton, Kr.

The $PH_3$ doping gas could be replaced by an alternate gas, such as: diborane, $B_2H_6$, Arsine ($AsH_3$), Titanium hydride, $TiH_4$ or germane, $GeH_4$, Silicon Tetrafluoride, $SiF_4$ of carbon tetrafluoride, $CF_4$.

The high temperature thermal treatment in nitrogen can be performed at a temperature different than 800° C. The preferred range is from 400 to 1200° C.

The high temperature thermal treatment can be performed in a different ambient than nitrogen. Other ambient gases or mixtures of gases may include oxygen, $O_2$, hydrogen, $H_2$, water vapour, $H_2O$, argon, Ar, fluorine, $F_2$, carbon tetrafluoride, $CF_4$, nitrogen trifluoride, $NF_3$, hydrogen peroxide, $H_2O_2$.

The optical region of interest is not limited to the 1.30 to 1.55 µm optical region since the higher oscillation harmonics of the eliminated oscillators have other optical benefits at longer or shorter wavelengths. The wavelengths of the first, second, third and fourth harmonics of these oscillators are to be covered by this patent.

The invention has application in may devices other than Mux or Dmux devices. The following is a list of suitable devices, which is not intended to be exhaustive: Add-After-Drop Filters (AADF) devices; Arrayed Wave Guide (AWG) and Arrayed Wave Guide Grating (AWGG) devices; thermal Arrayed Wave Guide (AAWGG) devices; Charged Coupled Devices (CCD) devices; Distributed Feedback Laser Diode (DFB-LD) devices; Erbium Doped Fiber Amplifier (EDFA) devices; Fiber-To-The-Home (FTTH) application devices; Four Wave Mixing (FWM) devices; Fresnel Mirror (FM) devices; Laser Diode (LD) devices; Light Emitting Diodes (LED) devices; Mach-Zenhder (MZ), Mach-Zenhder Interferometer (MZI), Mach-Zenhder Interferometer Multiplexer (MZIM) devices; Micro-Opto-Electro-Mechanical Systems (MOEMS) devices; Monitor Photo Diode (MPD) devices;

Multi-Wavelength Optical Sources (MWOS) devices; Optical Add/Drop Multiplexers (OADM) devices; Optical Amplifier (AF) devices; Optical Cross-Connect (OCC, OXC) devices; Optical Cross Point (OCP) devices; Optical Filter (OF) devices; Optical Interferometer (OI) devices; Optical Network Unit (ONU) devices; Optical Saw Wave (OSW) devices; Optical Splitter (OS) devices; Optical Switch (OSW) and Optical Switch Module (OSM) devices; Photonic ATM (PATM) switching devices; Planar Lightwave Circuits (PLC) devices; Positive Emitter Coupled Logic (PECL) devices; Quarter Wave (QW) devices; Receiver Photo Diode (RPD) devices; Semiconductor Optical Amplifier (SOA) devices; Spot-Size converter integrated Laser Diode (SS-LD) devices; Sub-Carrier Multiplexing Optical Network Unit (SCM-ONU) devices; Temperature Insensitive Arrayed Wave Guide (TI-AWG) devices; Thermo-Optic (TO) devices and Thermo-Optic Switch (TOS) devices; Time Compression Multiplexing—Time Division Multiple Access (TCM-TDMA) devices; Time Division Multiplexing (TDM) devices; Tunable Receiver (TR) devices; Uniform-Loss Cyclic-Frequency Arrayed Wave Guide (ULCF-AWG) devices; Vertical Cavity Surface Emitting Laser (VCSEL) devices; Wavelength Dispersive Multiplexing (WDM), Wavelength Dispersive Multiplexing Transceivers (WDMT) devices; Micro-Electro-Mechanical Systems (MEMS) device: Information Technologies MEMS devices; Medical/Biochemical MEMS devices: Biochip devices; Lab-On-A-Chip (LOAC) devices; Micro-Total Analysis System ($\mu$-TAS) devices; Automotive MEMS devices; Industrial/Automation MEMS devices; Environmental Monitoring MEMS devices; Telecommunications MEMS devices.

Although the invention has been described and illustrated in detail, it is clearly understood that the same is by way of illustration and example and is not to be taken by way of limitation, the spirit and scope of the invention being limited only by the terms of the appended claims.

We claim:

1. A method of depositing an optical quality silica film by PECVD (Plasma Enhanced Chemical Vapor Deposition), comprising the steps of:
    a) independently setting a fixed flow rate for a silicon-containing raw material gas at a first value;
    b) independently setting a fixed flow rate for an oxidation gas at a second value;
    c) independently setting a fixed flow rate for a carrier gas at third value;
    d) independently setting a fixed flow rate for a dopant gas at a fourth value;
    e) independently setting a predetermined total deposition pressure at a fifth value;
    f) said first, second, third, fourth, and fifth values being selected by observing FTIR spectra of films deposited under different conditions and selecting values that result in minimal absorption peaks for oscillators in the deposited films;
    f) depositing a silica film using said selected values; and
    e) performing a post deposition heat treatment on said silica film at a temperature selected to minimize the mechanical stress induced in said film by said heat treatment.

2. A method as claimed in claim 1, wherein the post deposition heat treatment temperature lies in the range 600 to 900° C.

3. A method as claimed in claim 2, wherein the deposition is carried out at a temperature in the range 100 to 650° C.

4. A method as claimed in claim 3, wherein the deposition is carried out at a temperature of about 400° C.

5. A method as claimed in claim 2, wherein said post deposition heat treatment is performed for about 30 minutes.

6. A method as claimed in claim 1, wherein the raw material gas is selected from the group consisting: silane, $SiH_4$; silicon tetra-chloride, $SiCl_4$; silicon tetra-fluoride, $SiF_4$; disilane, $Si_2H_6$; dichloro-silane, $SiH_2Cl_2$; chloro-fluoro-silane $SiCl_2F_2$; difluoro-silane, $SiH_2F_2$; and any other silicon containing gas containing hydrogen, H, chlorine, Cl, fluorine, F, bromine, Br, or iodine, I.

7. A method as claimed in claim 6, wherein the oxidation gas is selected from the group consisting of: nitrous oxide, $N_2O$; $O_2$; nitric oxide, $NO_2$; water, $H_2O$; hydrogen peroxide, $H_2O_2$; carbon monoxide, CO; and carbon dioxide, $CO_2$.

8. A method as claimed in claim 7, wherein the carrier gas is selected from the group consisting of nitrogen, $N_2$; helium, He; neon, Ne; argon, Ar, and krypton Kr.

9. A method as claimed in claim 1, wherein the dopant gas is selected from the group consisting of phosphene, $PH_3$; diborane, $B_2H_6$; Arsine ($AsH_3$); Titanium hydride, $TiH_4$; germane, $GeH_4$; Silicon Tetrafluoride, $SiF_4$; and carbon tetrafluoride, $CF_4$.

10. A method as claimed in claim 1, wherein the raw material gas is $SiH_4$, the oxidation gas is $N_2O$, the carrier gas is $N_2$, and the dopant gas is $PH_3$.

11. A method as claimed in claim 10, wherein the $SiH_4$ gas flow is set at about 0.2 std liters/min., the $N_2O$ gas flow is set at about 6.00 std liters/min., the N2 flow is set at about 3.15 liters/min., and the $PH_3$ is set at about 0.50 std liters/min.

12. A method as claimed in claim 10, wherein the total deposition pressure is at least about 2.6 Torr.

13. A method as claimed in claim 1, wherein said post deposition heat treatment is performed under conditions that make use of regions of plastic deformation in the mechanical stress hysteresis curve of the silica film to minimize stress induced by said post deposition heat treatment.

14. A method as claimed in claim 1, wherein the total deposition pressure is at least about 2.6 Torr.

15. A method of depositing an optical quality silica film by PECVD, comprising the steps of:
    a) setting a flow rate for $SiH_4$ at about 0.2 std liters/min.;
    b) setting a flow rate for $N_2O$ at about 6.00 std liters/min.;
    c) setting a flow rate for $N_2$ gas at about 3.15 std liter/min;
    d) setting a flow rate for $PH_3$ at about 0.5 std liter/min;
    e) setting the total deposition pressure at about 2.6 Torr;
    f) depositing a silica film by PECVD under these conditions; and
    g) performing a post deposition heat treatment of the deposited film in a nitrogen ambient at a temperature between 600° and 900° C. for about 30 minutes.

16. A method as claimed in claim 15, wherein the observed FTIR characteristics of the deposited film are monitored to determine the optimum post deposition heat treatment temperature.

17. A method as claimed in claim 15, wherein said silica film forms a buffer, core or cladding of an optical component.

18. A method as claimed in claim 17, wherein said optical component is a multiplexer or demultiplexer.

19. A method as claimed in claim 15, wherein the temperature of said post deposition heat treatment is selected to minimize mechanical stress in said silica film.

20. A method as claimed in claim 19, wherein said temperature is selected so as to make use of regions of plastic deformation on the mechanical stress hysteresis curve for said silica film.

* * * * *